US008709898B2

(12) United States Patent
Fukuda et al.

(10) Patent No.: US 8,709,898 B2
(45) Date of Patent: Apr. 29, 2014

(54) FABRICATION METHOD OF SEMICONDUCTOR DEVICE AND FABRICATION METHOD OF DYNAMIC THRESHOLD TRANSISTOR

(75) Inventors: Masahiro Fukuda, Yokohama (JP); Eiji Yoshida, Kawasaki (JP); Yosuke Shimamune, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 33 days.

(21) Appl. No.: 13/552,274

(22) Filed: Jul. 18, 2012

(65) Prior Publication Data

US 2013/0210207 A1 Aug. 15, 2013

Related U.S. Application Data

(63) Continuation of application No. PCT/JP2009/070132, filed on Nov. 30, 2009.

(51) Int. Cl.
| | |
|---|---|
| *H01L 21/762* | (2006.01) |
| *H01L 21/8238* | (2006.01) |
| *H01L 27/12* | (2006.01) |
| *H01L 29/06* | (2006.01) |
| *H01L 29/78* | (2006.01) |

(52) U.S. Cl.
USPC ........... 438/285; 438/222; 438/296; 438/424; 438/700; 438/705; 257/506

(58) Field of Classification Search
CPC ............ H01L 29/66477; H01L 29/665; H01L 29/66636; H01L 29/1054; H01L 29/7848; H01L 29/266621; H01L 21/76232; H01L 21/823814
USPC .................... 438/282, 285, 296; 257/E21.431
See application file for complete search history.

(56) References Cited

U.S. PATENT DOCUMENTS

| 7,247,896 B2 | 7/2007 | Oh et al. | |
|---|---|---|---|
| 7,410,859 B1 * | 8/2008 | Peidous et al. ................ | 438/231 |

(Continued)

FOREIGN PATENT DOCUMENTS

| JP | 54-040084 A | 3/1979 |
|---|---|---|
| JP | 58-093343 A | 6/1983 |

(Continued)

OTHER PUBLICATIONS

Kyoung, H. Y. et al, "A Partially Insulated Field-Effect Transistor (PiFET) as a Candidate for Scaled Transistors", IEEE Electron Device Letters, vol. 25, No. 6, Jun. 2004, pp. 387-389.

(Continued)

*Primary Examiner* — Olik Chaudhuri
*Assistant Examiner* — Christine Enad
(74) *Attorney, Agent, or Firm* — Westerman, Hattori, Daniels & Adrian, LLP

(57) ABSTRACT

A method includes: etching a silicon substrate except for a silicon substrate portion on which a channel region is to be formed to form first and second trenches respectively at a first side and a second side of the silicon substrate portion; filling the first and second trenches by epitaxially growing a semiconductor layer having etching selectivity against silicon and further a silicon layer; removing the semiconductor layer selectivity by a selective etching process to form voids underneath the silicon layer respectively at the first side and the second side of the substrate portion; burying the voids at least partially with a buried insulation film; forming a gate insulation film and a gate electrode on the silicon substrate portion; and forming a source region in the silicon layer at the first side of the silicon substrate portion and a drain region at the second side of the silicon substrate portion.

9 Claims, 75 Drawing Sheets

(56) References Cited

U.S. PATENT DOCUMENTS

| | | |
|---|---|---|
| 7,666,721 B2 | 2/2010 | Dyer et al. |
| 2004/0212024 A1 | 10/2004 | Oh et al. |
| 2005/0133789 A1 | 6/2005 | Oh et al. |
| 2007/0013005 A1 | 1/2007 | Hara |
| 2007/0018236 A1 | 1/2007 | Tsuchiaki |
| 2007/0048907 A1 | 3/2007 | Lee et al. |
| 2007/0072380 A1* | 3/2007 | Wirbeleit et al. .......... 438/303 |
| 2008/0128746 A1* | 6/2008 | Wang ............................ 257/190 |
| 2009/0011570 A1* | 1/2009 | Mizushima et al. .......... 438/429 |
| 2009/0166761 A1 | 7/2009 | Curatola et al. |
| 2012/0256264 A1* | 10/2012 | Haneda et al. ................ 257/368 |

FOREIGN PATENT DOCUMENTS

| | | |
|---|---|---|
| JP | 02-205339 A | 8/1990 |
| JP | 11-008379 A | 1/1999 |
| JP | 2000-294781 A | 10/2000 |
| JP | 2004-327961 A | 11/2004 |
| JP | 2005-183987 A | 7/2005 |
| JP | 2006-093268 A | 4/2006 |
| JP | 2007-027199 A | 2/2007 |
| JP | 2007-027232 A | 2/2007 |
| JP | 2007-059910 A | 3/2007 |
| JP | 2007-251163 A | 9/2007 |
| JP | 2008-112900 A | 5/2008 |
| JP | 2009-519599 A | 5/2009 |

OTHER PUBLICATIONS

Fujitsuka, N. et al, "A new processing techinique to prevent stiction using silicon selective etching for SOI-MEMS", Sensors and Actuators A 97-98 (2002), pp. 716-719, Toyota Central R&D Labs., Inc., Nagakute, Aichi, Japan.

International Search Report for PCT/JP2009/070132, mailing date of Feb. 2, 2010.

\* cited by examiner

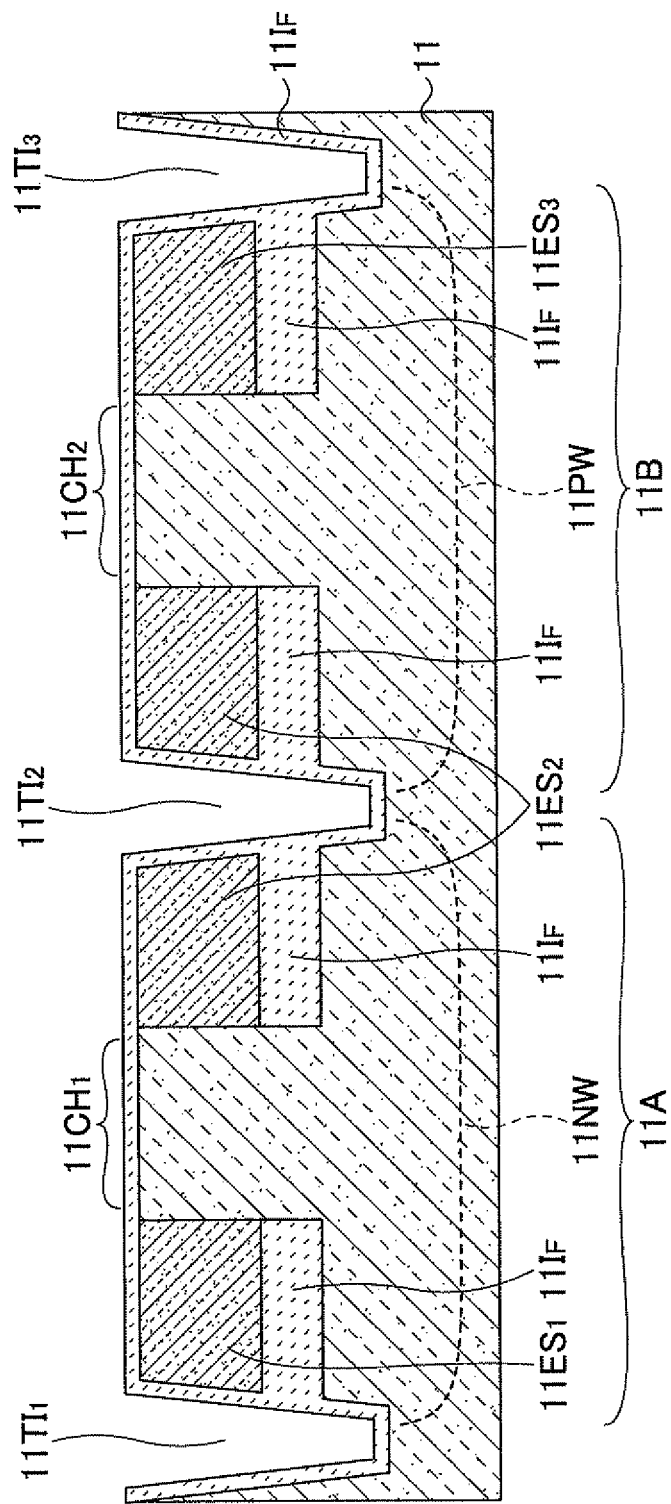

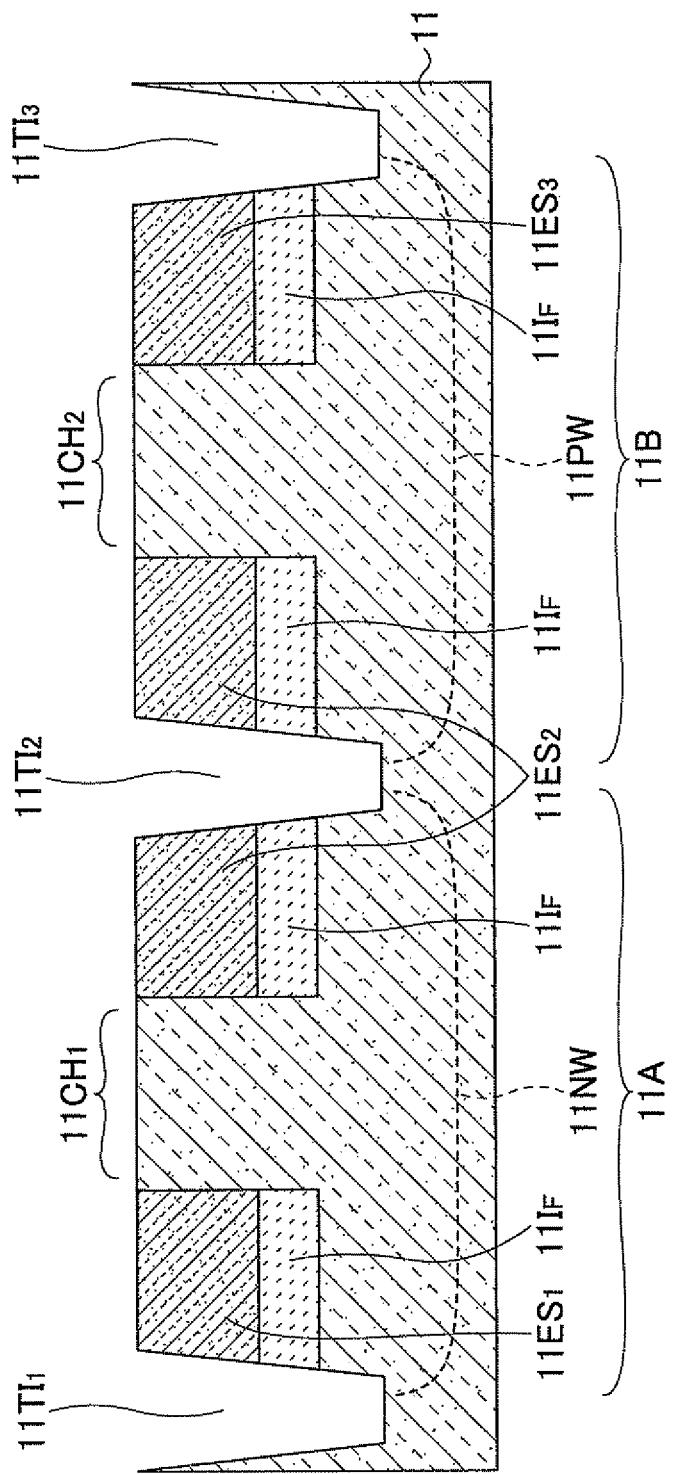

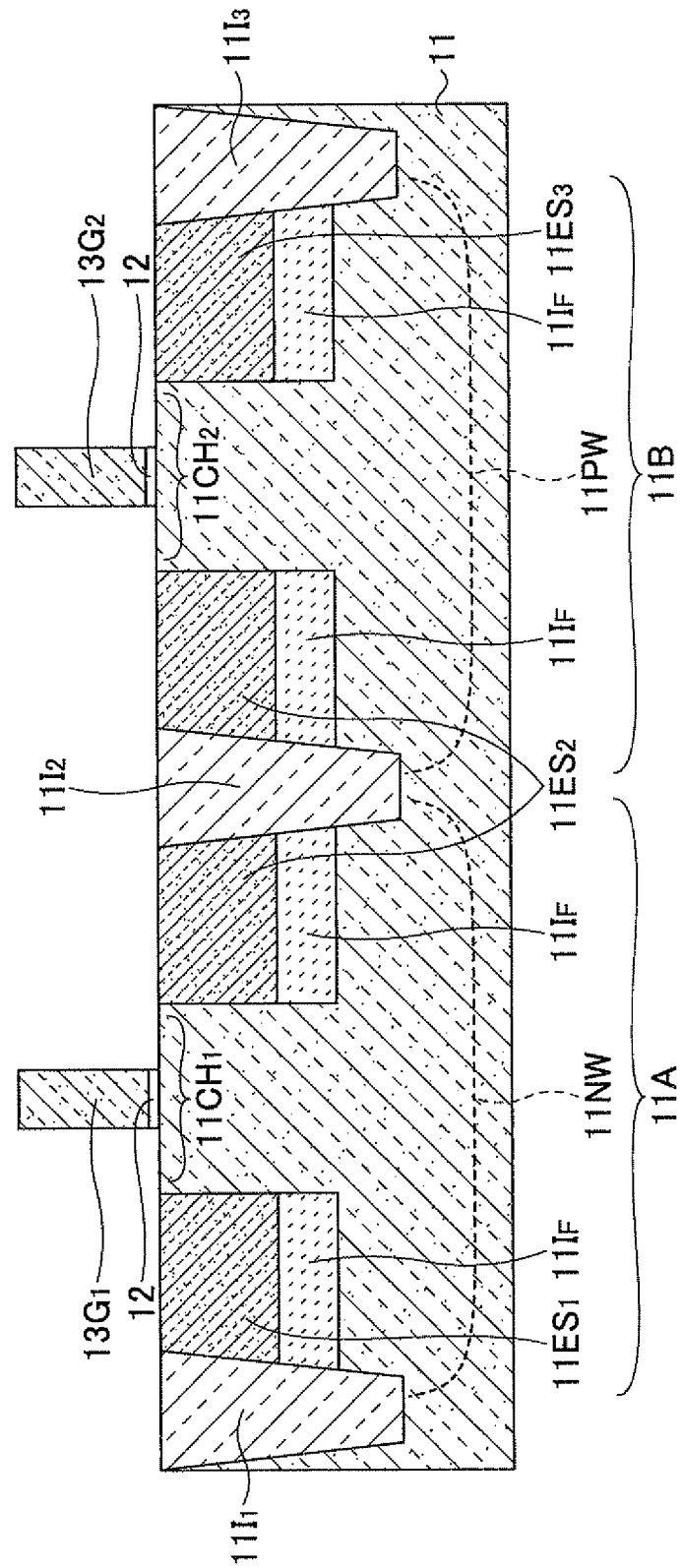

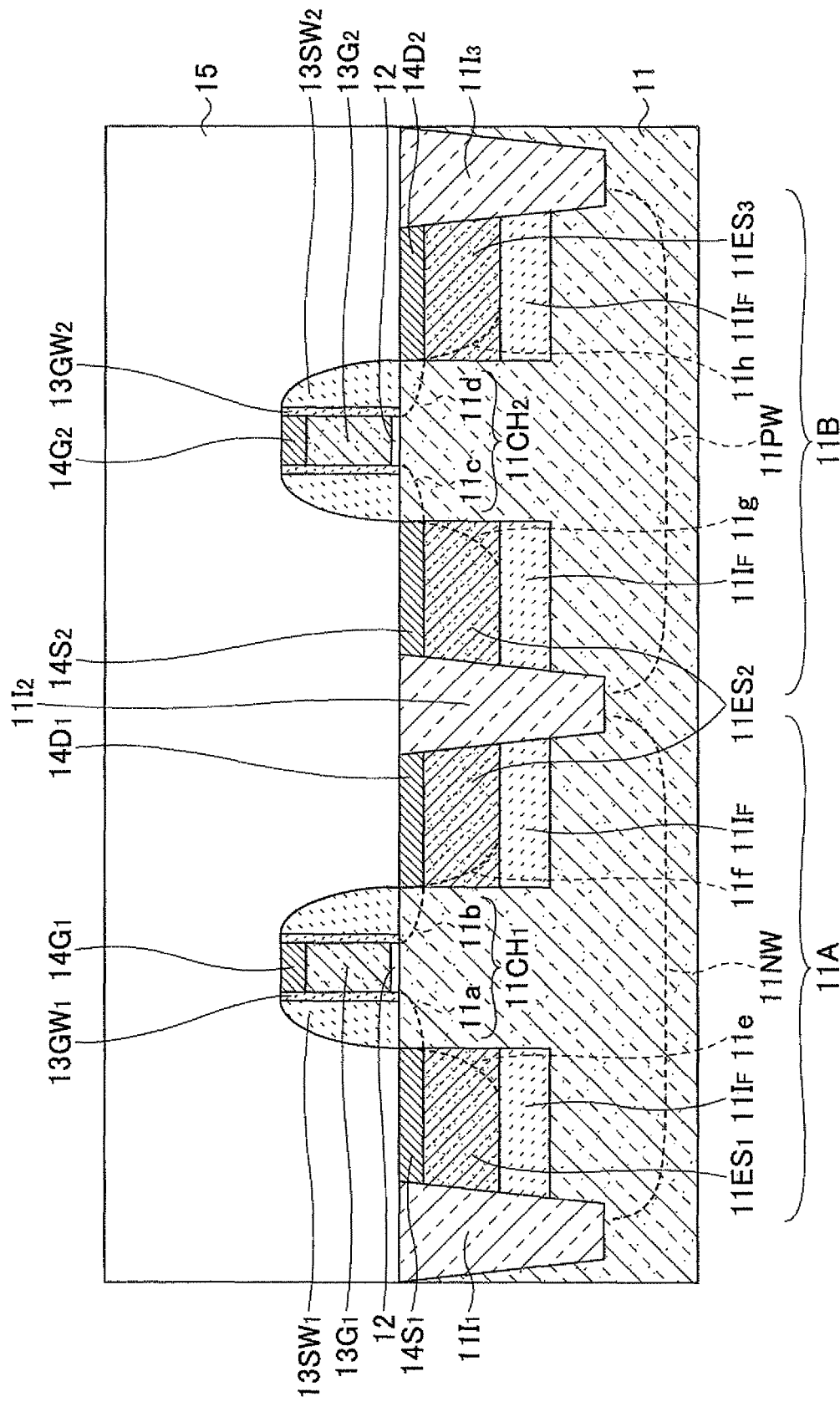

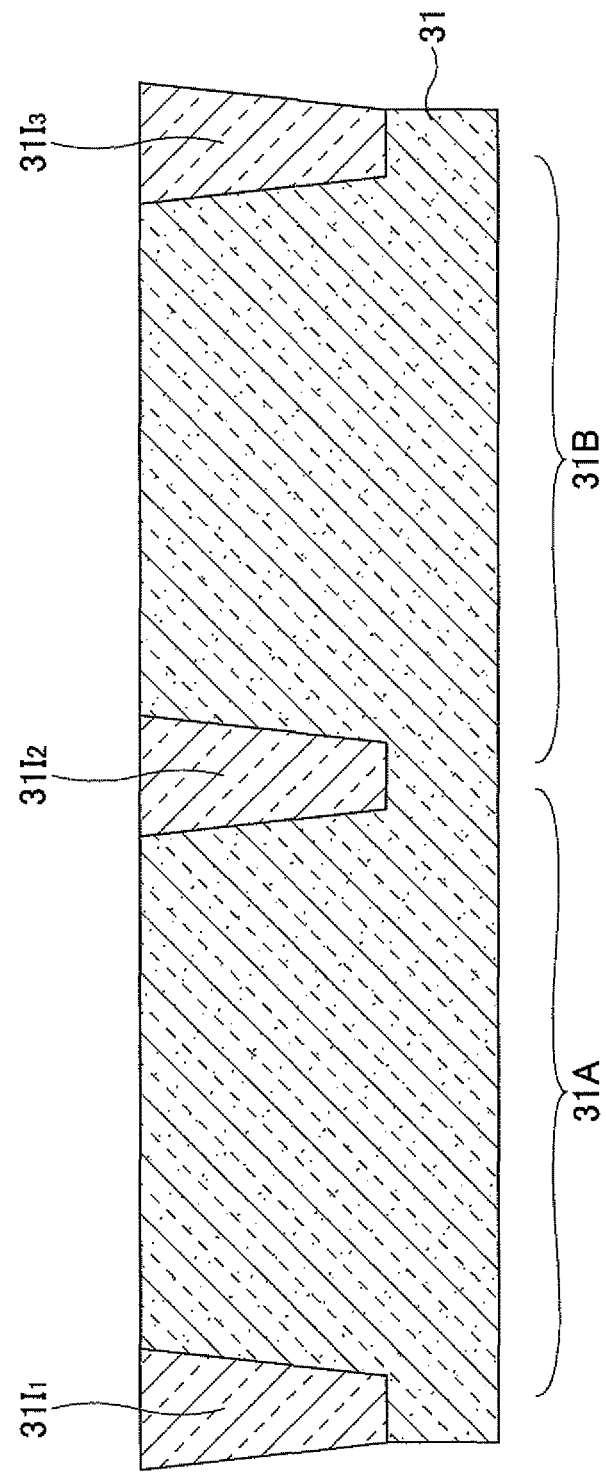

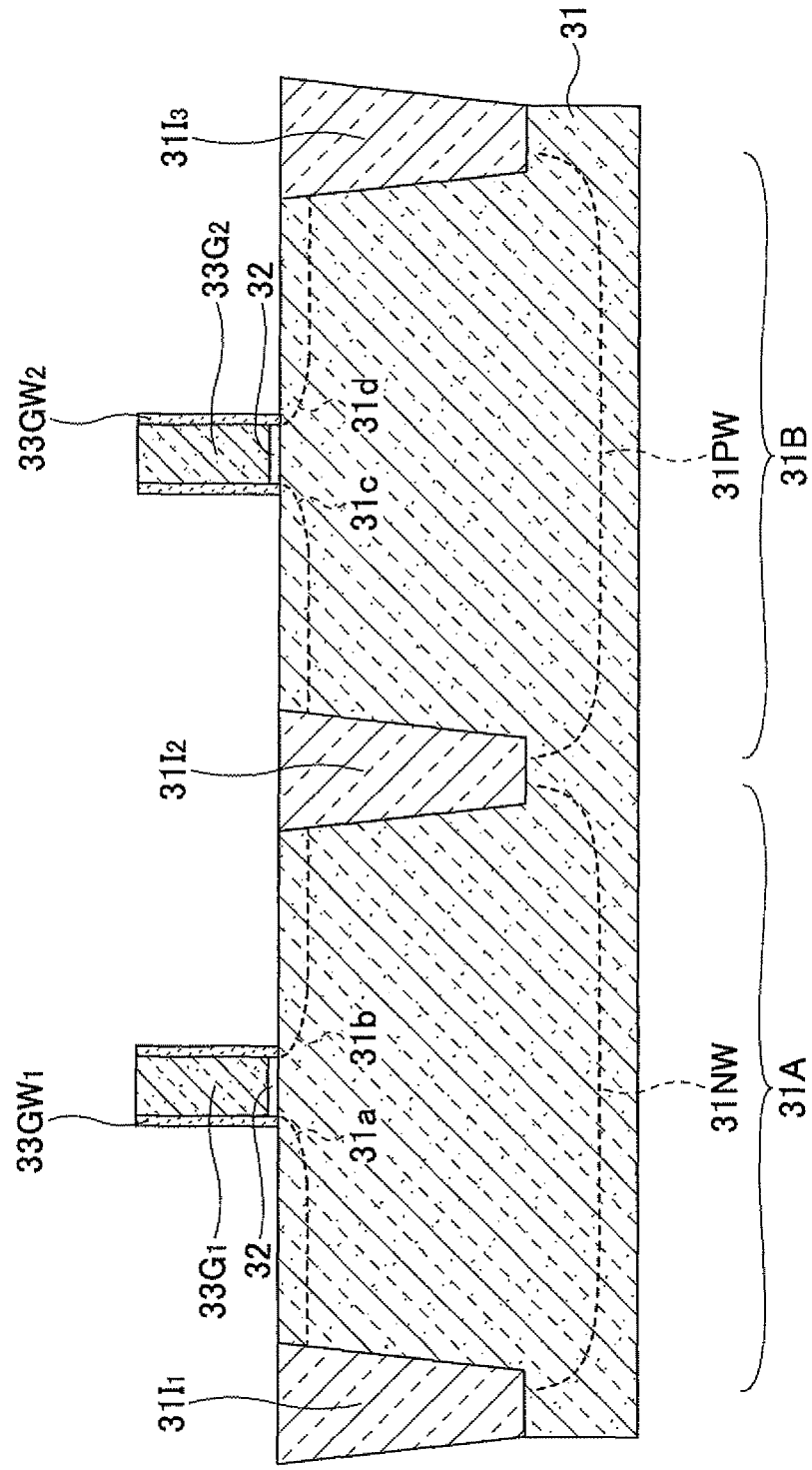

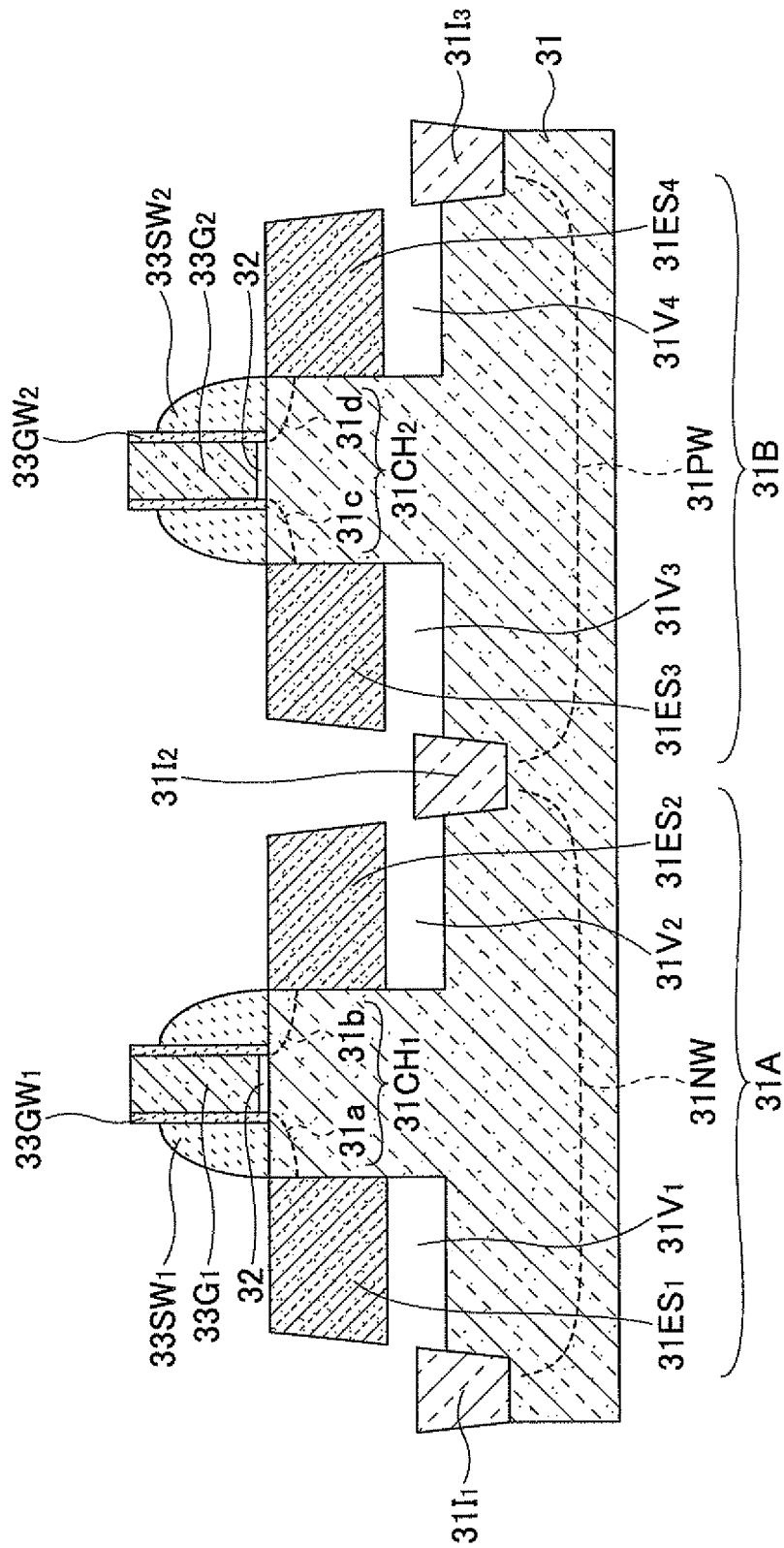

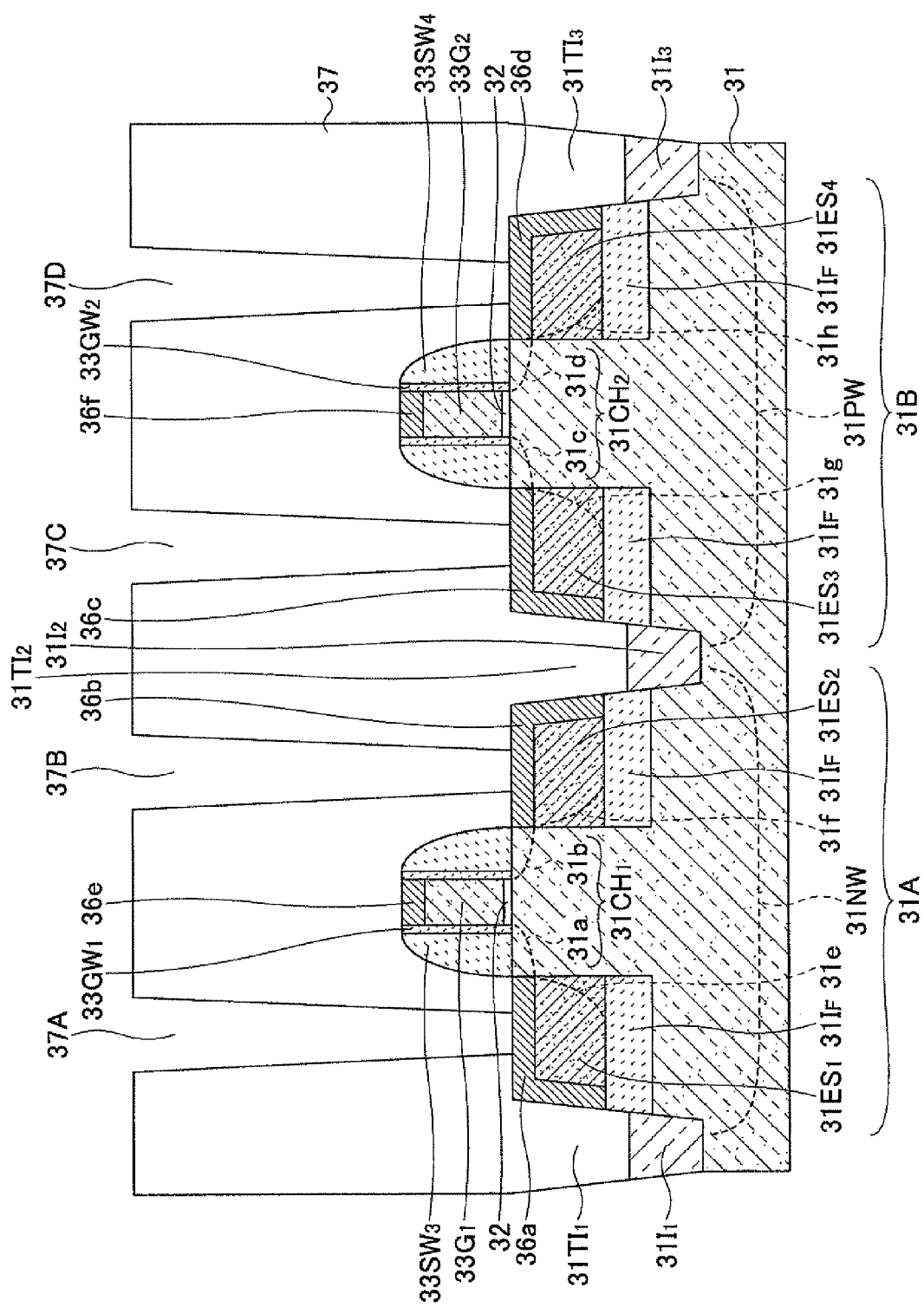

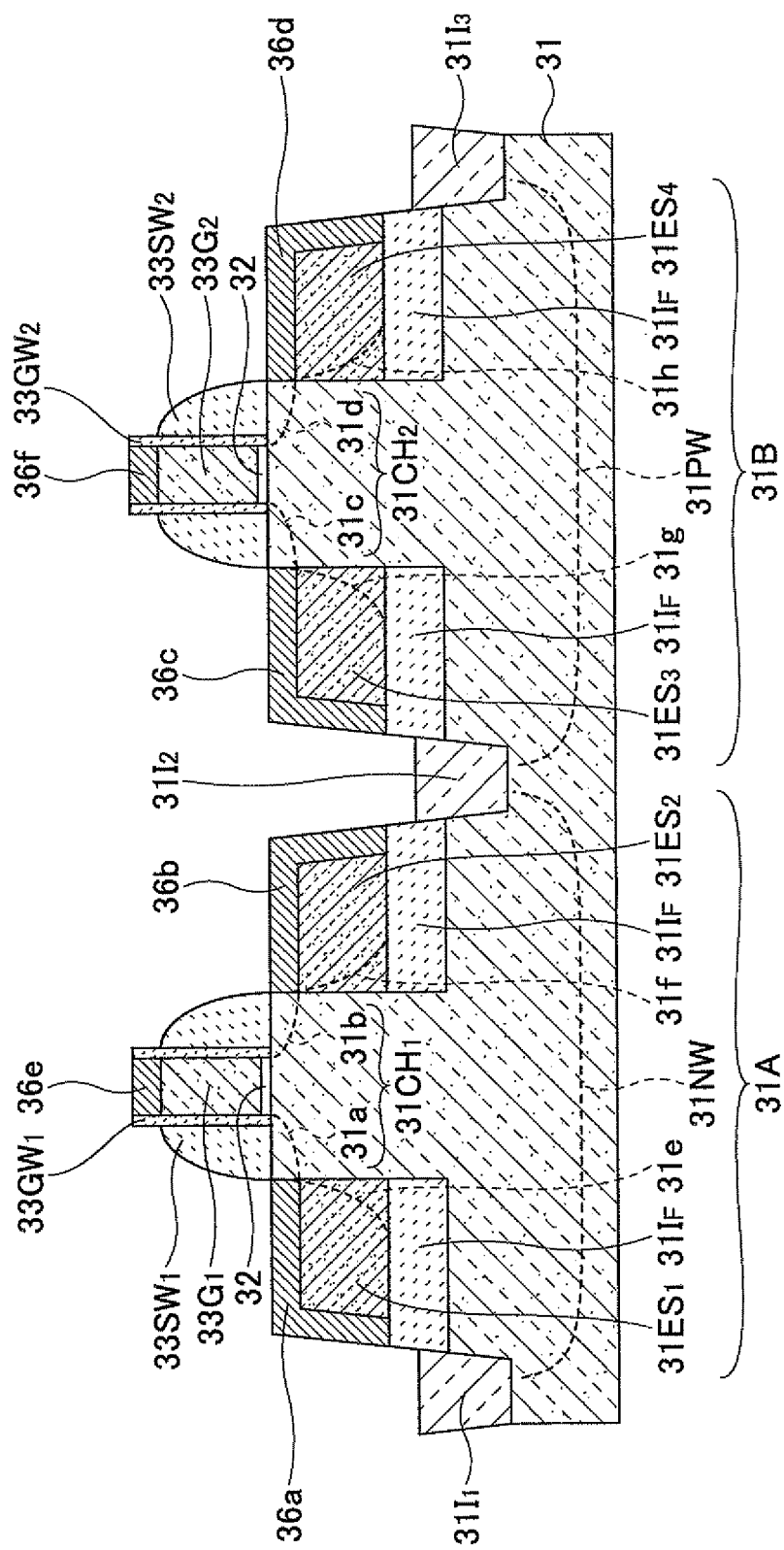

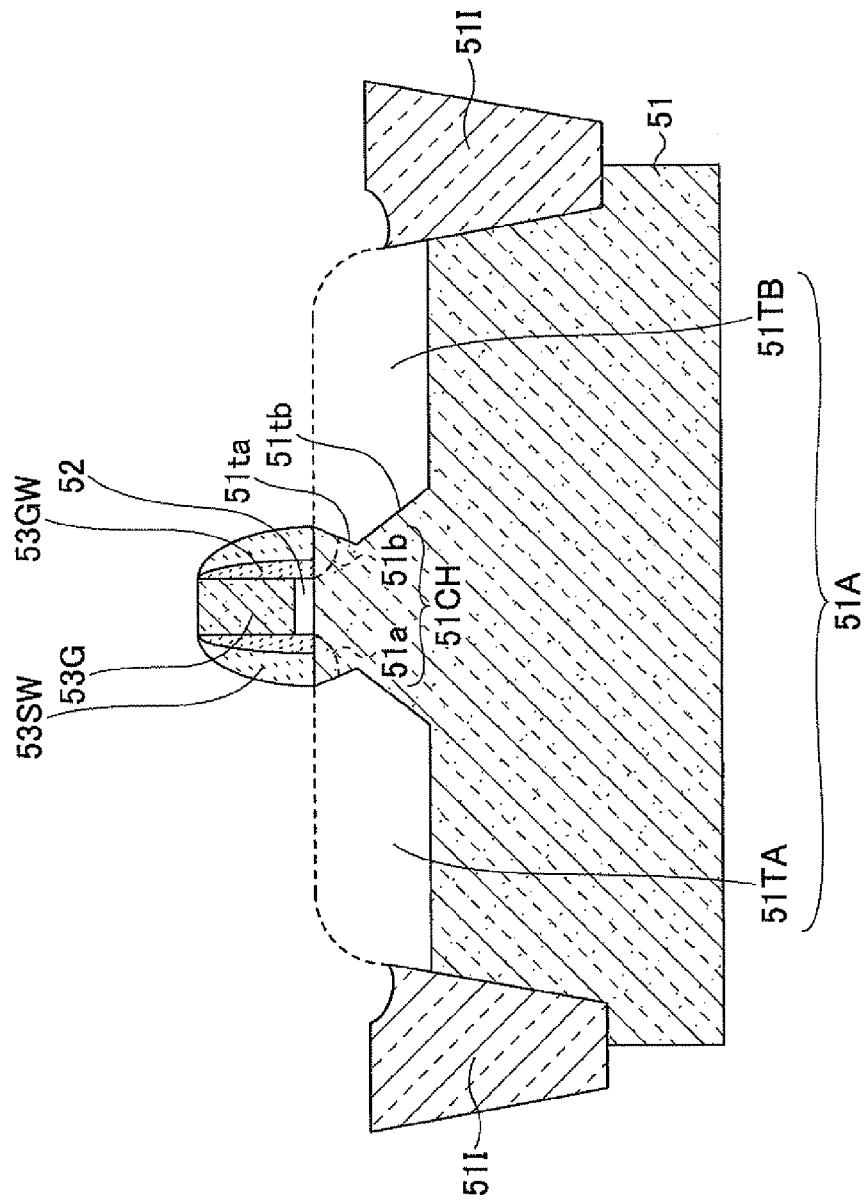

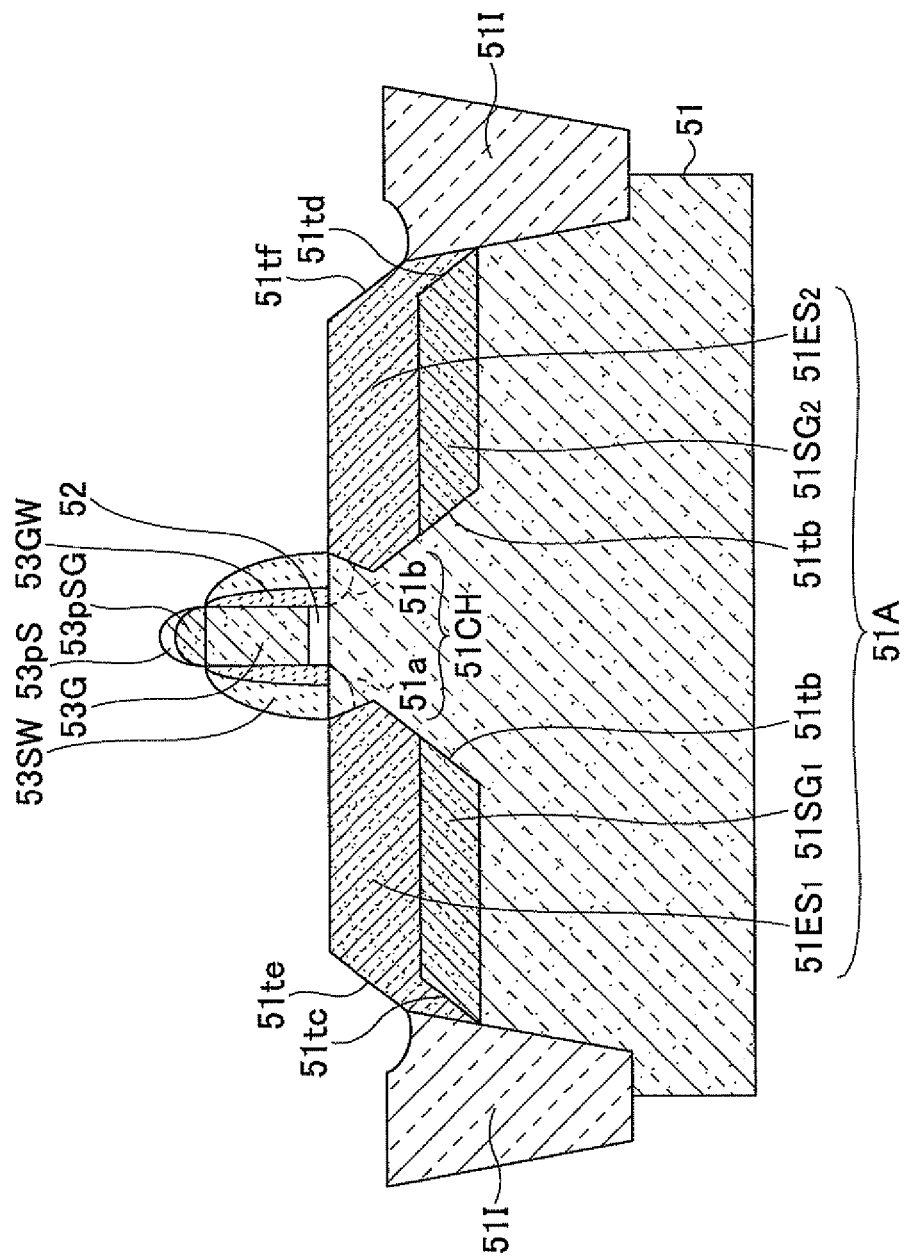

FABRICATION METHOD OF SEMICONDUCTOR DEVICE AND FABRICATION METHOD OF DYNAMIC THRESHOLD TRANSISTOR

CROSS-REFERENCE TO RELATED APPLICATIONS

This application is a U.S. continuation application filed under 35 USC 111a and 365c of PCT application JP2009/070132, filed Nov. 30, 2009. The foregoing application is hereby incorporated herein by reference.

FIELD

The embodiments described herein relate to fabrication semiconductor devices.

In MOS transistors, in general, a source region or drain region is formed in a well of an opposite conductivity type and constituting a device region such that the source region and the drain region are isolated from the well by a p/n junction formed at an interface between the source region and the well or the drain region and the well.

However, a MOS transistor of such an ordinary structure suffers from the problem of degraded operational speed caused by the parasitic capacitance, which is associated with the p/n junction. Further, there is a problem that leakage current is tending to be increased.

PRIOR ART REFERENCES

Patent References

Patent Reference 1 Japanese Laid-Open Patent Application 2005-183987
Patent Reference 2 Japanese Laid-Open Patent Application 2008-112900

Non-Patent References

[Non-Patent Reference 1] Kyong, H. Y., et al., IEEE Electron Device Letters, Vol. 25, No. 6, June 2004
[Non-Patent Reference 2] Fujitsuka, N., et al., Sensors and Actuators A97-98, 2002, pp. 718-719

SUMMARY

In an aspect, there is provided a fabrication method of a semiconductor device that includes the processes of: etching a silicon substrate except for a silicon substrate portion on which a channel region is to be formed to form first and second trenches respectively at a first side and a second side of the silicon substrate portion; filling the first and second trenches by epitaxially growing a semiconductor layer having etching selectivity against silicon and further a silicon layer; removing the semiconductor layer selectivity by a selective etching process to form voids underneath the silicon layer respectively at the first side and the second side of the substrate portion; burying the voids at least partially with a buried insulation film; forming a gate insulation film and a gate electrode on the silicon substrate portion; and forming a source region in the silicon layer at the first side of the silicon substrate portion and a drain region at the second side of the silicon substrate portion.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIGS. 7A-7C are diagrams representing the process of fabricating a semiconductor device according to a third embodiment;
FIGS. 9A-9E are diagrams representing the process of fabricating a semiconductor device according to a fourth embodiment.

DESCRIPTION OF EMBODIMENT

Figure 1A:
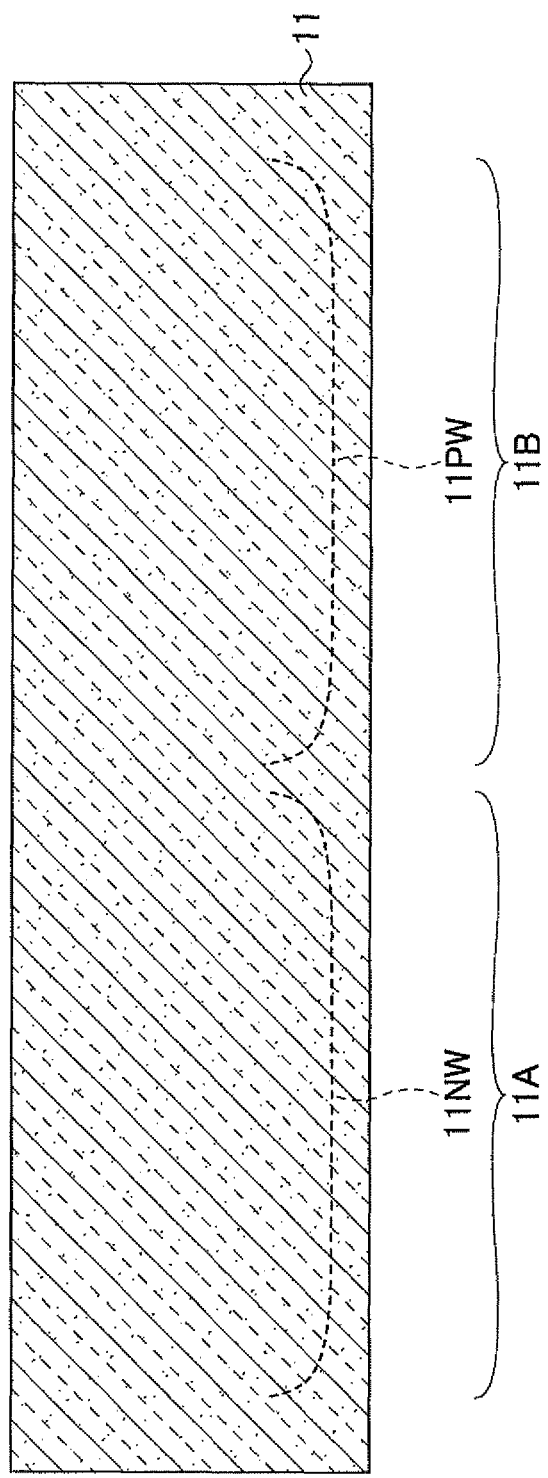
FIGS. 1A-1P are diagrams representing the process of fabricating a semiconductor device according to a first embodiment.

Under the circumstances noted previously, there is proposed a MOS transistor structure that isolates the well from the source region or drain region in the device region by an oxide film or nitride film, or even by a void, formed locally underneath the source and drain regions. Such a MOS transistor structure is important as it is effective for reducing the junction capacitance and is capable of reducing the leakage current.

As the process of forming such a MOS transistor structure, there is proposed a method of forming a stacked structure in which a Si layer is formed on a SiGe mixed crystal layer and removing the SiGe mixed crystal layer alone selectively by utilizing the difference of etching rate between the Si layer and the SiGe mixed crystal layer (Patent Reference 1, Patent Reference 2, Non-Patent Reference 1). With these conventionally proposed methods, a silicon layer that has been grown epitaxially on a monocrystalline bulk silicon substrate via the SiGe mixed crystal layer is used as the channel region of the MOS transistor.

However, a silicon layer grown epitaxially on a bulk silicon substrate has a drawback in that crystal defects are tend to be introduced in the silicon layer particularly in the case the silicon layer is formed on a SiGe mixed crystal layer.

While the formation of crystal defects changes depending upon the growth condition of the Si layer or the SiGe mixed crystal layer and upon the film thickness of the respective layers, there is a tendency, with regard to the misfit dislocations that are formed at the interface between the SiGe mixed crystal layer and the silicon substrate, that the formation of the misfit dislocations is facilitated with increase of the film forming temperature of the SiGe mixed crystal. The misfit dislocations thus formed extend into the silicon layer which is grown epitaxially on the SiGe mixed crystal layer.

It should be noted that formation of such a misfit dislocation is determined by the critical film thickness of the SiGe mixed crystal layer. Thus, when to use the proposed process, it is necessary to suppress the film thickness of the SiGe mixed crystal layer to the critical film thickness or less for suppressing the introduction of the crystal defects into the channel region.

Further, because oxygen or carbon remaining at the interface between the SiGe mixed crystal layer and the silicon substrate becomes the cause of crystal defects in the silicon epitaxial layer, such remaining oxygen or carbon has to be avoided.

Further, in the technology of Patent Reference 1 or Non-Patent Reference 1, the SiGe mixed crystal layer is removed in the part corresponding to the channel region after the epitaxial growth of the SiGe mixed crystal layer. A silicon epitaxial layer is grown thereafter. With such a process, it is not avoidable that the surface of the channel region, on which the gate insulation film and the gate electrode are formed, is concaved. Reference should be made to Non-Patent Reference 1. When the surface of the channel region is thus concaved, there tends to be caused a positional error at the time of formation of the gate electrode. It should be noted that gate electrode is formed by a photolithographic process that uses a high-resolution exposure system characteristic of shallow focal depth. Further, on such a depression region formed at the surface of the silicon epitaxial layer, there tends to appear various different crystal facets, wherein it should be noted that, because the thermal oxidation rate at the silicon surface changes depending on the surface orientation, there is a concern that the film thickness of the gate insulation film may change depending upon the location. When there is caused a positional error in the gate electrode in the state in which the film thickness of the gate insulation film is changing depending upon the location, it is no longer possible to control the characteristics of the semiconductor device properly.

Further, even in the case of growing such a silicon epitaxial layer directly on the bulk silicon substrate, it should be noted that the surface of the bulk silicon substrate may be damaged and may include residue of oxygen or carbon when the technology of Patent Reference 1 or Non-Patent Reference 1 is applied. In such a case, there is a substantial risk that defects are introduced into the silicon epitaxial layer as explained before.

In order to solve these problems, it is preferable to use the bulk silicon substrate for the channel region of the MOS transistor without applying thereto a processing. The present invention proposes a process of using a bulk silicon substrate for the channel region of the MOS transistor without applying processing thereto.

[First Embodiment]

Hereinafter, the fabrication process of a MOS transistor according to a first embodiment will be explained with reference to FIGS. 1A-1P.

Referring to FIG. 1A, a silicon substrate 11 is formed of monocrystalline bulk silicon and has a substrate surface of a (100) surface, for example. The substrate surface includes a device region 11A on which a p-channel MOS transistor is to be formed and a device region 11B on which an n-channel MOS transistor is to be formed, wherein the device region 11A is covered by a photoresist pattern (not illustrated), and B (boron) is introduced into the device region 11B under the acceleration voltage of 300 keV or less with the dose of $5 \times 10^{13}$ $cm^{-2}$ or less, preferably under the acceleration energy of 150 keV and the dose of $3 \times 10^{13}$ $cm^{-2}$. With this, a p-type well 11PW is formed. Therein, the ion implantation may be conducted under an arbitrary tilt angle (Tilt) and from one or more incident directions (Twist). Further, it is possible to use one or more species such as $BF_2$ or In, in addition to B.

Thereby, the device region 11B of the silicon substrate may be applied with a channel stop injection by introducing B (boron) for example under the acceleration energy of 150 keV or less and the dose of $1 \times 10^{13}$ $cm^{-2}$ or less, preferably under the acceleration voltage of 30 keV and the dose of $5 \times 10^{12}$ $cm^{-2}$. In this channel stop injection, the ion implantation may be conducted under an arbitrary tilt angle and can be conducted with one or more twist directions. Further, it is possible to use one or more species such as $BF_2$ or In, in addition to B.

Next, ion implantation for threshold control is conducted for the n-channel MOS transistor. For example, B may be introduced under the acceleration voltage of 40 keV or less and the dose of $3 \times 10^{13}$ $cm^{-2}$ or less, preferably under the acceleration energy of 20 keV and the dose of $1 \times 10^{13}$ $cm^{-2}$. In this ion implantation process, the tilt angle may be chosen arbitrary and the injection may be conducted with one or more twist directions. Further, it is possible to use other B molecules or ions such as $BF_2$, $B_{10}H_x$, in addition to B.

Next, the resist pattern on the device region 11A of the silicon substrate 11 is removed by ashing or wet process that may use SPM (sulfuric acid hydrogen peroxide mixture), and an n-type well 11NW is formed in the device region 11A similarly while covering the device region 11B by a resist pattern.

More specifically, the device region 11B of the silicon substrate 11 is covered by a resist pattern (not illustrated), and P (phosphorus) is introduced into the device region 11A under the acceleration energy of 600 keV or less and the dose of $5 \times 10^{13}$ $cm^{-2}$ or less, preferably under the acceleration energy of 350 keV or less and the dose of $3 \times 10^{13}$ $cm^{-2}$ to form the n-type well 11NW. This ion implantation may be conducted under an arbitrary tilt angle and with more than one twist direction. Further, it is possible to use one or more species such as As or Sb, in addition to P.

Thereby, the device region 11A of the silicon substrate 11 may be applied with a channel stop injection by introducing As (arsenic) for example under the acceleration energy of 300 keV or less and the dose of $1 \times 10^{13}$ $cm^{-2}$ or less, preferably under the acceleration voltage of 100 keV and the dose of $5 \times 10^{12}$ $cm^{-2}$. This ion implantation may be conducted under an arbitrary tilt angle and with more than one twist direction. Further, it is possible to use one or more species such as As or Sb, in addition to P.

Next, ion implantation for threshold control is conducted for the p-channel MOS transistor. For example, As may be introduced under the acceleration voltage of 200 keV or less and the dose of $3\times10^{13}$ cm$^{-2}$ or less, preferably under the acceleration energy of 130 keV and the dose of $3\times10^{13}$ cm$^{-2}$. This ion implantation may be conducted under an arbitrary tilt angle and with more than one twist direction. Further, it is possible to use one or more species such as P, As or Sb for the ionic species.

Next, the resist pattern formed on the device region 11B is removed by ashing or wet process that uses SPM, or the like, and the substrate 11 is thereafter applied with a spike anneal process at the temperature of 1000° C. or about ten seconds such that the impurity elements such as B, P and As introduced in the silicon substrate 11 are activated.

While it was explained that the well injection and the channel injection are conducted first in the step of FIG. 1A, it should be noted that these injection processes may be conducted after the formation of the STI structure of which explanation will be made later.

Figure 1B:
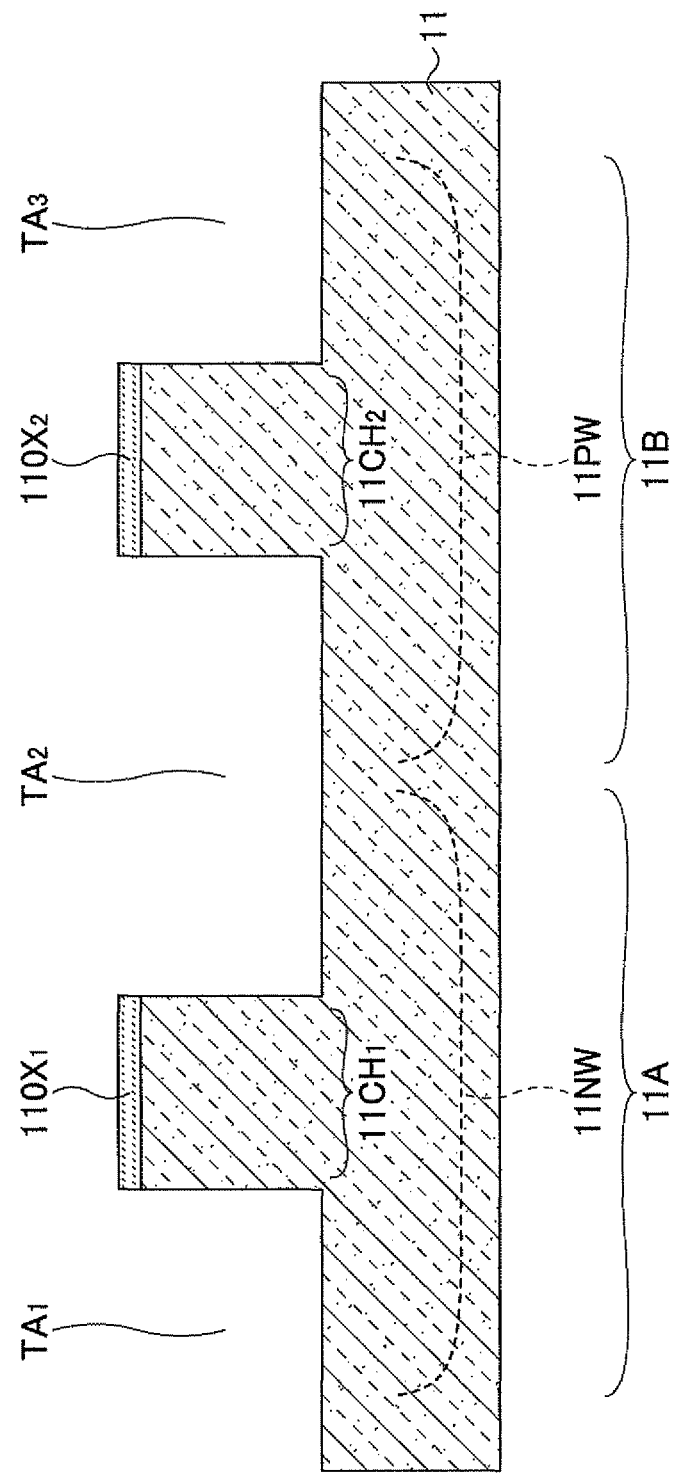

Next, referring to FIG. 1B, an oxide film is formed on the silicon substrate 11 by a CVD process, and after patterning the oxide film, oxide film patterns 11Ox$_1$ and 11Ox$_2$ are formed respectively on the substrate portion 11CH$_1$ including the channel region of the p-channel MOS transistor to be formed and on the substrate portion 11CH$_2$ that includes the channel region of the n-channel MOS transistor to be formed. Further, while using the oxide film patterns 11Ox$_1$ and 11Ox$_2$ as a mask, the silicon substrate 11 is subjected to a dry etching process that uses Cl$_2$ or HCl for the etching gas, for example, and with this, there are formed trenches TA$_1$-TA$_3$ of a depth of 40 nm-150 nm in the silicon substrate 11 at both lateral sides of the substrate portion 11CH$_1$ and the substrate portion 11CH$_2$. In the illustrated example, the substrate portions 11CH$_1$ and 11CH$_2$ have a width of approximately 30 nm-100 nm in FIG. 1B.

As a result of the formation of the trenches TA$_1$-TA$_3$, the substrate portion 11CH$_1$ and the substrate portion 11CH$_2$ form a mesa structure extending upward from the silicon substrate 11 and constituting a part of the silicon substrate 11.

Figure 1C:
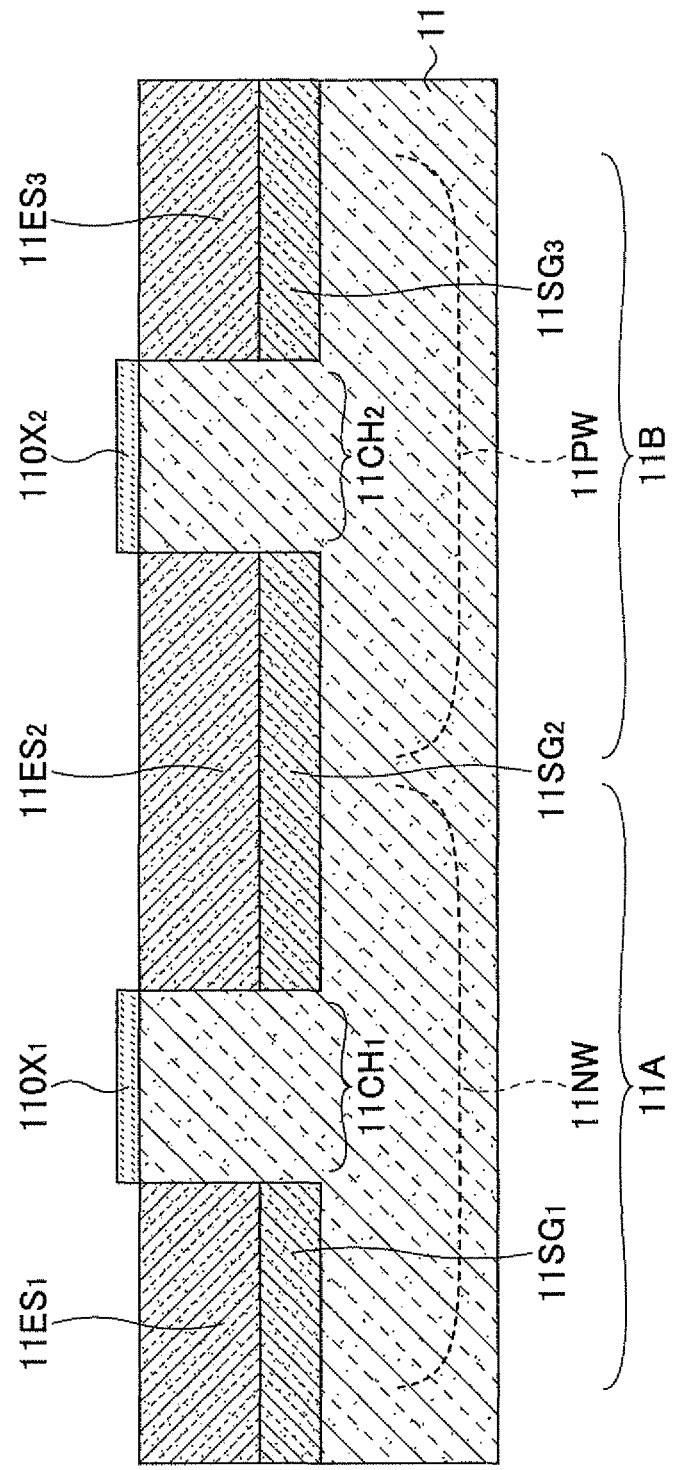

Next, as represented in FIG. 1C, growth of SiGe mixed crystal layers 11SG$_1$-11SG$_3$ is conducted selectively on the exposed surface of the silicon substrate 11 and hence at the bottom of the trenches TA$_1$-TA$_3$ with a thickness of 20 nm-80 nm, for example, while using the oxide patterns 11Ox$_1$ and 11Ox$_2$ as a mask, by conducting a CVD process that uses a mixed gas of silane (SiH$_4$) or dichlorosilane (SiH$_2$Cl$_2$), monogermane (GeH$_4$), hydrogen chloride (HCl) and hydrogen (H$_2$) as a source gas. Here, it should be noted that the term "SiGe mixed layer" used herein may include also a mixed crystal layer containing other element in addition to Si and Ge. Likewise, the term "SiC mixed crystal layer" indicates a mixed crystal layer that may contain other element in addition to Si and C.

The epitaxial growth of the SiGe-mixed crystal layers 11SG$_1$-11SG$_3$ may be conducted at a growth rate of 45 nm/min under the pressure of 1330-13300 Pa (10-100 Torr), preferably 5320 Pa (40 Torr), at the substrate temperature of 650-750° C., preferably 700° C., while setting the partial pressure of hydrogen gas to 4000 Pa-6000 Pa, preferably 5300 Pa, the partial pressure of dichlorosilane to 20 Pa-30 Pa, preferably 26 Pa, the partial pressure of mono-germane to 10 Pa-15 Pa, preferably 12 Pa, and the partial pressure of hydrogen chloride to 10 Pa-15 Pa, preferably 12 Pa.

For the SiGe mixed crystal layer 11SG$_1$-11SG$_3$, a composition containing Ge with an atomic fraction of 20% may be used for example, while the content of Ge may be increased further within the range in which epitaxial growth is possible on the silicon substrate 11. For example, a SiGe mixed crystal containing Ge with an atomic fraction of about 40% may be used for the SiGe mixed crystal layers 11SG$_1$-11SG$_3$. Further, it is also possible to use a SiGeC mixed crystal layer that contains C in place of the foregoing SiGe mixed crystal layers 11SG$_1$-11SG$_3$.

Further, in the step of FIG. 1C, the trenches TA$_1$-TA$_3$ are filled substantially after the selective epitaxial growth of the SiGe mixed crystal layers 11SG$_1$-11SG$_3$ by causing an epitaxial growth of silicon epitaxial layers 11ES$_1$-11ES$_3$ respectively on the SiGe mixed crystal layers 11SG$_1$-11SG$_3$ while using a silane gas or a mixed gas of disilane, hydrogen chloride and hydrogen as the source material.

The growth of the silicon epitaxial layers 11EG$_1$-11EG$_3$ may be conducted at a growth rate of 0.7 nm/min under the pressure of 1330-13300 Pa (10-100 Torr), preferably 5320 Pa (40 Torr) at the substrate temperature of 650-750° C., preferably 700° C., while setting the partial pressure of hydrogen gas to 4000 Pa-6000 Pa, preferably 5300 Pa, the partial pressure of dichlorosilane to 15 Pa-25 Pa, preferably 21 Pa, and the partial pressure of hydrogen chloride to 3 Pa-10 Pa, preferably 5 Pa.

As a result, both lateral sides of the substrate portions 11CH$_1$ and 11CH$_2$ constituting the mesa structure are filled with the stacked structures of the SiGe mixed crystal layers 11SG$_1$-11SG$_3$ and 11ES$_1$-11ES$_3$.

Figure 1D:
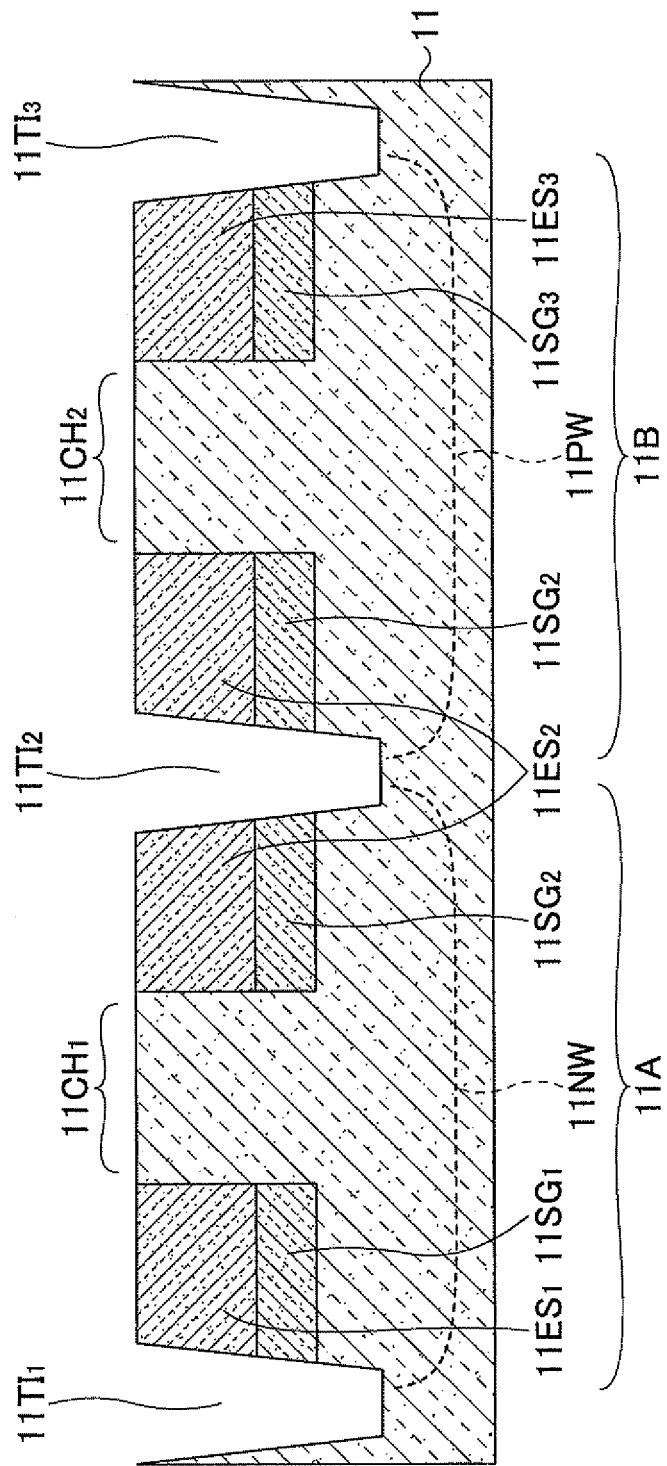

Next, referring to FIG. 1D, the oxide film patterns 11Ox$_1$ and 11Ox$_2$ are removed, and device isolation trenches 11TI$_1$-11TI$_3$ are formed at respective predetermined locations by a dry etching process with a depth deeper than the bottom surface of the SiGe mixed crystal layers 11SG$_1$-11SG$_3$ to reach the silicon substrate 11 located underneath. As a result, the SiGe mixed crystal layers 11SG$_1$-11SG$_3$ are exposed at the lateral wall surfaces of the device isolation trenches 11TI$_1$-11TI$_3$. While FIG. 1D depicts the trenches as having an etching taper angle of several degrees, this taper angle depends upon the etching condition and the trenches may be formed straight with no taper angle.

Figure 1E:
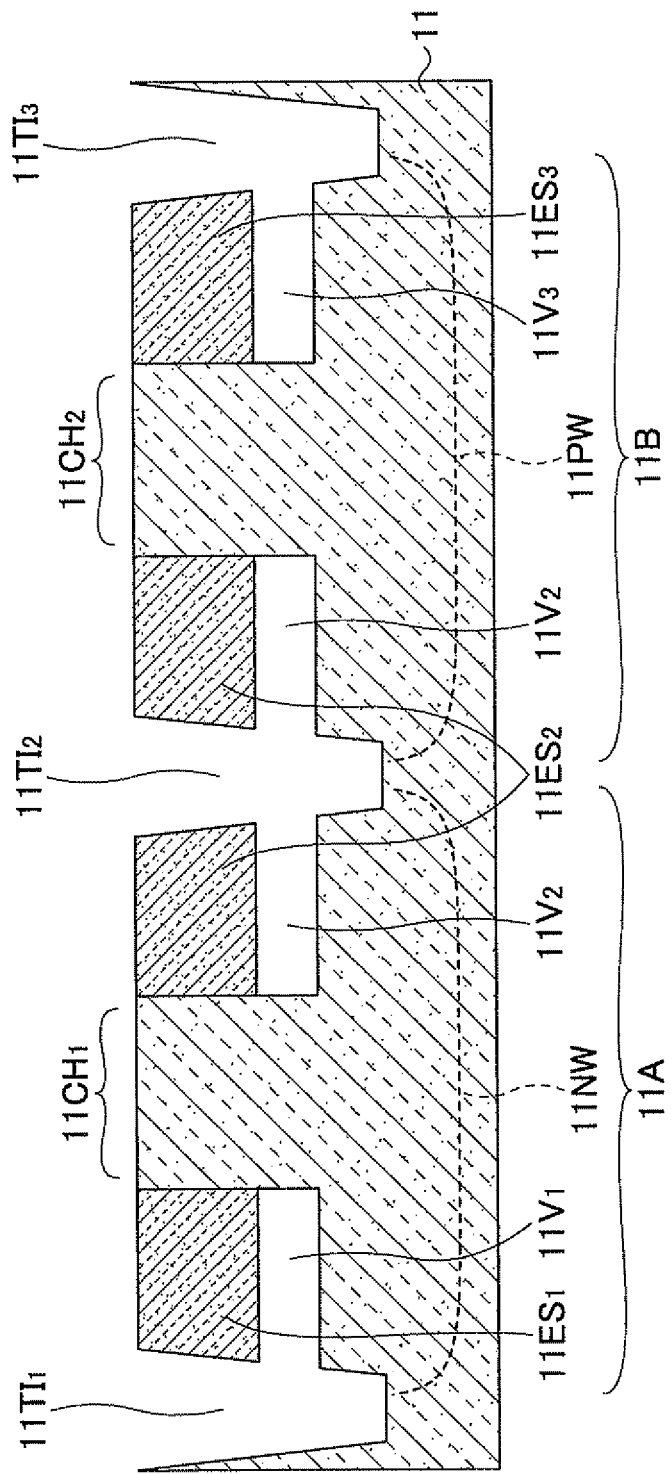

Thus, in the next step of FIG. 1E, the SiGe mixed crystal layers 11SG$_1$-11SG$_3$ are removed selectively with regard to the silicon epitaxial layers 11ES$_1$-11ES$_3$ or with respect to the silicon substrate 11 underneath by a dry etching process that uses a mixed gas of Cl$_2$ and H$_2$, for example. This selective etching of the SiGe mixed crystal layers 11SG$_1$-11SG$_3$ may also be implemented by using a HCl gas. Further, the selective etching of the SiGe mixed crystal layers 11SG$_1$-11SG$_3$ is also possible by a wet etching process.

As a result of the selective etching of the SiGe mixed crystal layers 11SG$_1$-11SG$_3$, there are formed voids 11V$_1$-11V$_3$ in the silicon substrate 11 respectively in correspondence to the SiGe mixed crystal layers 11SG$_1$-11SG$_3$. In the example of FIG. 1E, the void 11V$_2$ is divided into two parts by the device isolation trench 11TI$_2$.

Here, the selective etching of a SiGe mixed crystal layer in a stacked structure in which a silicon epitaxial layer is grown on the SiGe mixed crystal layer will be explained in more detail by referring to FIGS. 2A-2D, FIG. 3 and FIG. 4.

Figure 2A:
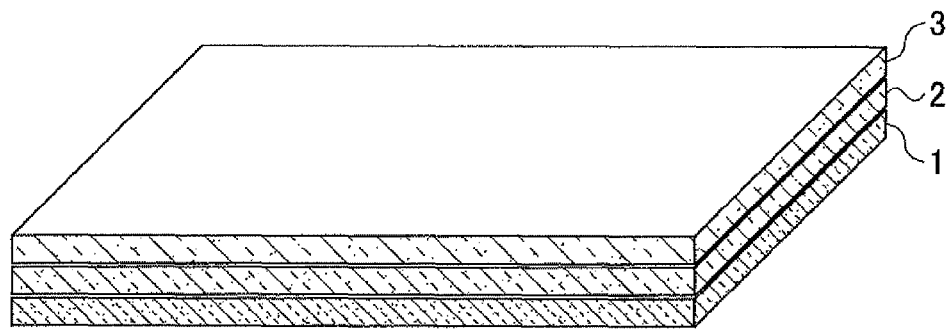
FIGS. 2A-2D are diagrams representing a selective etching of a SiGe mixed crystal layer over a silicon layer.

FIG. 2A represents a blanket specimen manufactured for validating such selective etching effect.

Referring to FIG. 2A, a SiGe mixed crystal layer 2 is grown epitaxially on a silicon substrate 1 with a thickness of about 30 nm, and a silicon layer 3 is grown further on the SiGe mixed crystal layer 2 epitaxially with a film thickness of about 20 nm.

Figure 2B:
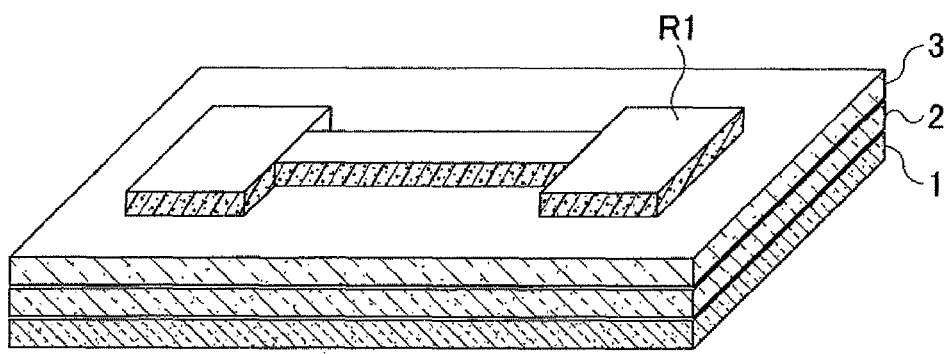
Figure 2C:
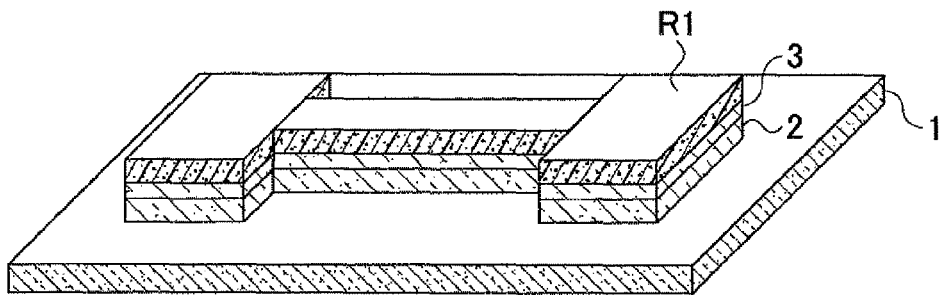

Next, by referring to FIG. 2B, a resist pattern R1 of a predetermined specimen shape is formed on the silicon layer 3 and the silicon layer 3 is patterned into the predetermined specimen shape by patterning the silicon layer 3 in the step of FIG. 2C while using the resist pattern R1 as a mask.

Figure 2D:
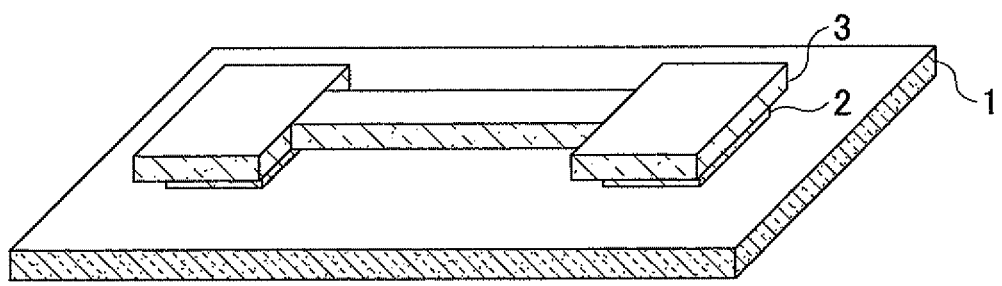

Further, in the step of FIG. 2D, the SiGe mixed crystal layer 2 is subjected to a wet etching process while using an etchant that contains HF, $H_2O_2$ and $CH_3COOH$ with a volumetric ratio of 1:16:24, for example.

Figure 3:
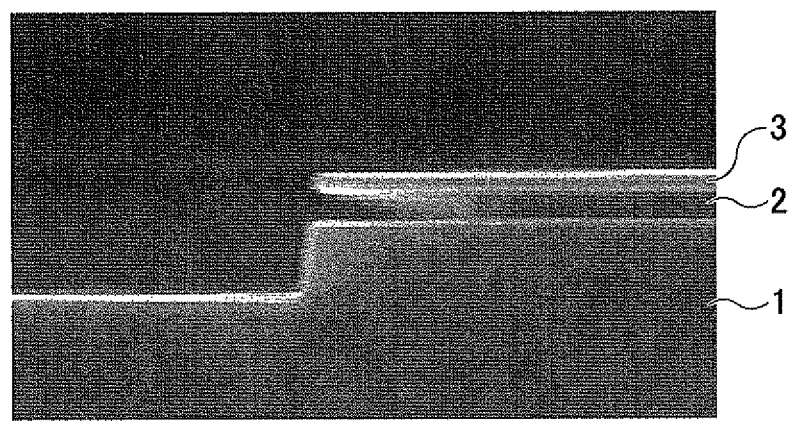
FIG. 3 is a diagram representing an example of the selective etching of a SiGe mixed crystal layer over a silicon layer.

FIG. 3 is a photograph representing the cross-section of the specimen obtained with such an experiment.

Referring to FIG. 3, it can be seen that the SiGe mixed crystal layer 2 underneath the silicon layer 3 undergoes a selective etching.

Figure 4:
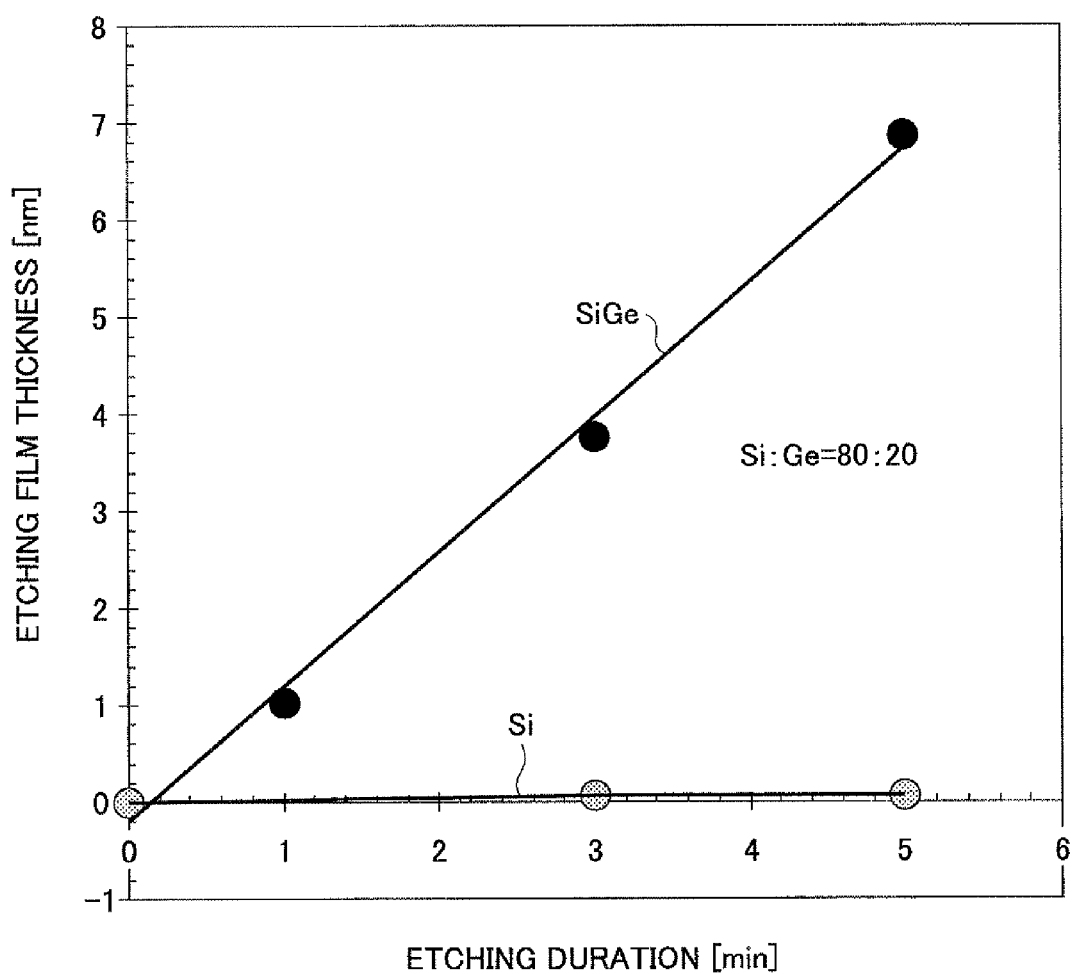
FIG. 4 is a graph comparing the etching rate of a silicon layer and a SiGe mixed crystal layer.

FIG. 4 is a graph representing the relationship between the etching time and the film thickness loss of the SiGe mixed crystal layer 2 and the silicon layer 3 for the case a SiGe mixed crystal containing Si and Ge with an atomic ratio of 80:20 is used for the SiGe mixed crystal layer.

Referring to FIG. 4, it can be seen that the silicon layer 3 experiences little etching even after five minutes of etching, while in the case of the SiGe mixed crystal layer 2, the amount of etching increases linearly with time and it can be seen that a film thickness as much as 7 nm is lost in 5 minutes.

As noted previously, the composition of Ge in the SiGe mixed crystal layers $11SG_1$-$11SG_3$ is not be limited to 20% in atomic ratio but can be increased further for larger etching selectivity, within the limit of 40%, for example, in which epitaxial growth is possible for the mixed crystal layers $11SG_1$-$11SG_3$.

Thus, by conducting wet etching in the step of FIG. 1E, it becomes possible to remove the SiGe mixed crystal layers $11SG_1$-$11SG_3$ selectively with regard to the silicon substrate 11 or the silicon epitaxial layers $11ES_1$-$11ES_3$. Further, the SiGe mixed crystal layers $11SG_1$-$11SG_3$ can be removed also selectively by a dry etching that uses a mixed gas of chlorine ($Cl_2$) and hydrogen or a hydrogen chloride gas.

In the step of FIG. 1D, it should be noted that the device isolation trenches $11TI_1$, $11TI_2$ and $11TI_3$ are not necessarily required to reach the silicon substrate 11 as long they are formed to expose the SiGe mixed crystal layers $11SG_1$-$11SG_3$ even partially.

Further, as indicated in FIG. 1F, a buried insulation film 11IF is deposited on the structure of FIG. 1E so as to fill the voids $11V_1$-$11V_3$. This buried insulation film is a film containing silicon oxide or silicon nitride as the predominant component and it is preferable to use a film forming process of superior step coverage such as atomic layered deposition (ALD) process, CVD process, SOD (spin-on-dielectric) process for the deposition of such a buried insulation film. In the illustrated example, an insulation film predominantly containing silicon oxide as a major component is deposited for the buried insulation film $11I_F$ by an ALD process. In this case, the film formation was conducted at the temperature of 300-600° C. while using tetra dimethyl amino silane (TD-MAS) and ozone ($O_3$) as the source gas. For the source gases it is also possible to use BTBBAS and oxygen ($O_2$). The buried insulation film $11I_F$ thus formed by ALD process is deposited conformal with the structure of FIG. 1E over the entire surface and fills the voids $11V_1$-$11V_3$ substantially completely. Here, it should be noted that the buried insulation film $11I_F$ is note required to fill the voids $11V_1$-$11V_3$ completely and there may remain unfilled part without problem. In the case a void is remained in the buried insulation film 11F, there may be attained a preferable effect of decreased specific capacitance for the overall buried insulation film $11I_F$.

Further, the process of the step of FIG. 1F may be conducted by combining an ALD process and a CVD process, or an ALD process and an SOD process. In the case a void is allowed to be left in the buried insulation film $11I_F$, which fills the voids $11V_1$-$11V_3$, or it is desirable that a void is left therein, it is possible to conduct the film formation process of the buried insulation film $11I_F$ by a CVD process or SOD process.

Next, as represented in FIG. 1G, the buried insulation film 11IF thus deposited in the step of FIG. 1F is removed from the surface of the silicon substrate 11 by a wet processing that uses a fluoric acid, for example, and a silicon oxide film is deposited by a PECVD (plasma enhanced chemical vapor deposition) process so as to bury the device isolation trenches $11IT_1$-$11IT_3$ in the step of FIG. 11H. Further, the silicon oxide film deposited on the silicon substrate 11 is removed by a CMP (chemical mechanical polishing) process, and there is formed a device isolation region of the STI structure in which the device isolation trenches $11IT_1$-$11IT_3$ are filled with the device isolation films $11I_1$-$11I_3$.

By forming the device isolation films $11I_1$-$11I_3$ in correspondence to the device isolation regions, there are defined a device region 11A for a p-channel MOS transistor and a device region 11B for an n-channel MOS transistor on the silicon substrate 11.

Further, as explained with reference to FIG. 1A, the well injection and the channel injection for forming the n-type well 11NW or p-type well 11PW may be conducted after the formation of the device isolation insulation films $11I_3$-$11I_3$.

Figure 1H:
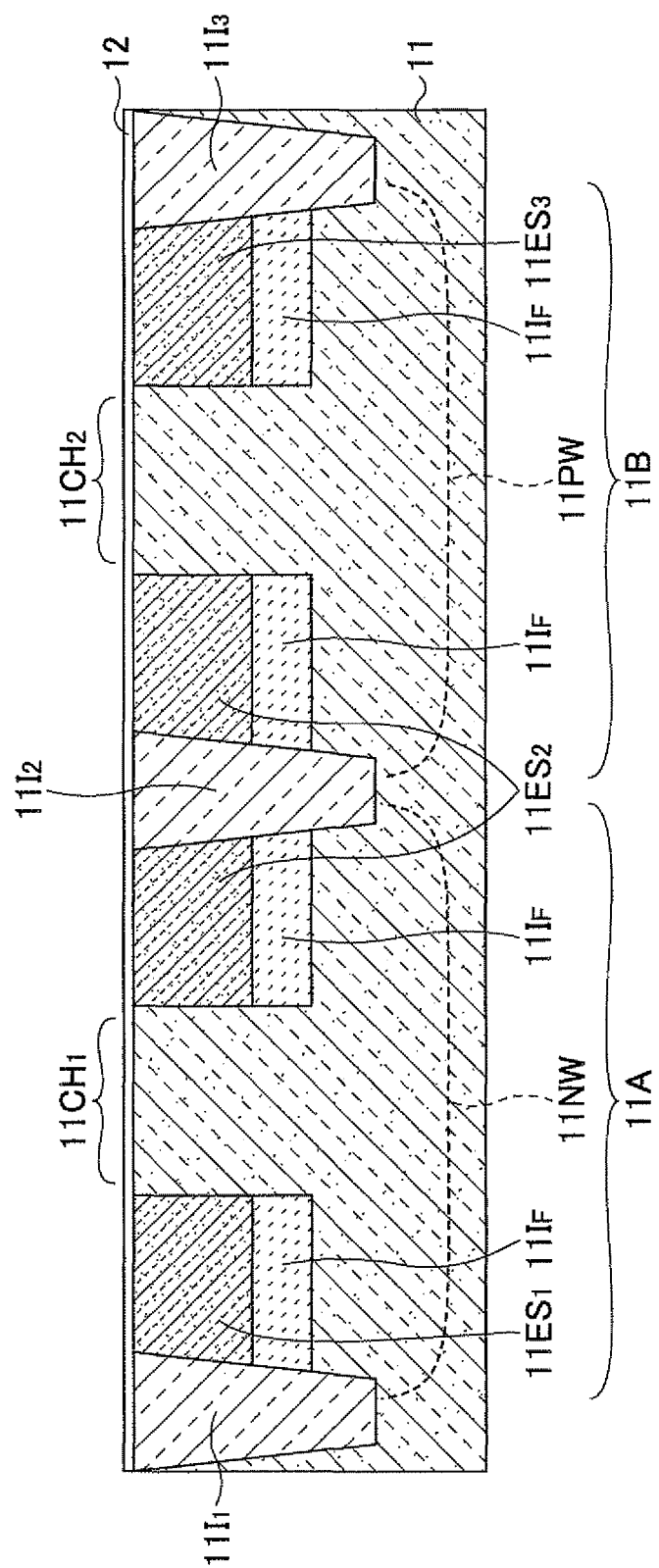

In the step of FIG. 1H, there is further formed a thin insulation film 12 on the silicon substrate 11 as the gate insulation film of the p-channel MOS transistor and the n-channel MOS transistor. The formation of such a gate insulation film 12 may be conducted by forming a base oxide film of the film thickness of about 1 nm by applying a dry oxidation process to the surface of the silicon substrate 11 at about 900° C., followed by conversion to an oxynitride film by applying a plasma nitridation process in an NO ambient. In this case the plasma nitridation process is not limited to the NO ambient but may be conducted in an $N_2O$ ambient or $NH_3$ ambient also. Further, the gate oxide film 12 is not limited to an oxynitride film but may be formed of a high-dielectric (high-K) dielectric film such as $HfO_2$ film or $HfSiO_4$ film. Further, by using different resist processes depending upon different device regions, it may also become possible to form gate oxide films of various different film thicknesses and film species between the device region 11A and the device region 11B.

Next, in the step of FIG. 1I, a polysilicon film (not illustrated) is deposited on the structure of FIG. 1H, and hence on the gate insulation film 12, by a LPCVD (low-pressure chemical vapor deposition) process at the temperature of about 600° C. with a film thickness of about 100 nm. Further, in the step of FIG. 1I, the polysilicon film is covered with a resist pattern in the device region 11A and the polysilicon film is doped to n-type in the device region 11B by introducing an n-type impurity element into the polysilicon film. For example, P (phosphorus) is introduced under the acceleration energy of 30 keV or less and a dose of $2 \times 10^{15}$ $cm^{-2}$-$2 \times 10^{16}$ $cm^{-2}$, preferably under the acceleration energy of 20 keV and the dose of $5 \times 10^{15}$ $cm^{-2}$. This ion implantation may be conducted under an arbitrary tilt angle and with more than one twist direction. Further, it is possible to use one or more species such as P or As. Further, for the sake of pre-amorphous process, Ge or Si may be injected in advance. Further, the resist pattern is removed by a wet process that uses ashing or SPM, or the like.

Next, the polysilicon film is covered with a resist pattern in the device region 11B, and a polysilicon film is doped to the p-type by injecting a p-type impurity element is into the polysilicon film in the device region 11A. For example, B (boron) may be introduced under the acceleration energy of 7 keV or less and a dose of $2\times10^{15}$ cm$^{-2}$-$2\times10^{16}$ cm$^{-2}$, preferably under the acceleration energy of 5 keV and the dose of $5\times10^{15}$ cm$^{-2}$. In this ion implantation process, the tilt angle may be chosen arbitrary and the injection may be conducted with one or more twist directions. Further, it is possible to use other B molecules or ions such as B, BF$_2$, B$_{10}$Hx, or the like, for the ion implantation species. For the sake of pre-amorphous process, Ge or Si may be injected in advance. Thereafter, the resist pattern is removed by a wet process that uses ashing or SPM, or the like.

Further, in the step of FIG. 1I, a spike annealing is conducted to the semiconductor substrate for the purpose of facilitating diffusion of the n-type and p-type impurity elements introduced into the polysilicon film at the thermal annealing process with the duration of about 5 seconds.

Next, in the step of FIG. 1I, the polysilicon pattern is patterned and a gate electrode pattern 13G$_1$ is formed in the device region 11A from the p-type polysilicon pattern and a gate electrode pattern 13G$_2$ of n-type polysilicon is formed in the device region 11B from the n-type polysilicon.

Here, it should be noted that the gate electrodes 13G$_1$ and 13G$_2$ are not limited to polysilicon but may also be formed by an amorphous silicon film. In this case, an amorphous film is formed at the beginning of the step of FIG. 1I in place of the polysilicon film.

Figure 1J:
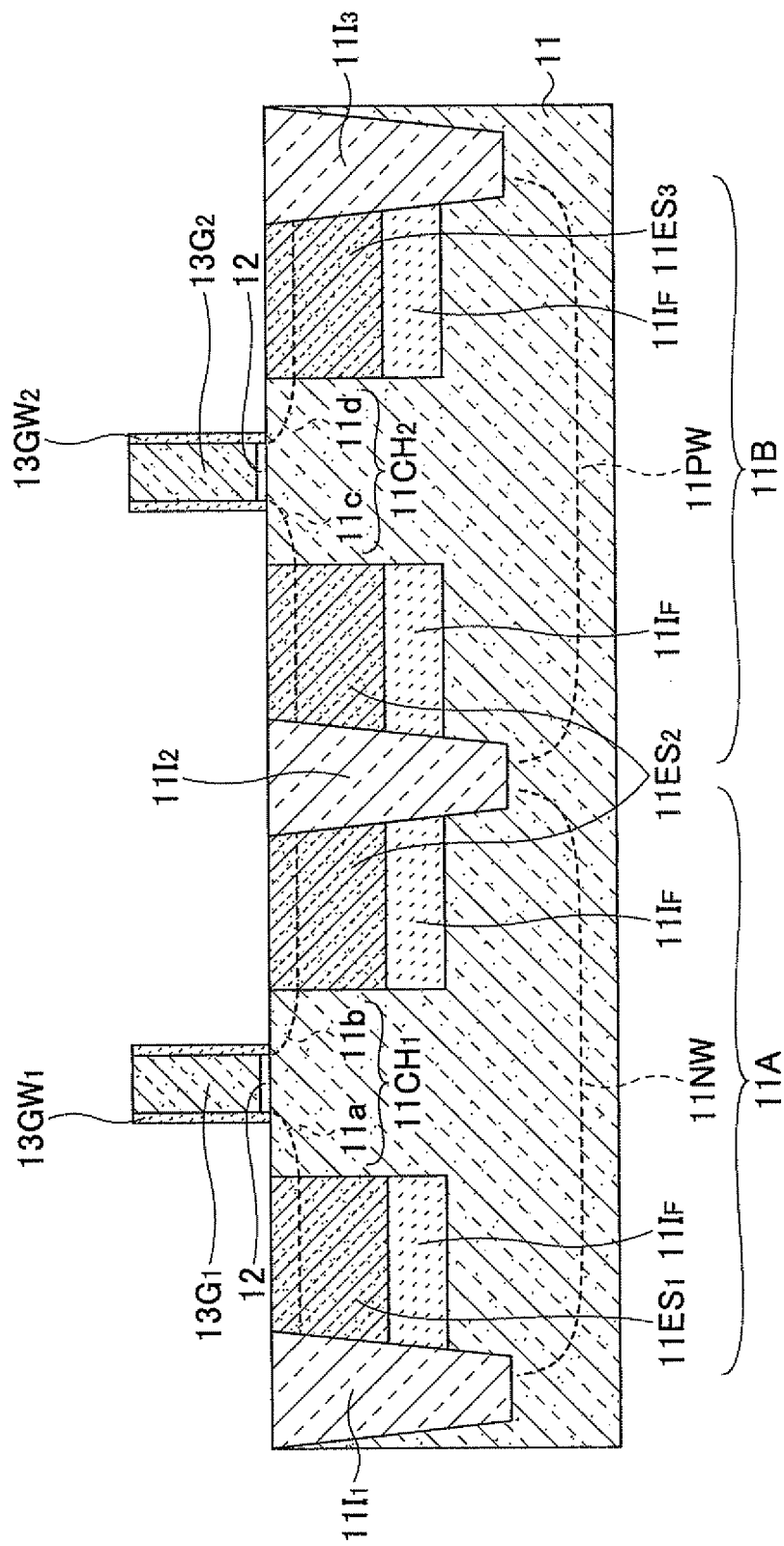

Next, in the step of FIG. 1J, there is deposited an insulation film (not illustrated) on the silicon substrate 11 by a CVD process, for example, so as to cover the silicon substrate 11 and the gate electrode patterns 13G$_1$ and 13G$_2$ in conformity with the shape thereof. Further, by applying an etch-back process by an RIE process acting generally perpendicularly to the principal surface of the silicon substrate 11, there are formed sidewall spacers 13GW$_1$ and 13GW$_2$ of the insulation film on the respective sidewall surfaces of the gate electrode patterns 13G$_1$ and 13G$_2$. Such an insulation film can be formed by an etchback process of an oxide film formed by an LPCVD process with the film thickness of about 10 nm while using TEOS (tetra ethyl orthosilicate) as a source at the substrate temperature of about 600° C. Further, the sidewall spacers 13GW$_1$ and 13GW$_2$ may also be formed by etching back an SiN film formed by an LPCVD process that uses dicholosilane (SiH$_2$Cl$_2$) to a film thickness of about 10 nm at the substrate temperature of about 650°.

In the present embodiment, it should be noted that the sidewall spacers 13GW$_1$ and 13GW$_2$ are not essential and the process for forming the sidewall spacer film and the process for forming the sidewall spacers may be omitted.

Further, in the step of FIG. 1J, the device region 11A of the silicon substrate 11 is protected by photoresist following the formation of the sidewall spacers 13GW$_1$ and 13GW$_2$, and pocket injection and extension injection are conducted in the device region 11B while using the gate electrode pattern 13G$_2$ and the sidewall spacers 13GW$_2$ as a mask. Thereby, it should be noted that the sidewall spacers 13GW$_2$ function as an offset at the time of the pocket injection and the extension injection into the device region 11B. As a result, there are formed p-type pocket injection regions (not illustrated) and n-type source and drain extension regions 11c and 11d in the substrate portion 11CH$_2$ as represented in FIG. 1J at both lateral sides of the polysilicon gate electrode 13G$_2$.

The pocket injection into the device region 11B may be conducted by an ion implantation process of B under the acceleration energy of 20 keV or less with the dose of $5\times10^{13}$ cm$^{-2}$ or less, preferably at the acceleration energy of 10 keV and the dose of $3\times10^{13}$ cm$^{-2}$. Here, the tilt angle may be chosen arbitrary and one or more twist directions may be employed. For the injection species, one or more of B, In, or molecules or ions of B such as BF$_2$ or B$_{10}$H$_x$ may be used.

Formation of the source/drain extension regions 11c and 11d in the device region 11B may be attained by an ion plantation process of As (arsenic), for example, conducted under the acceleration energy of 5 keV or less with the dose of $2\times10^{13}$-$2\times10^{15}$ cm$^{-2}$, preferably under the acceleration energy of 3 keV and the dose of $5\times10^{14}$ cm$^{-2}$. Here, any tilt angle may be used with one or more twist directions. Further, one or more of the species such as P, As or Sb may be injected. Further, for the purpose of pre-amorphous processing, Ge or Si may be injected in advance.

In the case formation of the sidewall spacers 13GW$_1$ and 13GW$_2$ is omitted in the step of FIG. 1J, the ion implantation for formation of the pocket injection region and the ion implantation for formation of the source/drain extension regions 11c and 11d are conducted while using the gate electrode pattern 13G$_2$ as a mask.

Further, in the step, of FIG. 1J, formation of the n-type pocket injection region and the p-type source/drain extension regions 11a and 11b are conducted into the device region 11A of the silicon substrate 11 similarly.

In more detail, the device region 11B is protected by a resist pattern and pocket injection and extension injection are conducted into the device region 11A while using the gate electrode pattern 13G$_1$ and the sidewall spacers 13GW$_1$ formed on the gate electrode pattern 13G$_1$ as a mask in the device region 11A. Thereby, the sidewall spacers 13GW$_1$ functions as an offset for conducting the pocket injection and extension injection into the device region 11A of the silicon substrate 11.

The pocket injection into the device region 11A may be conducted by an ion implantation process of As under the acceleration energy of 100 keV or less with the dose of $5\times10^{13}$ cm$^{-2}$ or less, preferably at the acceleration energy of 70 keV and the dose of $3\times10^{13}$ cm$^{-2}$. Here, any tilt angle may be used and the injection may be conducted with one or more twist directions. Further, one or more of P, As or Sb may be injected.

Formation of the source/drain extension regions 11a and 11b in the device region 11A may be attained by an ion plantation process of B, for example, conducted under the acceleration energy of 2 keV or less with the dose of $2\times10^{13}$-$2\times10^{15}$ cm$^{-2}$, preferably under the acceleration energy of 1 keV and the dose of $5\times10^{14}$ cm$^{-2}$. Here, any tilt angle may be used with one or more twist directions. Further, one or more of the species such as B, BF$_2$ or B$_{10}$H$_x$ may be injected. Further, for the purpose of pre-amorphous processing, Ge or Si may be injected in advance.

In the device region 11A, too, the injection of the pocket impurity element is conducted to the depth deeper than the p-type source/drain extension regions 11a and 11b.

In the case there exist a plurality of device regions on the silicon substrate for p-channel MOS transistors and n-channel MOS transistors, it is possible to change the condition of ion implantation for each device region at the time of the pocket injection or formation of the source/drain extension regions. In this case, the processes of resist pattern formation; pocket injection to a pertinent device region, ion implantation for formation of source/drain extension regions in the pertinent device regions and removal of the resist pattern are conducted repeatedly as necessary for each of the device regions.

In the case formation of the sidewall spacers 13GW$_1$ is omitted, the pocket injection and the extension injection into the device region 11A may be attained by using the gate electrode pattern $13G_1$ as a mask.

Figure 1K:
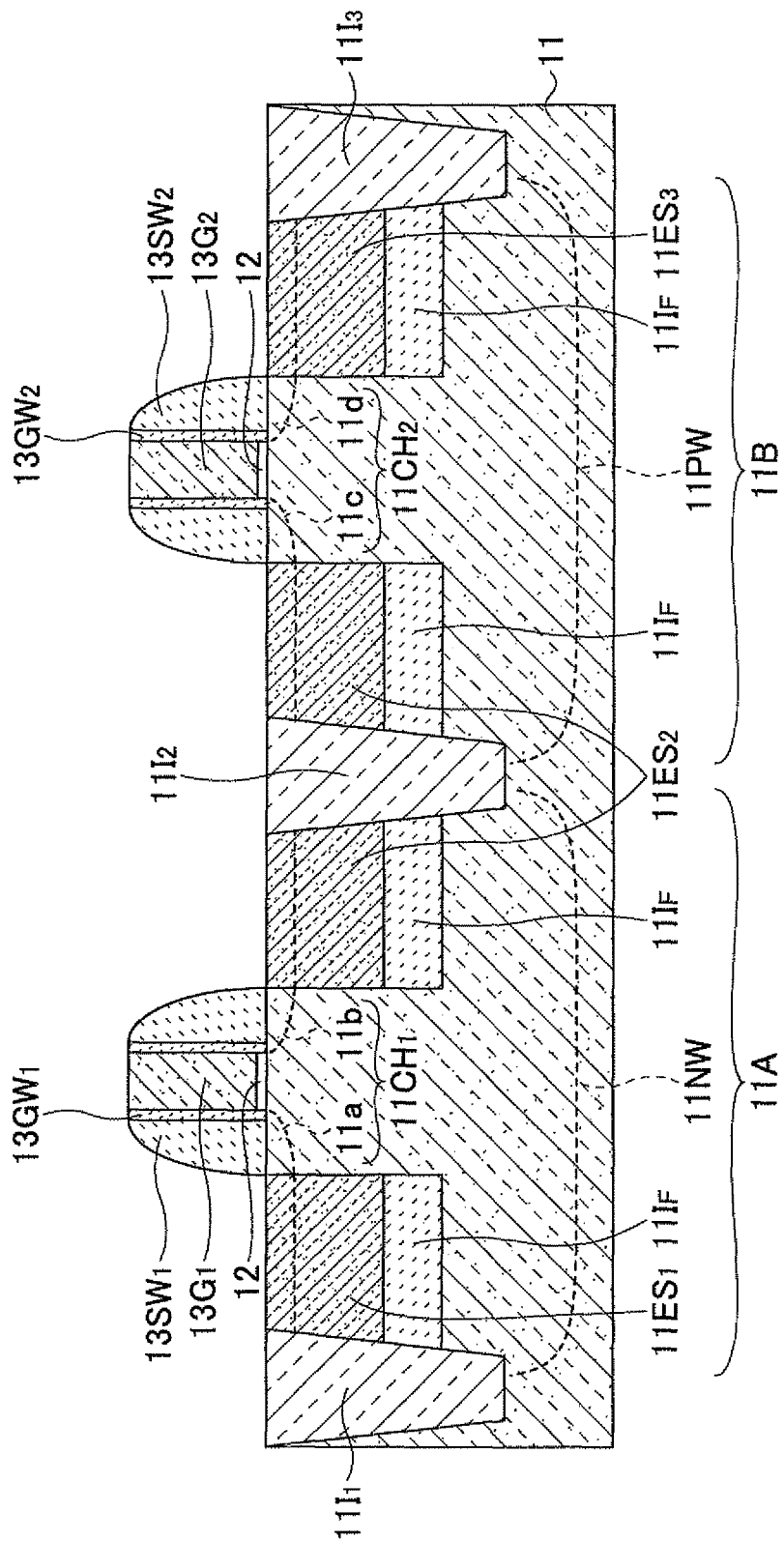

Next, in the step of FIG. 1K, an insulation film preferably having HF resistance, such as an SiON film or SiN film, is formed over the entire surface of the silicon substrate 11 by an LPCVD process, or the like, at a low temperature of about 600° C. or less and with a film thickness of 20-30 nm, so as to cover the gate electrode pattern $13G_1$ carrying the sidewall spacers $13GW_1$ and further the gate electrode pattern $13G_2$ carrying the sidewall spacers $13GW_2$. Further, the insulation film thus formed is subjected to an etchback process to form sidewall insulation films $13SW_1$ on both sidewall surfaces of the gate electrode $13G_1$ via the respective sidewall spacers $13GW_1$ and further sidewall insulation films $13SW_2$ on both sidewall surfaces of the gate electrode $13G_2$ via the respective sidewall spacers $13GW_2$.

Figure 1L:
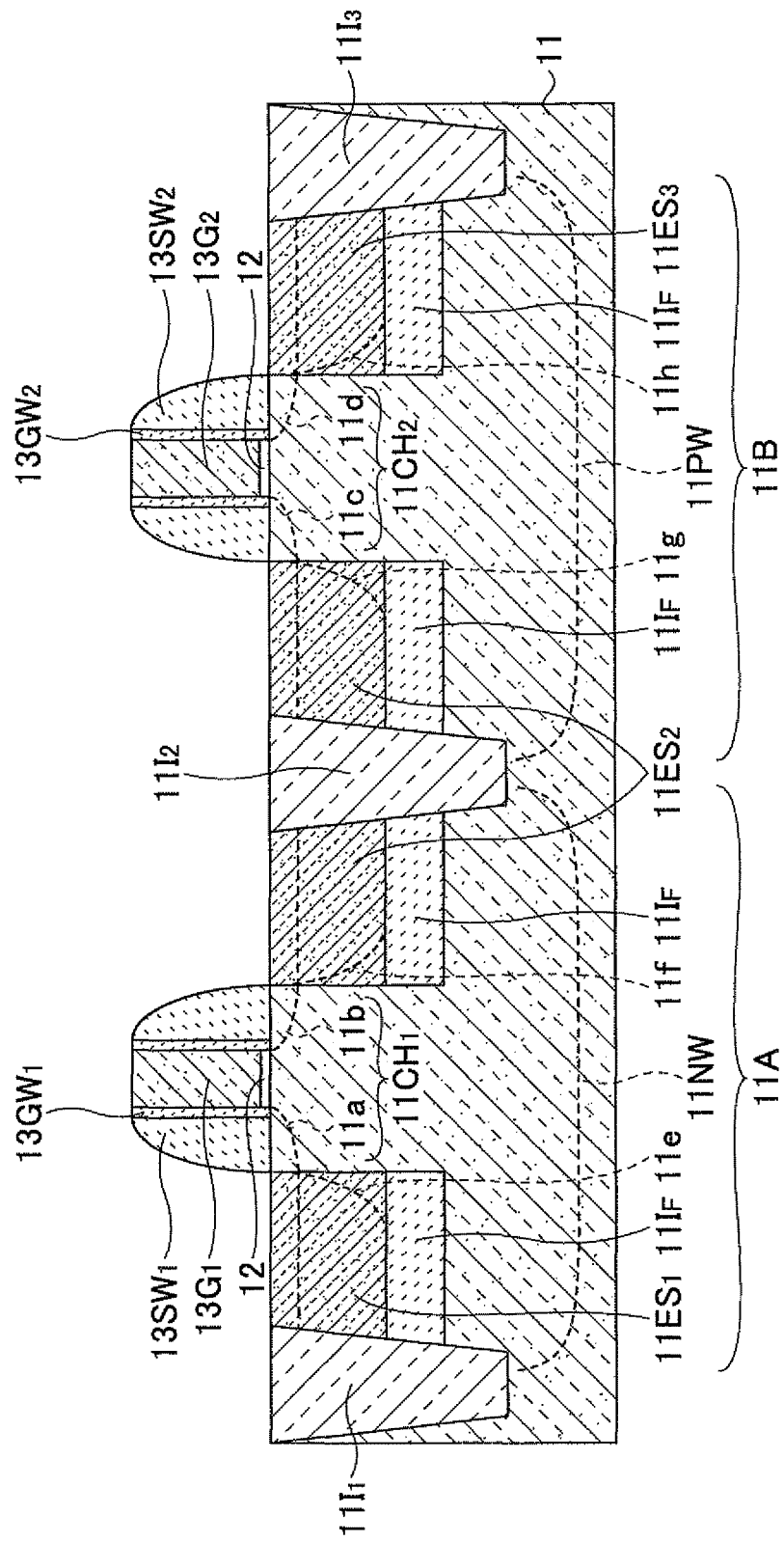

Next, in the step of FIG. 1L, As is introduced by an ion implantation process under the acceleration energy of 40 keV or less with a dose in the range of $5\times10^{14}$ cm$^{-2}$-$2\times10^{16}$ cm$^{-2}$, preferably under the acceleration energy of 30 keV and the dose of $2\times10^{15}$ cm$^{-2}$. Here, any tilt angle may be used and the injection may be conducted with one or more twist directions. Further, one or more of As or P may be injected as the injection species. With this, there are formed a source region 11g and a drain region 11h of n$^+$-type in the device region 11B in correspondence to the respective outer regions of the gate electrode $13G_2$ with respect to the sidewall insulation films $13SW_2$.

Next, in the step of FIG. 1L, the resist pattern is removed, and B is introduced into the device region 11A under the acceleration energy of 7 keV or less and the dose of $5\times10^{14}$ cm$^{-2}$-$2\times10^{16}$ cm$^{-2}$, preferably under the acceleration energy of 5 keV and the dose of $2\times10^{15}$ cm$^{-2}$ while protecting the device region 11B by a resist pattern. In this process, the tilt angle may be chosen arbitrary and the injection may be conducted with one or more twist directions. Further, it is possible to use B or one or more B molecules or ions such as $BF_2$, $B_{10}H_x$ for the ion implantation species. With this, there are formed a source region 11e and a drain region 11f of p$^+$-type in the device region 11A in correspondence to the respective outer regions of the sidewall insulation films $13SW_1$ of the gate electrode $13G_1$.

Figure 1M:
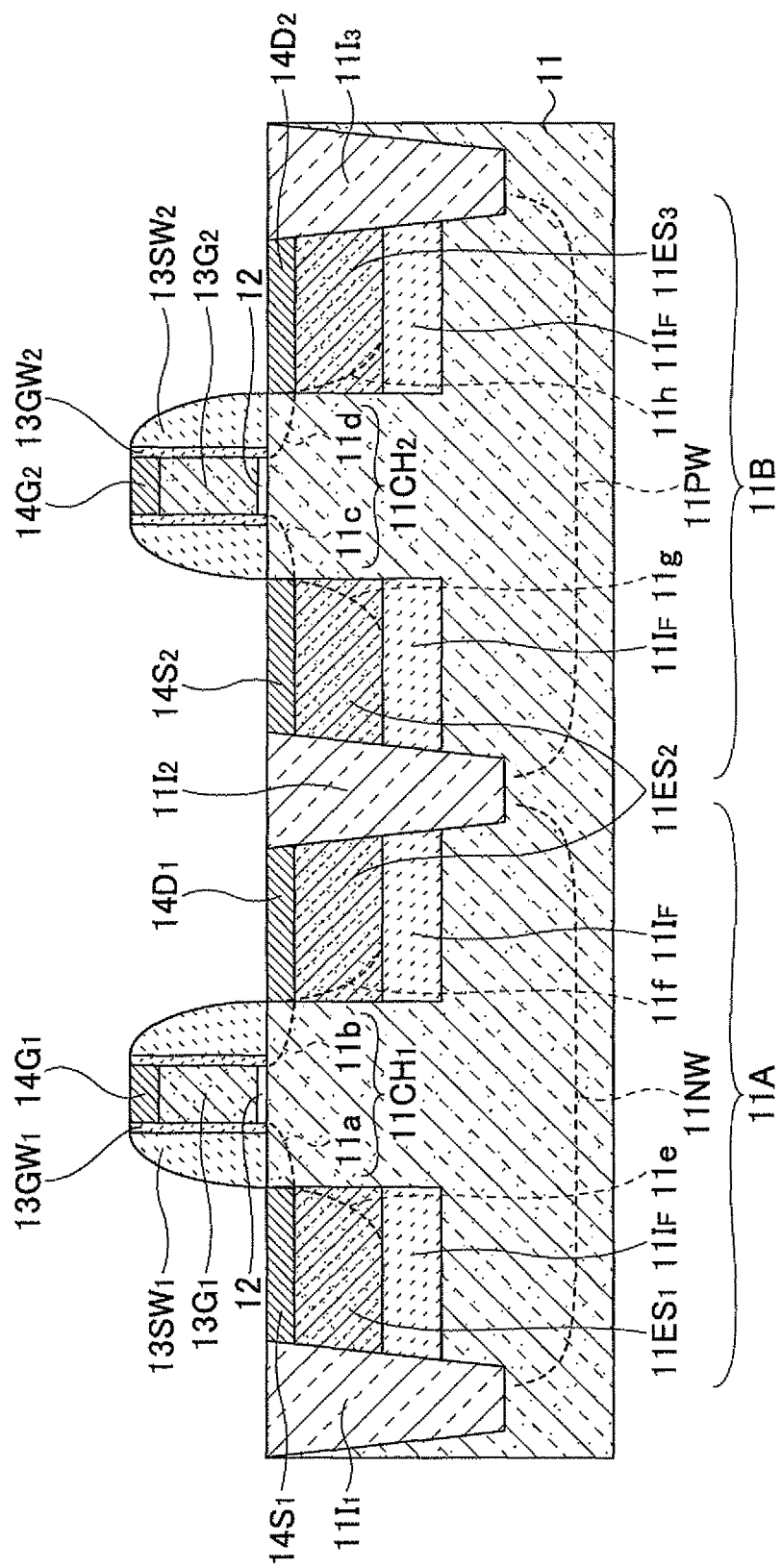

Further, in the step of FIG. 1M, a metal film of Ni or Co, for example, is deposited on the structure of FIG. 1L and a salicide process is conducted by applying a rapid annealing process thereto. As a result, there are formed: a silicide layer $14S_1$ of NiSi, or the like, on the surface of the source region 11e, a similar silicide layer $14D_1$ on the surface of the drain region 11f; a similar silicide layer $14S_2$ on the surface of the source region 11g; a similar silicide layer $14D_2$ on the surface of the drain region 11h; and similar silicide layer $14G_1$ and $14G_2$ respectively on the surface of the polysilicon gate electrodes $13G_1$ and $13G_2$.

Further, in the step of FIG. 1N, an interlayer insulation film 15 is formed over the structure of FIG. 1M so as to cover the gate electrode $13G_1$ and the sidewall surfaces $13SW_1$ in the device region 11A and so as to cover the gate electrode $13G_2$ and the sidewall surfaces $13SW_2$ in the device region 11B, by a plasma CVD process that uses TEOS for the source material. Further, the interlayer insulation film 15 is formed with via-holes 15A-15D in the step of FIG. 1O to expose the silicide layers $14S_1$, $14D_1$, $14S_2$ and $14D_2$, respectively.

Figure 1P:
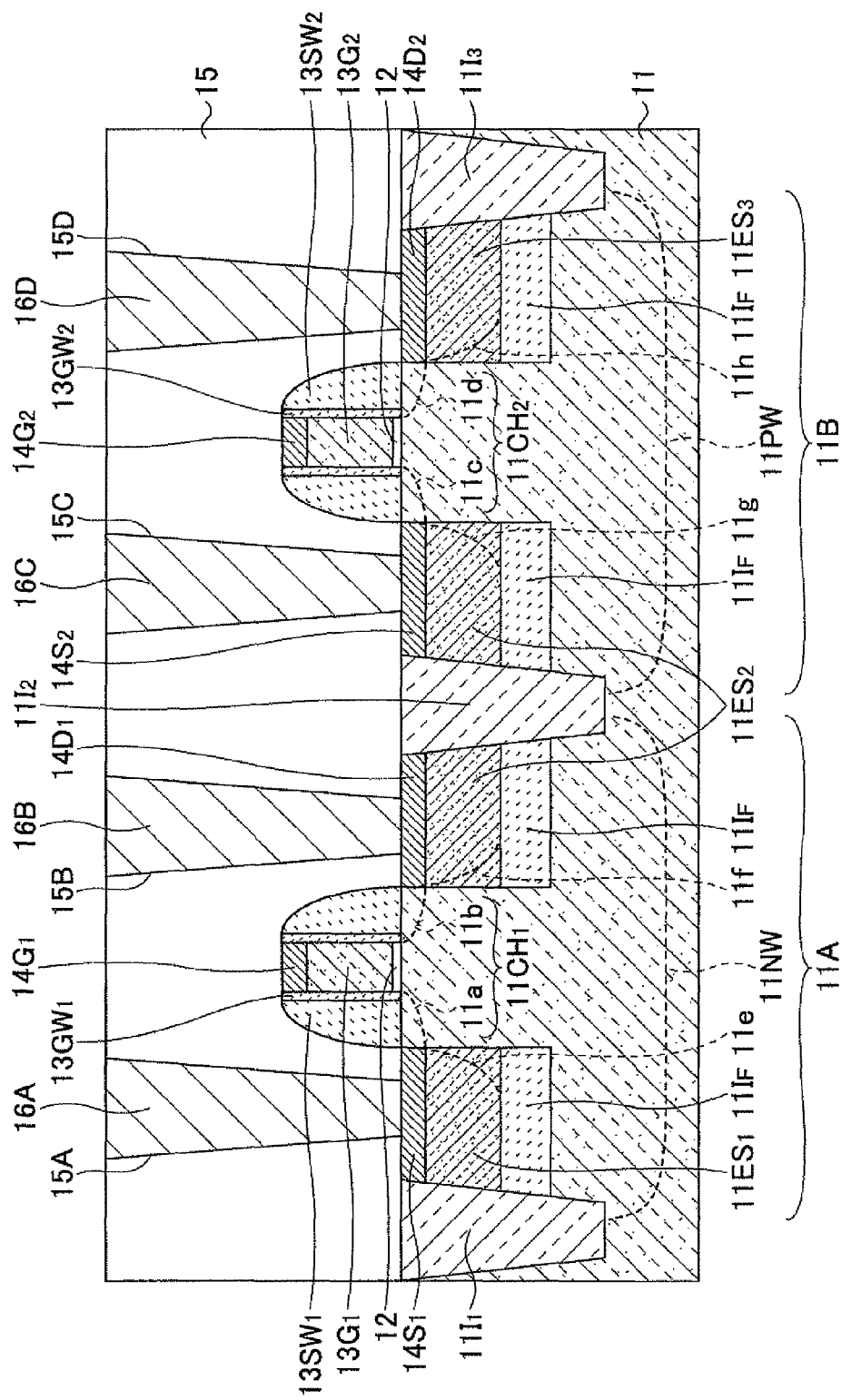

Further, in the step of FIG. 1P, there are formed via-plugs 16A-16D of W (tungsten) or Cu (copper) respectively in the via-holes 15A-15D, together with any necessary barrier films such as TaN or TiN not illustrated. Next, the tungsten film and the barrier metal film are polished by a CMP process until the surface of the interlayer insulation film is exposed. Further, with the formation of necessary interconnection layer, the semiconductor device according to the present embodiment is fabricated.

According to the present embodiment, it should be noted that the gate insulation film 12 and the gate electrodes $13G_1$ and $13G_2$ are formed on a flat surface of a bulk silicon substrate 11 not applied with processing such as etching, in spite of the fact that the p-channel MOS transistor and the n-channel MOS transistor have respective buried insulation films $11I_F$ locally underneath the source region 11e or 11g and underneath the drain region 11f or 11h. Because of this, flatness is guaranteed for the channel region located right underneath the gate electrode, and no defects are introduced into the channel region. Thus, according to the preferred embodiment, it becomes possible to use the bulk silicon substrate 11 of original, high crystal quality, for the channel region, and as a result, the operational characteristics of the MOS transistor are improved. Further, variation of the device characteristics is reduced.

In the present embodiment, it should be noted that it is also possible to use a silicon epitaxial layer doped with B to a concentration of $1\times10^{18}$ cm$^{-3}$ or more for the SiGe mixed crystal layers $11SG_1$-$11SG_3$ as will be explained with reference to FIG. 10.

Further, it is also possible to use a silicon nitride (SiN) film pattern or silicon oxynitride (SiON) film pattern in the present embodiment in place of the oxide film patterns $11Ox_1$ and $11Ox_2$.

[Second Embodiment]

Next, the fabrication process of a MOS transistor according to a second embodiment will be explained with reference to FIGS. 5A-5S.

Referring to FIG. 5A, the present embodiment first forms device isolation regions $31I_1$-$31I_3$ of STI structure on a silicon substrate 31 of monocrystalline bulk silicon so as to define a device region 31A of a p-channel MOS transistor and a device region 31B of an n-channel MOS transistor that are to be fabricated.

Figure 5B:
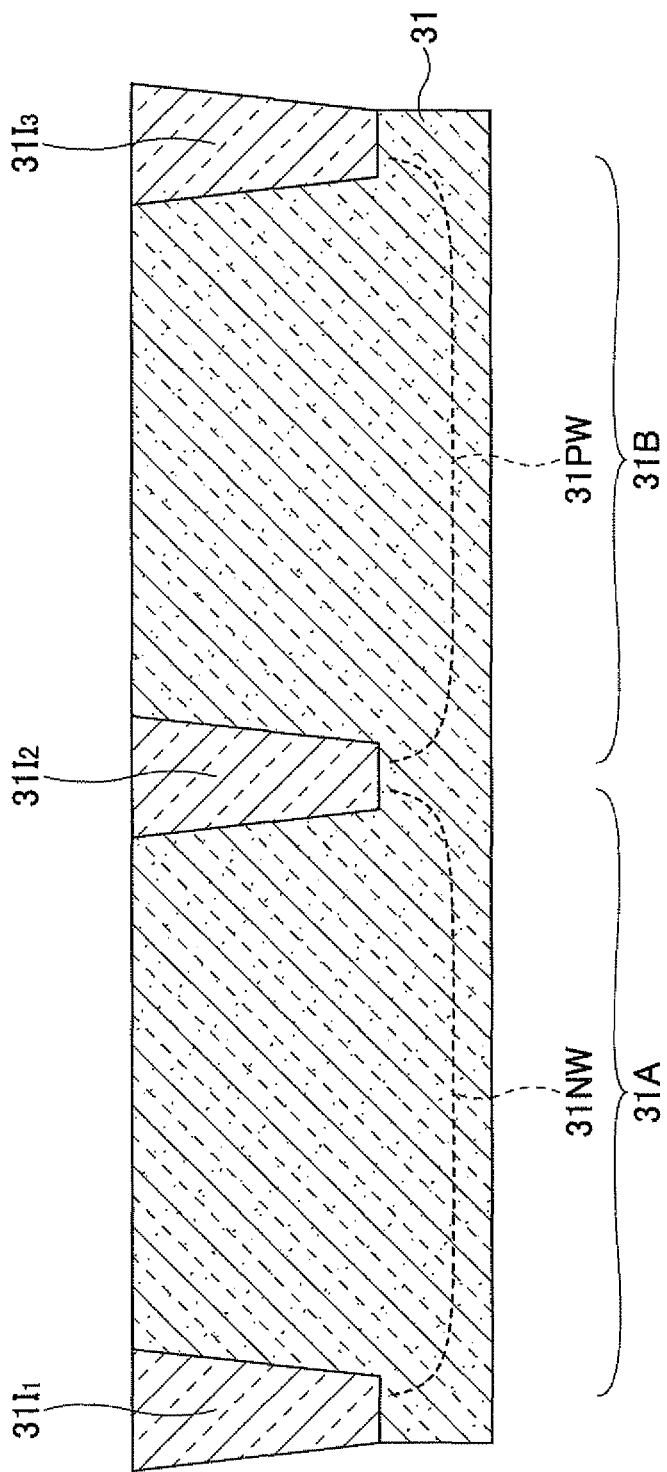
FIGS. 5A-5S are diagrams representing the process of fabricating a semiconductor device according to a second embodiment.

Next, in the step of FIG. 5B, the device region 31A is protected by a resist pattern and a p-type well 11PW is formed by introducing B (boron) into the device region 31B under the acceleration energy of 300 keV or less and a dose of $5\times10^{13}$ cm$^{-2}$, preferably under the acceleration energy of 150 keV and the dose of $3\times10^{13}$ cm$^{-2}$. The ion implantation may be conducted, under an arbitrary tilt angle (Tilt) and with one or more incident directions (Twist). Further, it is possible to use one or more species such as $BF_2$ or In, in addition to B.

Thereby, the device region 11B of the silicon substrate may be applied with a channel stop injection by introducing B (boron) for example under the acceleration energy of 150 keV or less and the dose of $1\times10^{13}$ cm$^{-2}$ or less, preferably under the acceleration voltage of 30 keV and the dose of $5\times10^{12}$ cm$^2$. In this channel stop injection, the ion implantation may be conducted under an arbitrary tilt angle and can be conducted with one or more twist directions. Further, it is possible to use one or more species such as $BF_2$ or In, in addition to B.

Next, ion implantation for threshold control is conducted for the n-channel MOS transistor. For example, B may be introduced under the acceleration voltage of 40 keV or less and the dose of $3\times10^{13}$ cm$^{-2}$ or less, preferably under the acceleration energy of 20 keV and the dose of $1\times10^{13}$ cm$^{-2}$. In this ion implantation process, the tilt angle may be chosen arbitrary and the injection may be conducted with one or more twist directions. Further, it is possible to use other B molecules or ions such as $BF_2$, $B_{10}H_x$, in addition to B.

Next, in the step of FIG. 5B, the resist pattern is removed from the device region 31A, and the device region 11B is covered by a resist pattern. Further, P (phosphorus) is introduced into the device region 11A under the acceleration energy of 600 keV or less and the dose of $5 \times 10^{13}$ cm$^{-2}$ or less, preferably under the acceleration energy of 350 keV or less and the dose of $3 \times 10^{13}$ cm$^{-2}$ to form an n-type well 11NW. This ion implantation may be conducted under an arbitrary tilt angle and with more than one twist direction. Further, it is possible to use one or more species such as As or Sb, in addition to P.

Thereby, the device region 11A of the silicon substrate 11 may be applied with a channel stop injection by introducing As (arsenic) for example under the acceleration energy of 300 keV or less and the dose of $1 \times 10^{13}$ cm$^{-2}$ or less, preferably under the acceleration voltage of 100 keV and the dose of $5 \times 10^{12}$ cm$^{-2}$. This ion implantation may be conducted under an arbitrary tilt angle and with more than one twist direction. Further, it is possible to use one or more species such as As or Sb, in addition to P.

Next, ion implantation for threshold control is conducted for the p-channel MOS transistor. For example, As may be introduced under the acceleration voltage of 200 keV or less and the dose of $3 \times 10^{13}$ cm$^{-2}$ or less, preferably under the acceleration energy of 130 keV and the dose of $3 \times 10^{13}$ cm$^{-2}$. This ion implantation may be conducted under an arbitrary tilt angle and with more than one twist direction. Further, it is possible to use one or more species such as P, As or Sb for the ionic species.

Further, in the step of FIG. 5B, the resist pattern covering the device region 31B is removed by an ashing process or a wet process that uses SPM, or the like, and a spike annealing process is applied to the silicon substrate 31 for example at an anneal temperature of 1000° C. and for a duration of about 10 seconds. With this, the impurity elements such as B, P, As, or the like introduced into the silicon substrate 31 are activated.

Figure 5C:
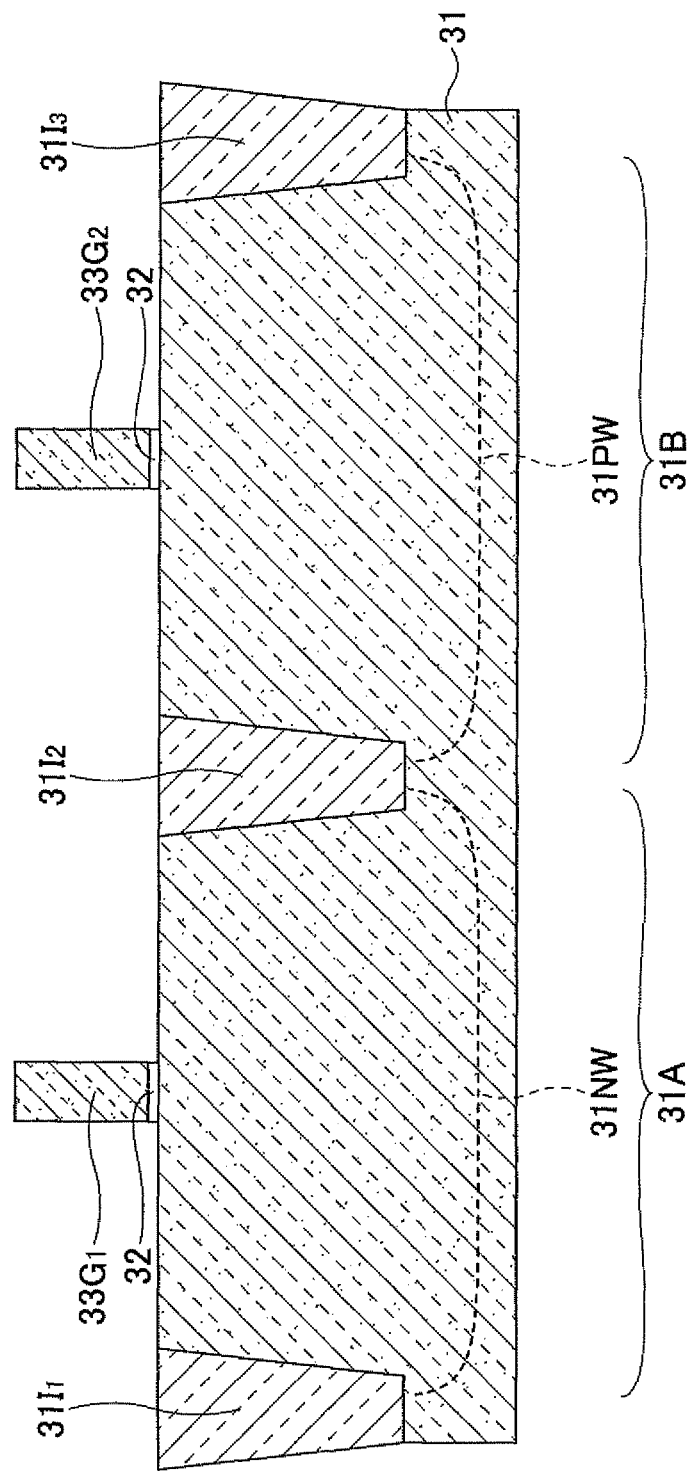

Next, in the step of FIG. 5C, an oxide film is formed on the silicon substrate 31 by conducting a dry oxidation process at a substrate temperature of about 900° C., for example, with a film thickness of about 1 nm, and the oxide film thus formed is then subjected to a plasma nitridation process in an NO ambient. With this, there is formed an oxynitride film 32 on the surface of the silicon substrate 31 as the gate insulation film of the p-channel MOS transistor and the n-channel MOS transistor. It should be noted that the oxynitride film 32 may be formed also by conducting a plasma nitridation process in an ambient of $N_2O$ or $NH_3$.

Further, in the present embodiment, the gate oxide film of the p-channel MOS transistor or the re-channel MOS transistor is not limited to an oxynitride film but may be a high-K dielectric film such as an $HfO_2$ film or $HfSiO_4$ film. Further, by using different resist processes in the device region 31A and the device region 31B, it is also possible to form the gate insulation films to have different film thicknesses or to be formed of different film species between the device region 31A and the device region 31B.

Next, in the step of FIG. 5C, a polysilicon film (not illustrated) is formed on the insulation film thus formed for the gate insulation film of the p-channel MOS transistor and the n-channel MOS transistor, by an LPCVD (low pressure chemical vapor deposition) process with a thickness of about 100 nm at a substrate temperature of about 600° C. Further, a resist pattern is formed on the polysilicon film so as to cover the device region 31A and a part of the polysilicon film corresponding to the device region 31B is doped to n-type by subjecting to an ion implantation process of an n-type impurity element. For example, P (phosphorus) is introduced under the acceleration energy of 30 keV or less and a dose of $2 \times 10^{15}$ cm$^{-2}$-$2 \times 10^{16}$ cm$^{-2}$, preferably under the acceleration energy of 20 keV and the dose of $5 \times 10^{15}$ cm$^{-2}$. This ion implantation may be conducted under an arbitrary tilt angle and with more than one twist direction. Further, it is possible to use one or more species such as P or As. Further, for the purpose of pre-amorphous processing, Ge or Si may be injected in advance. Thereafter, the resist pattern covering the part of the polysilicon film corresponding to the device region 31A is removed.

Further, in the step of FIG. 5C, a resist pattern is formed on the polysilicon film so as to cover the device region 31B and a part of the polysilicon film corresponding to the device region 31A is doped to p-type by subjecting to an ion implantation process of a p-type impurity element. For example, this ion implantation process may be conducted by introducing B (boron) under the acceleration energy of 7 keV or less and a dose of $2 \times 10^{15}$ cm$^{-2}$-$2 \times 10^{16}$ cm$^{-2}$, preferably under the acceleration energy of 5 keV and the dose of $5 \times 10^{15}$ cm$^{-2}$. In this ion implantation process, the tilt angle may be chosen arbitrary and the injection may be conducted with one or more twist directions. Further, it is possible to use other B molecules or ions such as B, $BF_2$, $B_{10}H_x$, or the like, for the ion implantation species. Further, for the purpose of pre-amorphous processing, Ge or Si may be injected in advance. Further, by conducting an ashing process or a wet processing by using SPM, or the like, the resist pattern is removed from the part of the polysilicon film corresponding to the device region 31B.

Further, in order to facilitate the diffusion of the n-type impurity element and the p-type impurity element thus introduced into the polysilicon film, it is also possible to apply a spike annealing process under a condition such as the thermal annealing temperature of 1000° C. and the duration of about 5 seconds, for example.

Further, in the step of FIG. 5C, the polysilicon film is patterned by an anisotropic etching process, and with this, a gate electrode pattern $33G_1$ and a gate electrode pattern $33G_2$ are formed respectively in the device regions 31A and 31B via the respective gate insulation films 32.

In the step of FIG. 5C, it is possible to form an amorphous silicon film in place of the polysilicon film. In this case, the gate electrodes $31G_1$ and $31G_2$ are formed of an amorphous pattern.

Next, in the step of FIG. 5D, sidewall spacers $33GW_1$ and $33GW_2$ are formed on the respective sidewall surface of the gate electrode patterns $33G_1$ and $33G_2$ similarly to the case of the sidewall spacers $13GW_1$ and $13GW_2$ of the previous embodiment, and pocket injection and extension injection are conducted into the device region 31B while protecting the device region 31A of the silicon substrate 31 by a photoresist and using the gate electrode pattern $13G_1$ and the sidewall spacers $13GW_2$ as a mask. With this, a pocket injection region of p-type (not illustrated) and n-type source/drain extension regions 31c and 31d are formed similarly to the case of the pocket injection region and the source/drain extension regions 11c and 11d of the previous embodiment.

Further, in the step of FIG. 5D, an n-type pocket injection region and p-type source/drain extension regions 31a and 31b are formed in the device region 31A on the silicon substrate 31 similarly to the n-type pocket injection region and the p-type source/drain extension regions 11a and 11b of the previous embodiment.

Figure 5E:
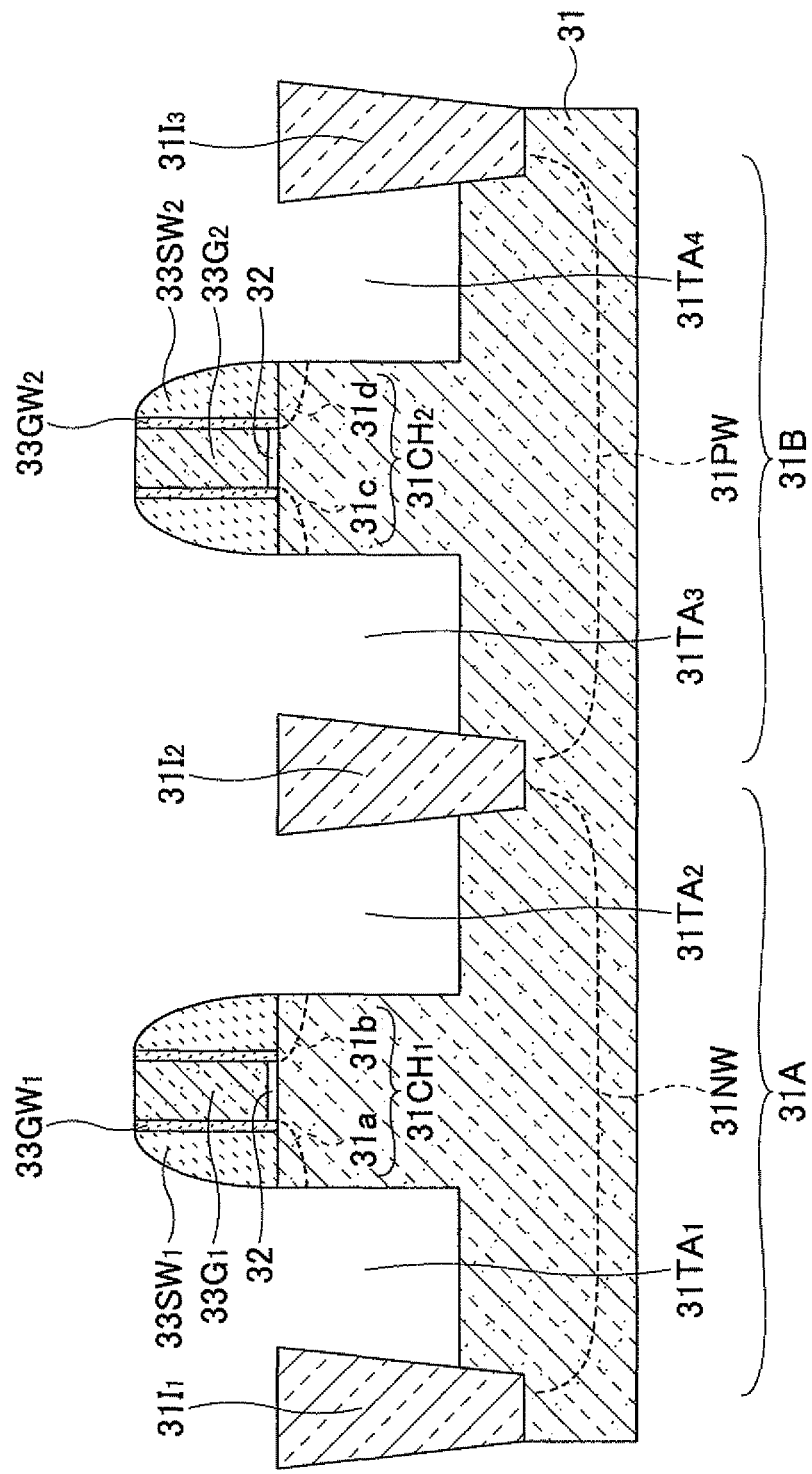

Next, in the step of FIG. 5E, sidewall insulation films $33SW_1$ and $33SW_2$ are formed on the gate electrode patterns $33G_1$ and $33G_2$ of FIG. 5D via respective sidewall spacers $22GW_1$ and $33GW_2$ similarly to the sidewall insulation films $13SW_1$ and $13SW_2$.

Further, in the step of FIG. 5E, a dry etching process is conducted by using $Cl_2$ or HCl as an etching gas similarly to the step of FIG. 1B while using the sidewall insulation films $33SW_1$-$33SW_2$ as a mask, and as a result, there are formed trenches $31TA_1$ and $31TA_2$ at the respective outer sides of a substrate portion $33CH_1$ in the device region 31A with a depth of 40 nm-150 nm, wherein it should be noted that the substrate portion $33CH_1$ includes the channel region of the p-channel transistor to be formed and is covered with the sidewall insulation films $33GW_1$ and the gate electrode pattern $33G_1$. Further, in the step of FIG. 5E, there are formed trenches $31TA_3$ and $31TA_4$ in the device region 31B of the silicon substrate 31 at the outer sides of the substrate portion $31CH_2$ with a depth of 40 nm-50 nm, wherein it should be noted that the substrate portion $31CH_2$ includes the channel region of the n-channel transistor to be formed and is covered with the gate electrode pattern $33G_2$ and the sidewall insulation films $33GW_2$.

While not illustrated, it should be noted that there are formed mask patterns similar to the sidewall insulation films $33SW_1$ and $33SW_2$ on the gate electrode patterns $33G_1$ and $33G_2$ in the step of FIG. 5E for preventing etching of the gate electrode patterns $33G_1$ and $33G_2$. These mask patterns are removed for example in the step of FIG. 5I to be explained later.

Figure 5F:
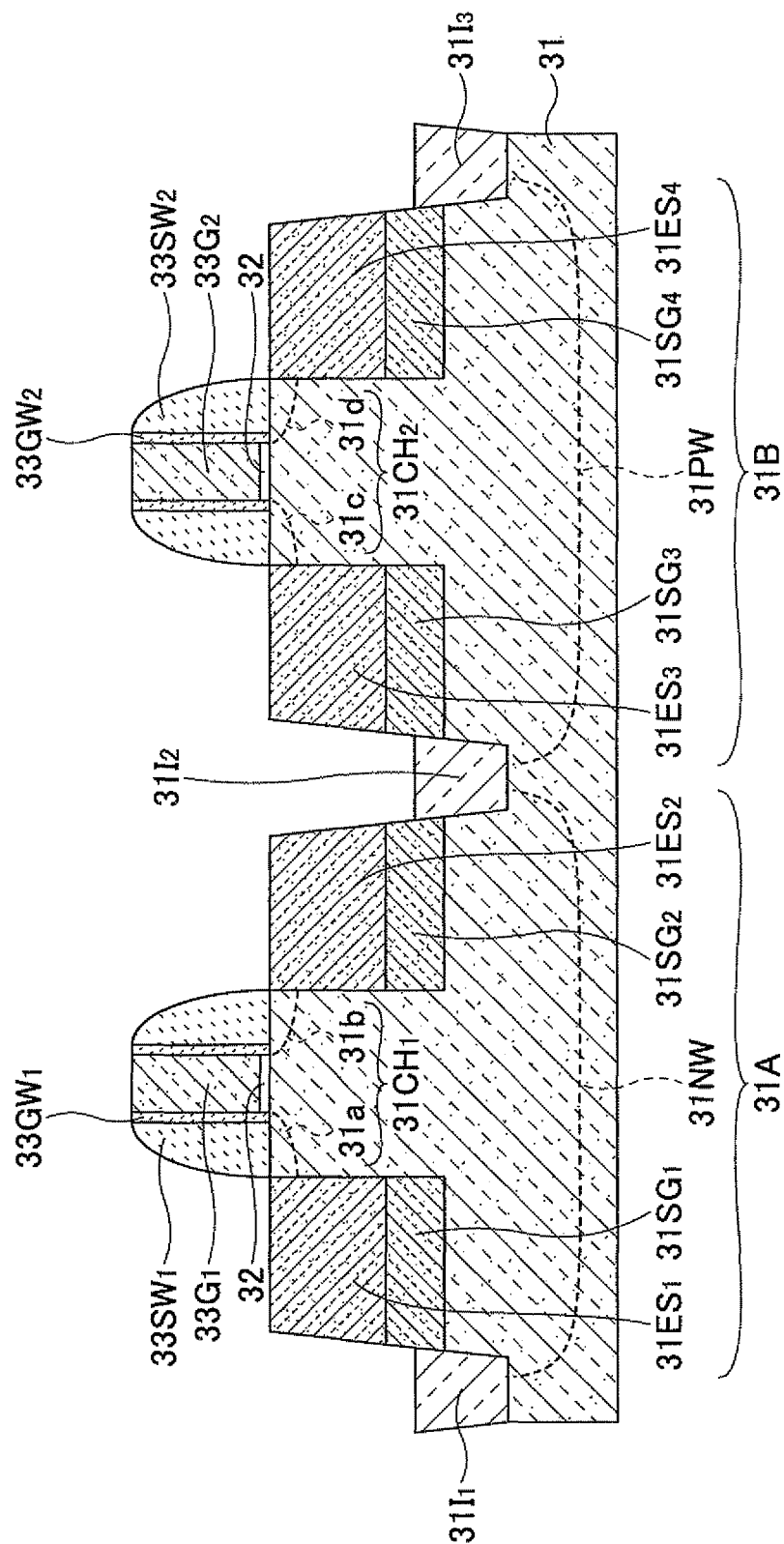

Next, in the step of FIG. 5F, there are formed SiGe mixed crystal layers $31SG_1$, $31SG_2$, $31SG_3$ and $31SG_4$ in the trenches $31TA_1$-$31TA_4$ epitaxially similarly to the case of the previous embodiment, and the trenches $31TA_1$-$31TA_4$ are filled by forming thereon the silicon epitaxial layers $31ES_1$, $31ES_2$, $31ES_3$ and $31ES_4$ respectively.

For example, the SiGe mixed crystal layers $31SG_1$, $31SG_2$, $31SG_3$ and $31SG_4$ are formed with a thickness of 20 nm-80 nm by a CVD process that uses a mixed gas of dichlorosilane, monogermane, hydrogen chloride and hydrogen and conducted under the condition similar to that of the previous embodiment. Further, the silicon epitaxial layers $31ES_1$, $31ES_2$, $31ES_3$ and $31ES_4$ are formed respectively on the SiGe mixed crystal layers $31SG_1$, $31SG_2$, $31SG_3$ and $31SG_4$ with a thickness of 20 nm-70 nm by a CVD process that uses a mixed gas of dichlorosilane, hydrogen chloride and hydrogen and conducted under the condition similar to that of the previous embodiment.

Figure 6A:
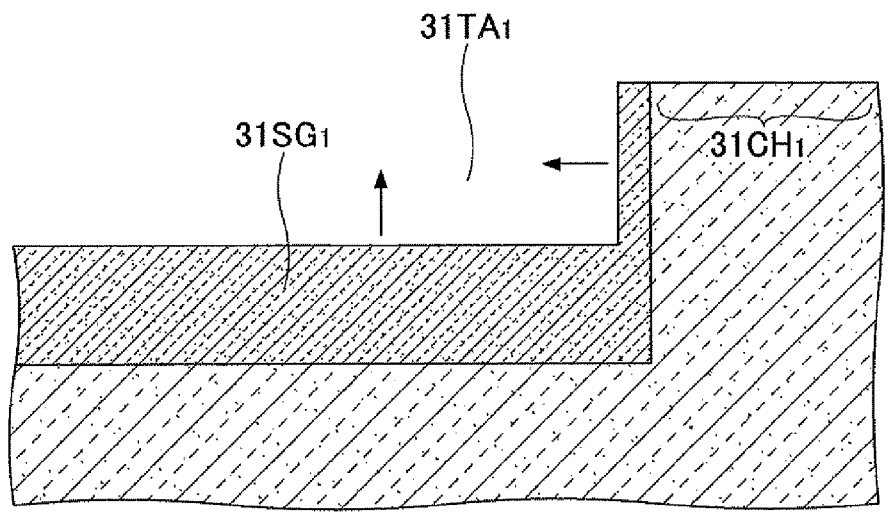
FIGS. 6A and 6B are first diagrams representing the formation step of the SiGe mixed crystal layer of FIG. 5F in detail.
Figure 6B:
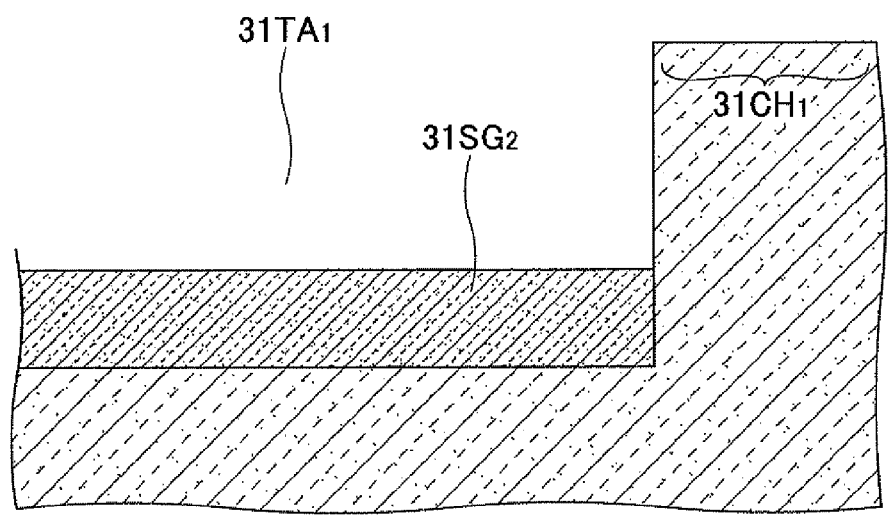

In the transitional process from the step of FIG. 5E to the step of FIG. 5F, it should be noted that formation of the SiGe mixed crystal layers $31SG_1$, $31SG_2$, $31SG_3$ and $31SG_4$ may take place not only on the bottom surface of the trenches $31TA_1$-$31TA_4$ but also on the sidewall surfaces defining the substrate portions $31CH_1$ and $31CH_2$ as represented in FIG. 6A. Even when this occurs, the SiGe mixed crystal layer grown on such a sidewall surface has a film thickness much smaller than the film thickness of the SiGe mixed crystal layer grown on the bottom surface, and the SiGe mixed crystal layers thus grown on the sidewall surfaces can be easily removed by applying a dry or wet etching working isotropically or obliquely to the wall surface as represented in FIG. 6B. With this, it becomes possible for the silicon epitaxial layers $31ES_1$, $31ES_2$, $31ES_3$ and $31ES_4$ grown respectively on the SiGe mixed crystal layers $31SG_1$, $31SG_2$, $31SG_3$ and $31SG_4$ to attain lattice matching with the silicon substrate 31 constituting the substrate portions $31CH_1$ and $31CH_2$ at the sidewall surfaces of the trenches $31TA_1$-$31TA_4$.

Meanwhile, it is also possible to expose the crystal surface such as the (100) surface, or the like, on the sidewall surface of the substrate portions $31CH_1$ and $31CH_2$ by conducting a wet etching process after the dry etching process at the time of formation of the step of FIG. 5E for forming the trenches $31TA_1$-$31TA_4$.

In the step of FIG. 5F, there is further applied a wet etching process that uses hydrofluoric acid for example or a dry etching process working on a silicon oxide film to cause a recession in the device isolation film constituting the device isolation structures $31I_1$-$31I_3$ for causing exposure of the sidewall surfaces of the SiGe mixed crystal layers $31SG_1$, $31SG_2$, $31SG_3$ and $31SG_4$.

Further, it is also possible, in the step of FIG. 5F, to cause the recession in the device isolation insulation film constituting the device isolation structures $31I_1$-$31I_3$ in advance and carry out the epitaxial growth of the SiGe mixed crystal layers $31SG_1$, $31SG_2$, $31SG_3$ and $31SG_4$ and further the epitaxial growth of the silicon epitaxial layers $31ES_1$, $31ES_2$, $31ES_3$ and $31ES_4$ thereafter.

Because the SiGe mixed crystal layers $31SG_1$, $31SG_2$, $31SG_3$ and $31SG_4$ or the silicon epitaxial layers $31ES_1$, $31ES_2$, $31ES_3$ and $31ES_4$ exhibit a tendency to cause growth by forming facets having larger crystal indices than that of the (100) surface such as the (111) crystal surface or the (311) crystal surface, there occurs no such a growth in which the SiGe mixed crystal layers $31SG_1$, $31SG_2$, $31SG_3$ and $31SG_4$ or the silicon epitaxial layers $31ES_1$, $31ES_2$, $31ES_3$ and $31ES_4$ are formed to extend over the device isolation regions $31I_1$-$31I_3$ even when the device isolation insulation films constituting the device isolation structures $31I_1$-$31I_3$ are receded.

In the structure obtained in the step of FIG. 5F, it should be noted that the sidewall surface of the SiGe mixed crystal layers $31SG_1$-$31SG_4$ or the sidewall surface of the silicon epitaxial layers $31ES_1$-$31ES_4$ is formed of a single crystal surface or a plurality of crystal surfaces.

Next, in the step of FIG. 5G, the SiGe mixed crystal layers $31SG_1$, $31SG_2$, $31SG_3$ and $31SG_4$ are etched selectively with regard to the silicon substrate 31 and further to the silicon epitaxial layers $31ES_1$, $31ES_2$, $31ES_3$ and $31ES_4$ by a dry etching process that uses a mixed gas of chlorine ($Cl_2$) and hydrogen or a hydrogen chloride gas or a wet etching process that uses a mixture of fluoric acid, nitric acid or ascetic acid, and with this, there are formed voids $31V_1$-$31V_4$ in the silicon substrate 31 respectively in correspondence to the regions where the SiGe mixed crystal layers $31SG_1$, $31SG_2$, $31SG_3$ and $31SG_4$ were formed.

In the step of FIG. 5G, it should be noted that the silicon epitaxial layers $31ES_1$ and $31ES_2$ attain an epitaxial lattice matching to the substrate portion $31CH_1$ while the silicon epitaxial layers $31ES_3$ and $31ES_4$ attain an epitaxial lattice matching to the substrate portion $31CH_2$. Thus, these parts do not come off and fall from the substrate portion $31CH_1$ or from the substrate portion $31CH_2$ even after the SiGe mixed crystal layers $31SG_1$, $31SG_2$, $31SG_3$ and $31SG_4$ are selectively removed.

Further, in the case of conducting the etching process of FIG. 5G by a dry etching process, it becomes possible to carry out the film formation process of the SiGe mixed crystal layers $31SG_1$-$31SG_4$, the film formation process of the silicon epitaxial layers $31ES_1$-$31ES_4$ and further the selective etching process of FIG. 5G continuously in the same processing apparatus without taking out the wafer therefrom during the processing, provided that the etching of FIG. 5F of causing recession in the device isolation insulation films $31I_1$-$31I_3$ is conducted previously to the film formation process of the SiGe mixed crystal layers $31SG_1$-$31SG_4$ and hence previously to the film formation process of the silicon epitaxial layers $31ES_1$-$31ES_4$.

In the present embodiment, too, a SiGe mixed crystal containing Ge with an atomic fraction of about 20% is used for the SiGe mixed crystal layers $31SG_1$, $31SG_2$, $31SG_3$ and $31SG_4$, while it is also possible to use a SiGe mixed crystal layer containing a larger amount of Ge such as about 40% as long as it is possible to carry out an epitaxial growth. From the relationship of FIG. 5 noted previously, it is possible to improve the etching selectivity in the step of the etching process of FIG. 5G by using a SiGe mixed crystal containing Ge with such a high concentration for the SiGe mixed crystal layers $31SG_1$, $31SG_2$, $31SG_3$ and $31SG_4$. Further, it is also possible to use a SiGeC mixed crystal for the SiGe mixed crystal layers $31SG_1$, $31SG_2$, $31SG_3$ and $31SG_4$ as necessary.

Figure 5H:
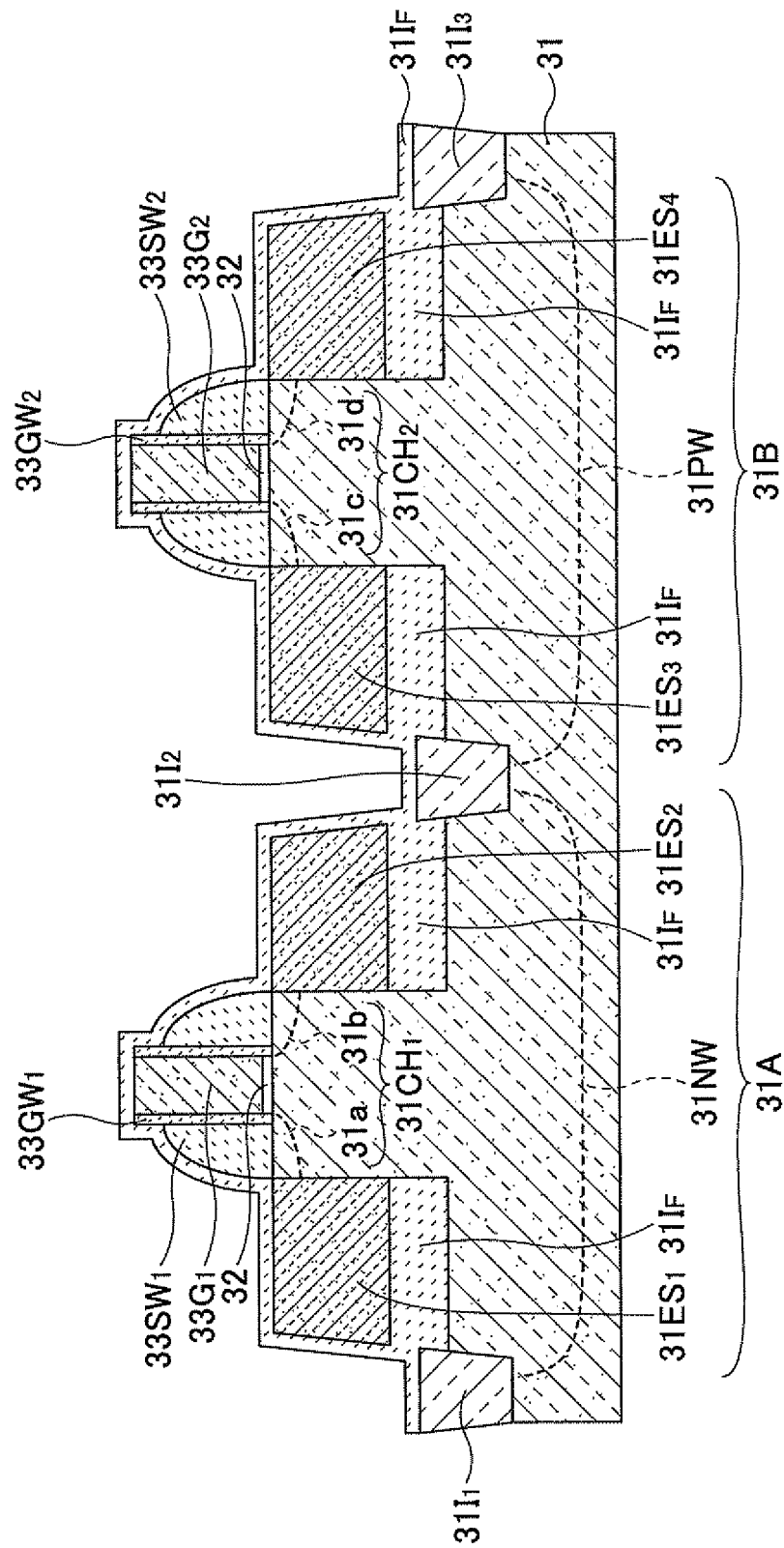

Next, in the step of FIG. 5H, a buried insulation film $31I_F$ of predominantly a silicon oxide film or silicon nitride film is formed on the structure of FIG. 5G by a film formation process providing superior step coverage, such as an ALD process, CVD process, SOG process, or the like, and the voids $31V_1$-$31V_4$ are filled with the buried insulation film $31I_F$. In the illustrated example, the buried insulation film $31I_F$ is formed by an ALD process. Such a film formation may be conducted at the temperature of 300° C.-600° C. while using tetra dimethyl amino silane (TDMAS) and ozone ($O_3$) as the source gas. For the source gases it is also possible to use BTBBAS and oxygen ($O_2$). In the present embodiment, too, it should be noted that it is not necessary to fill the voids $31V_1$-$31V_4$ completely with the buried insulation film $31I_F$. Rather, there may remain some unfilled part in a part of the buried insulation film $31I_F$.

Figure 5I:
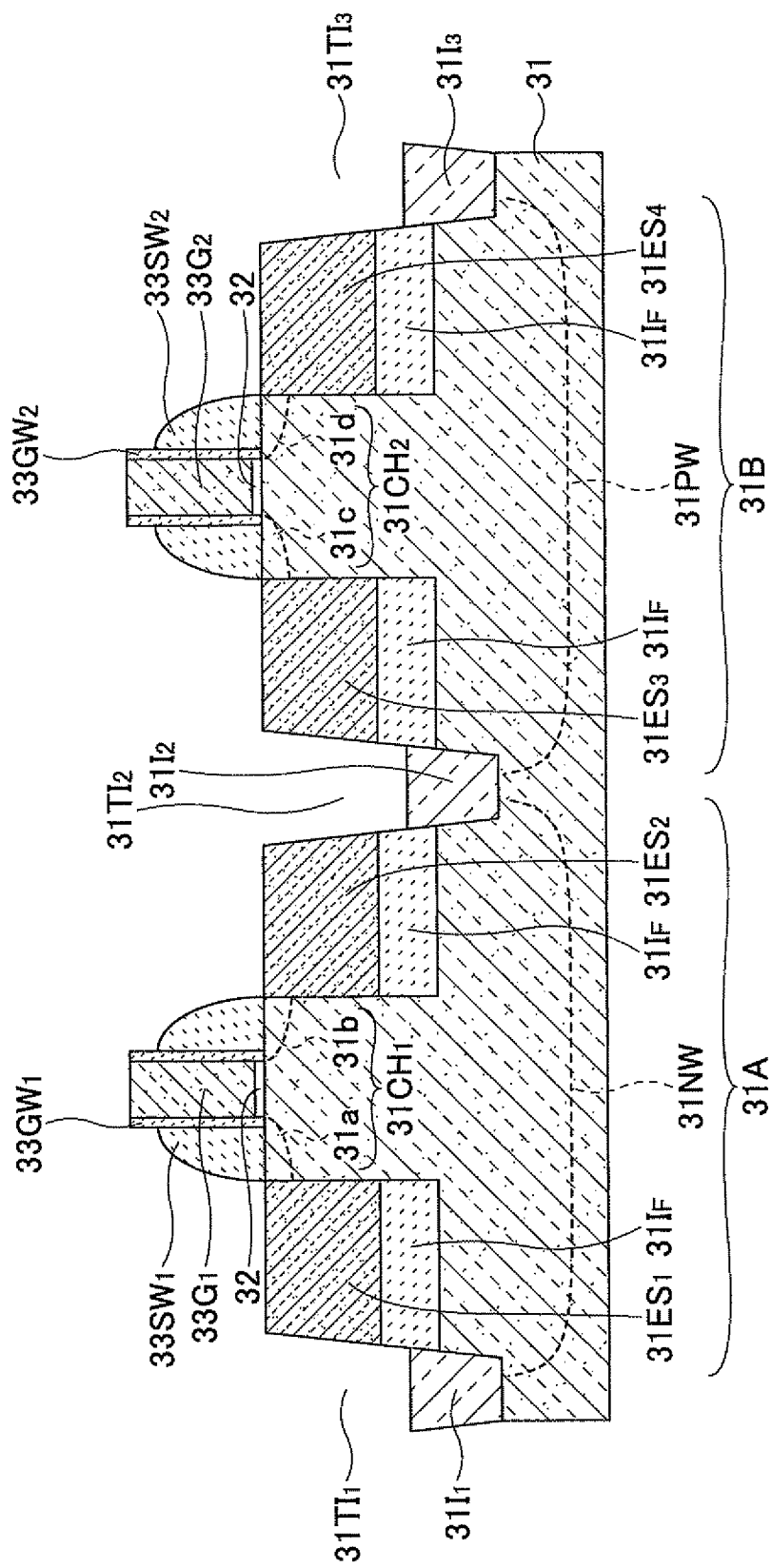

Next, in the step of FIG. 5I, a wet etching process or dry etching process is conducted to the substrate 5H, and the buried insulation film $31I_F$ is removed from the surface of the silicon epitaxial layers $31ES_1$-$31ES_4$, from the surface of the sidewall insulation films $33SG_1$, $33SW_2$ and from the exposed surfaces of the gate electrodes $33G_1$ and $33G_3$. As a result of the etching process of FIG. 5G, it should be noted that there are formed trenches $31TI_1$-$31TI_3$ in correspondence to the device isolation structures $31I_1$-$31I_3$ on the lateral wall surface of the silicon epitaxial films $31ES_1$-$31ES_4$.

Figure 5J:
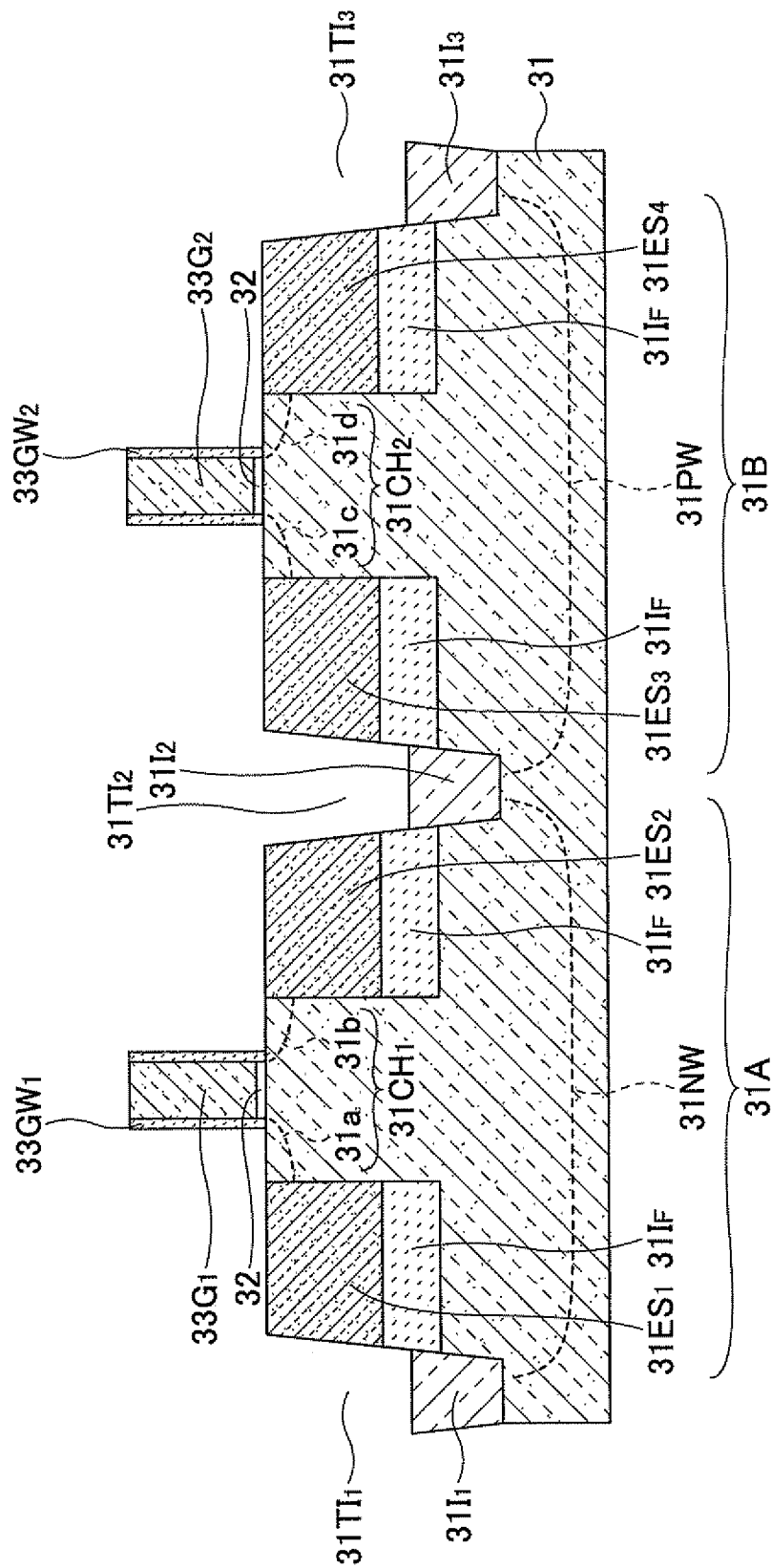

Further, in the step of FIG. 5I, the sidewall insulation films $33SW_1$ and $33SW_2$ are removed in the step of FIG. 5J in view of the fact that the sidewall insulation films $33SW_1$ and $33SW_2$ have already gone etching processes, and new sidewall insulation films are formed on the sidewall surfaces of the gate electrode $33G_1$ and $33G_2$.

Figure 5K:
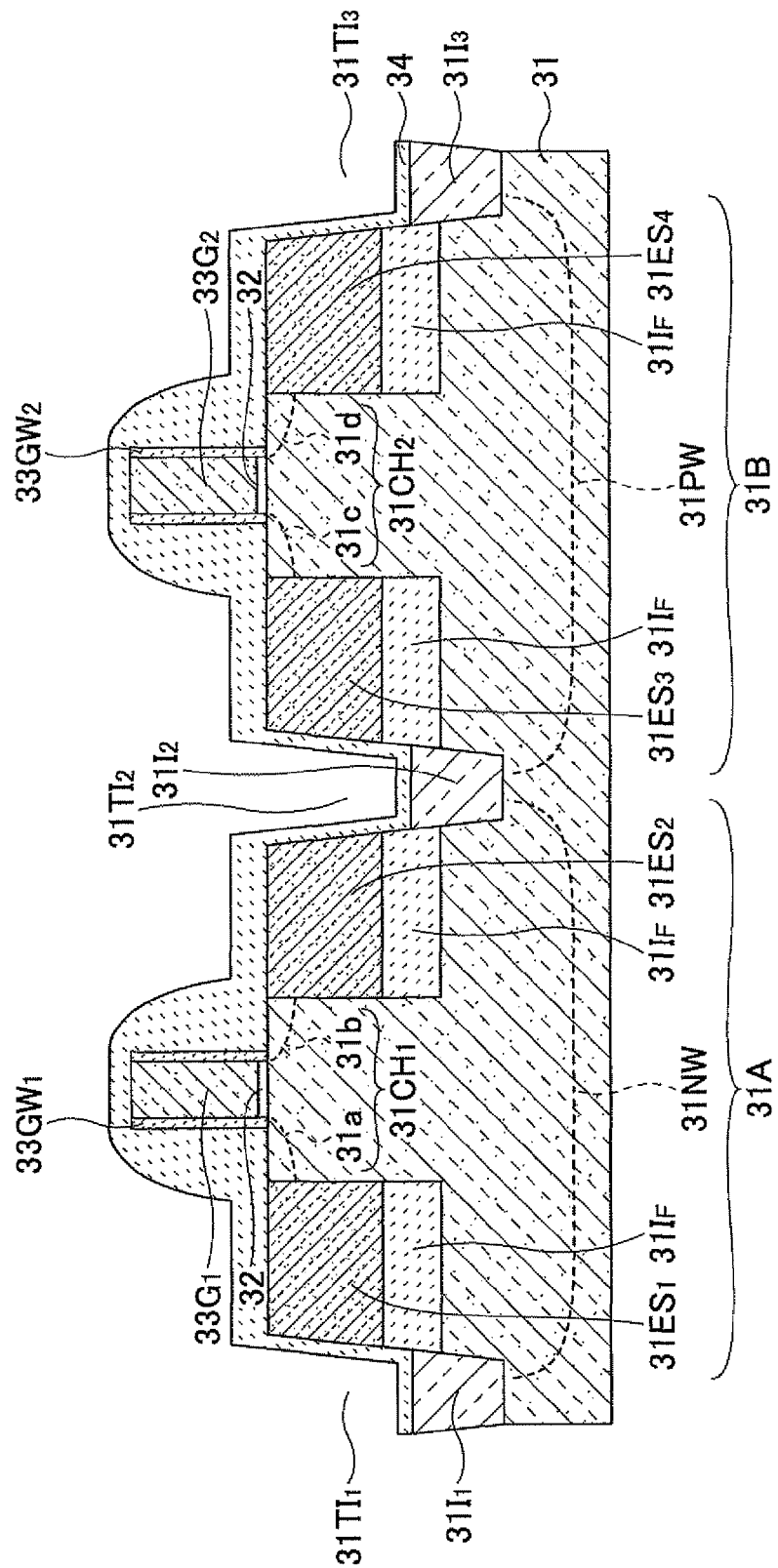
Figure 5L:
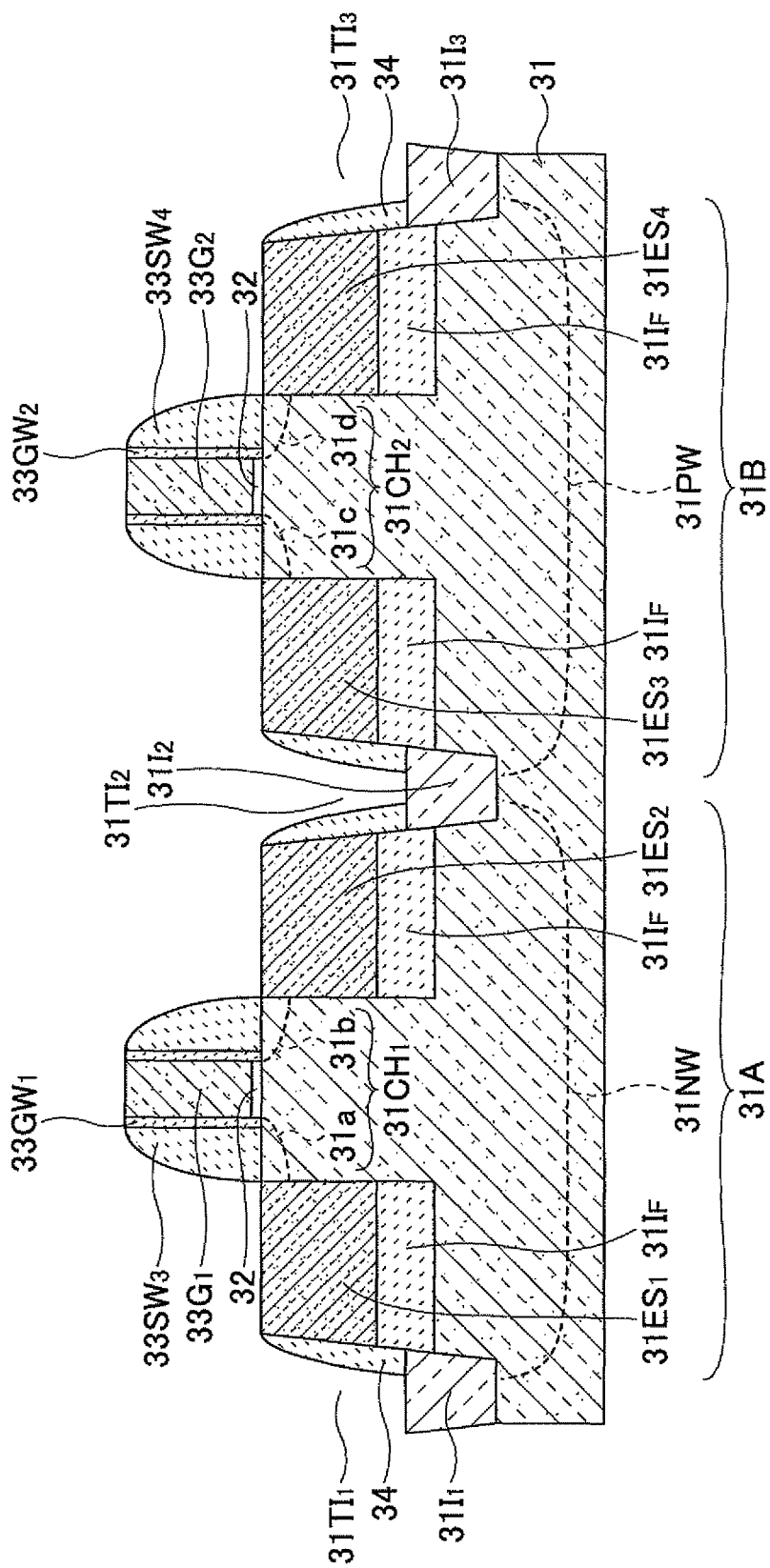

More specifically, in the step of FIG. 5K, an insulation film 34, which may be a silicon oxide film, a silicon nitride film, or a stacked film of silicon oxide film and silicon nitride film, is deposited on the structure of FIG. 5J by a CVD process with a shape conformal to the underlying structure and the insulation film 34 undergoes etchback process in FIG. 5L. With this, there are formed new sidewall insulation films $33SW_3$ at both sidewall surfaces of the gate electrode $33G_1$ and new sidewall insulation films $33SG_4$ are formed on both sidewall surface of the gate electrode $33G_2$. In the state of FIG. 5L, it can be seen that there remains the insulation film 34 on the sidewall surfaces of the grooves $31I_1$-$31I_3$.

Figure 5M:
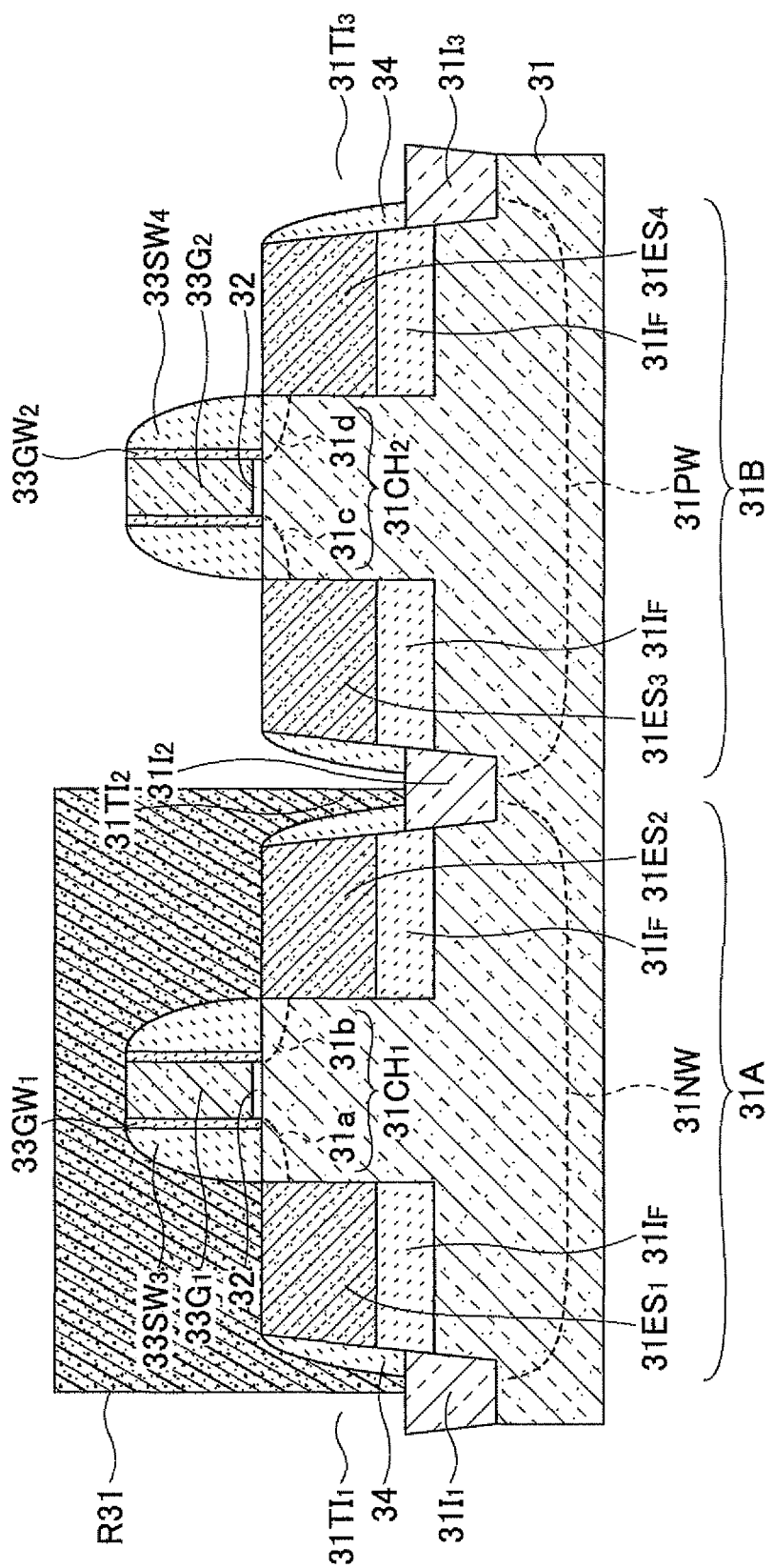

Next, in the step of FIG. 5M, the device region 31A of FIG. 5L is protected by a resist pattern R31, and n-type impurity elements such as As is introduced into the device region 31B under the acceleration energy of 40 keV or less with a dose of $5 \times 10^{14}$ cm$^{-2}$-$2 \times 10^{16}$ cm$^{-2}$, preferable under the acceleration energy of 30 keV and the dose of $2 \times 10^{15}$ cm$^{-2}$, while using the gate electrode $33G_2$ and the sidewall insulation films $33SW_4$ as a mask. Here, any tilt angle may be used and the injection may be conducted with one or more twist directions. Further, one or more of As or P may be injected as the injection species. With this, a source region 31g and a drain region 31h of n-type are formed respectively in the silicon epitaxial layers $31ES_3$ and $31ES_4$ with an increased depth as compared with the source extension region 31c and the drain extension region 31d formed previously in the substrate portion $31CH_2$.

Figure 5N:
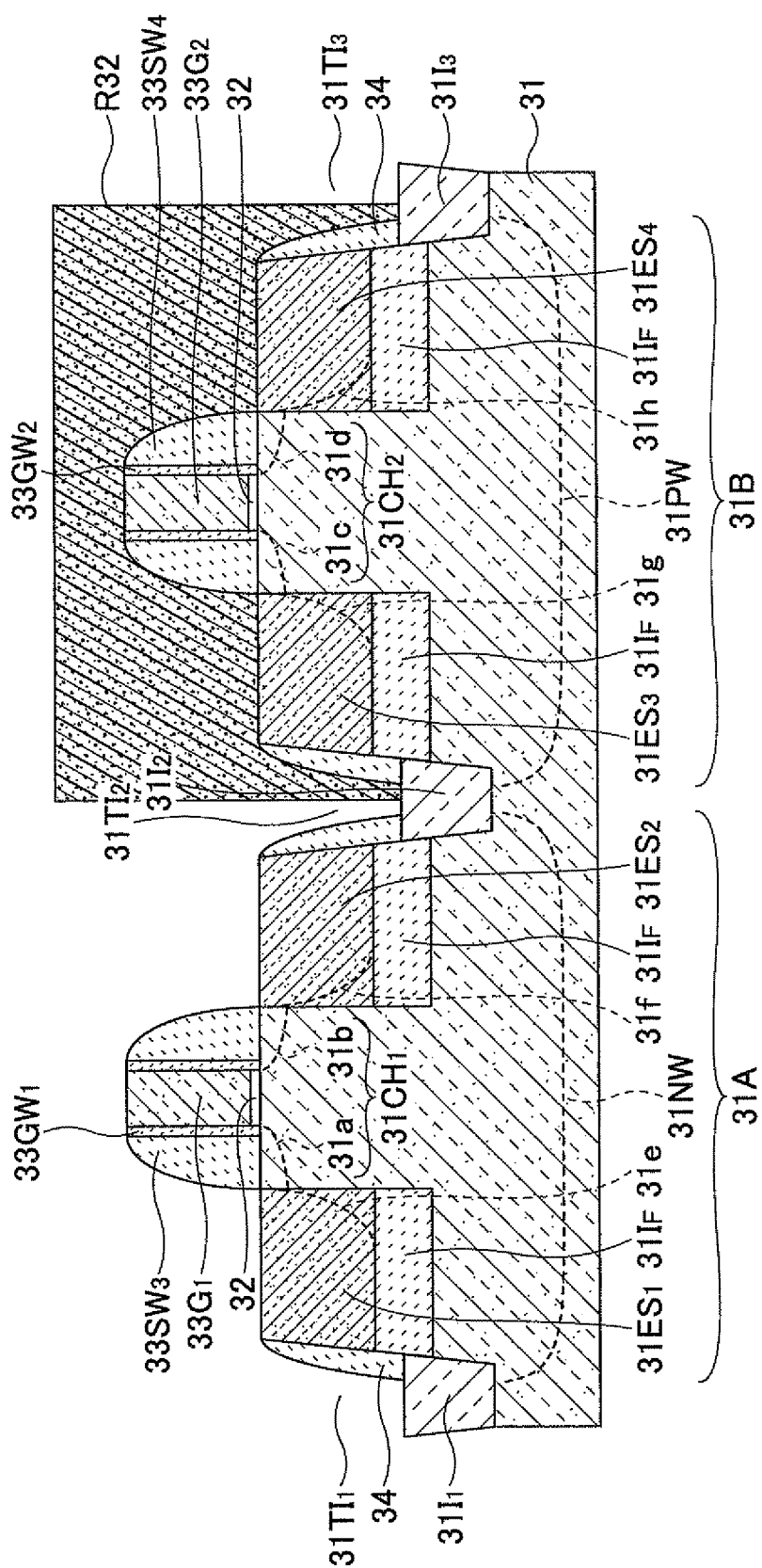
Figure 50:
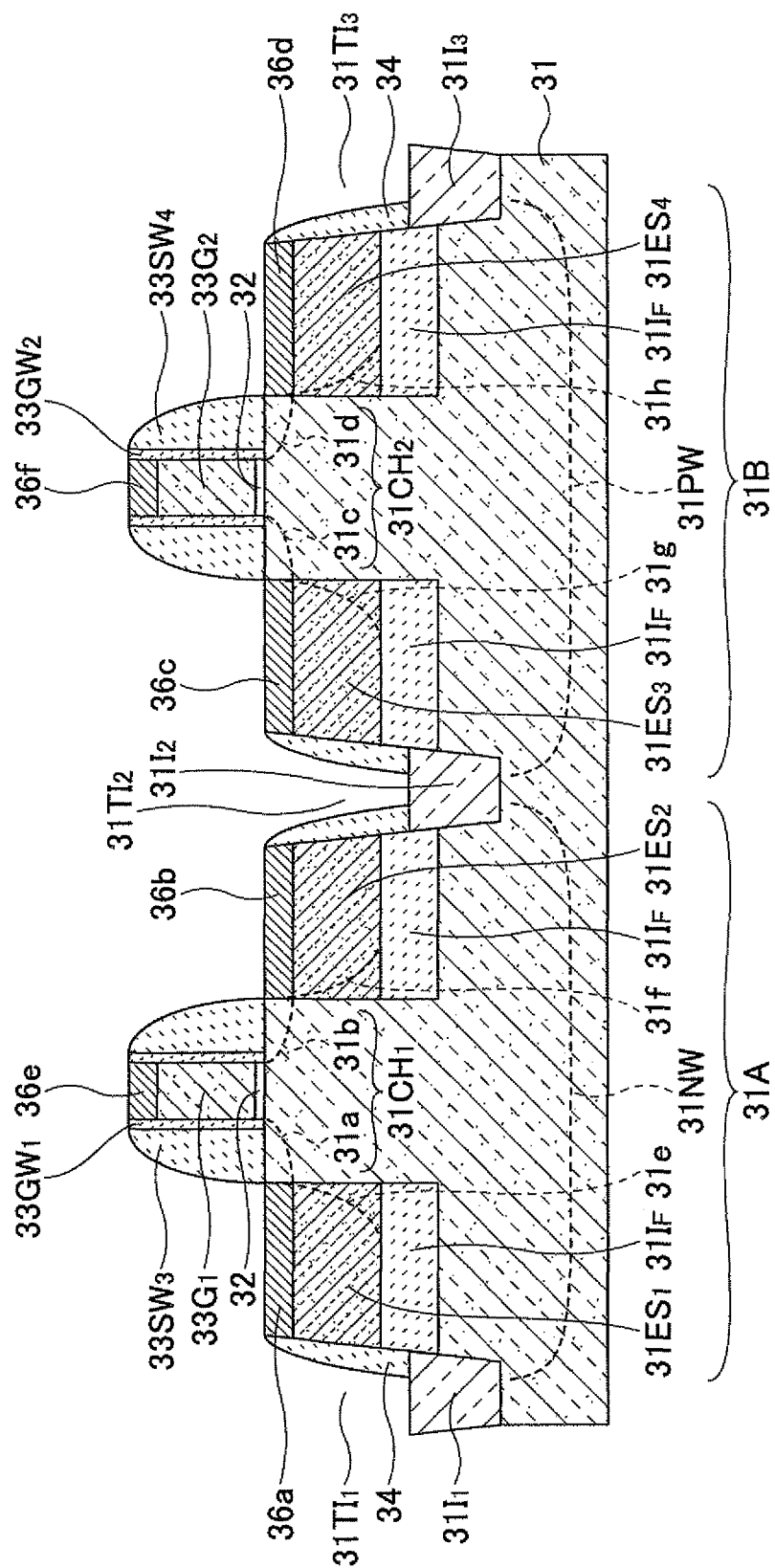

Next, in the step of FIG. 5N, the resist pattern R31 is removed and the device region 31B is protected by a resist pattern R32. Further, B is introduced into the device region 31A under the acceleration energy of 7 keV or less and the dose of $5 \times 10^{14}$ cm$^{-2}$-$2 \times 10^{16}$ cm$^{-2}$, preferably under the acceleration energy of 5 keV and the dose of $2 \times 10^{15}$ cm$^{-2}$ while using the gate electrode $33G_1$ and the sidewall insulation film $33SW_3$ as a mask. In this process, the tilt angle may be chosen arbitrary and the injection may be conducted with one or more twist directions. Further, it is possible to use B or one or more B molecules or ions such as B, $BF_2$, $B_{10}H_x$ for the ionic species. With this, a source region 31e and a drain region 31f of p-type are formed respectively in the silicon epitaxial layers $31ES_1$ and $31ES_2$ with an increased depth as compared with the source extension region 31a and the drain extension region 31b formed previously in the substrate portion $31CH_1$.

Further, in the step of FIG. 5O, there are formed low resistance silicide layers 36a, 36b, 36c, 36d, 36e and 36f of NiSi, or the like, on the exposed silicon surface, and hence on the exposed surfaces of the silicon epitaxial layers $31ES_1$, $31ES_2$, $31ES_3$ and $31ES_4$ and further on the exposed surfaces of the polysilicon gate electrodes $31G_1$ and $31G_2$, by conducting a salicide process.

Figure 5P:
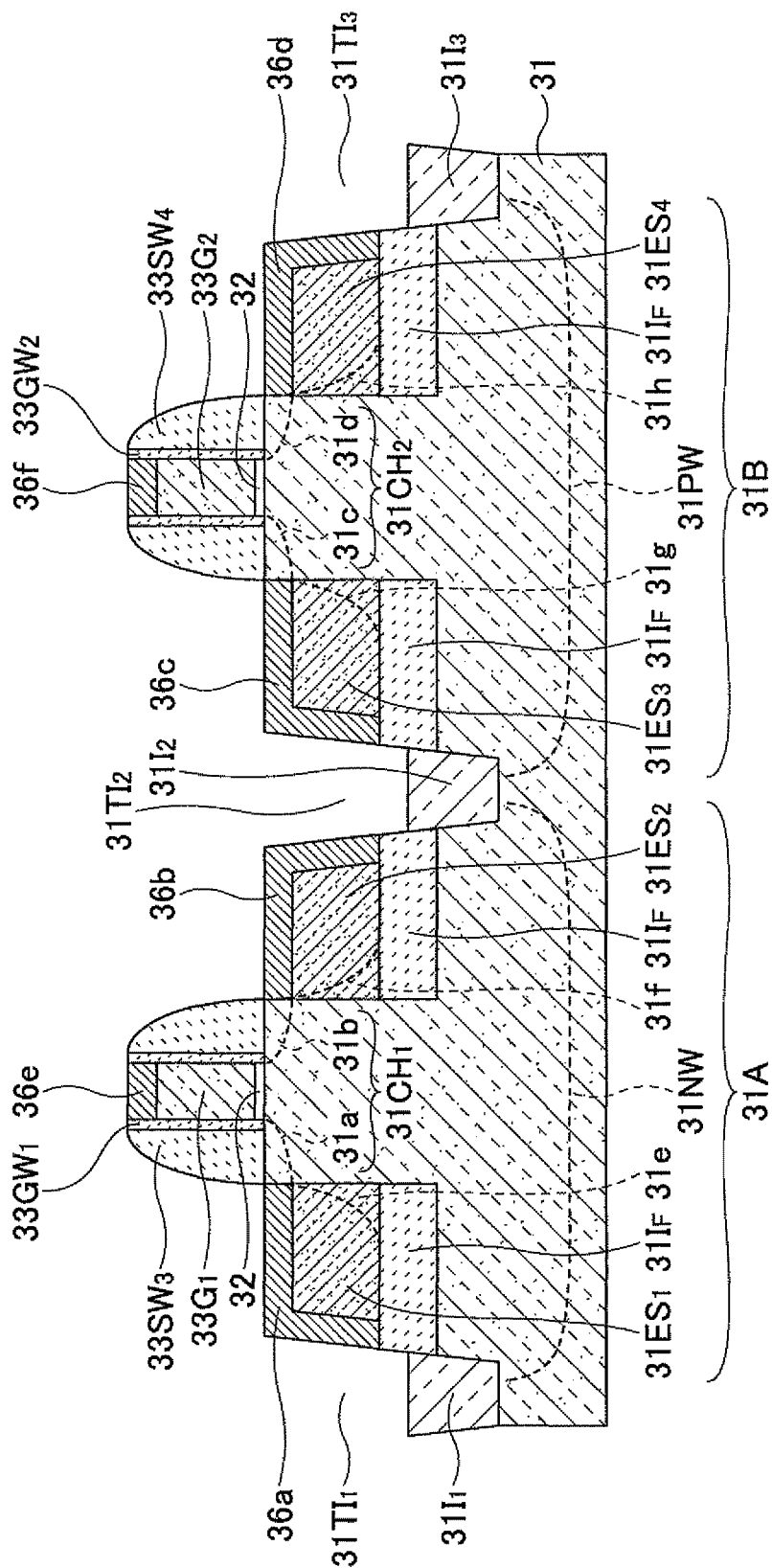

Alternatively, it is possible to obtain a structure represented in FIG. 5P by removing, after the step of FIG. 5L, the remaining insulation film 34 from the trenches $31TI_1$-$31TI_3$ by a wet etching process, and the like, that uses HF, and further conducing a silicide formation process to the structure thus obtained. In the structure of FIG. 5P, it should be noted that the silicide layers 36a-36d are formed to cover the sidewall surfaces of the trenches $31TI_1$-$31TI_3$.

Figure 5Q:
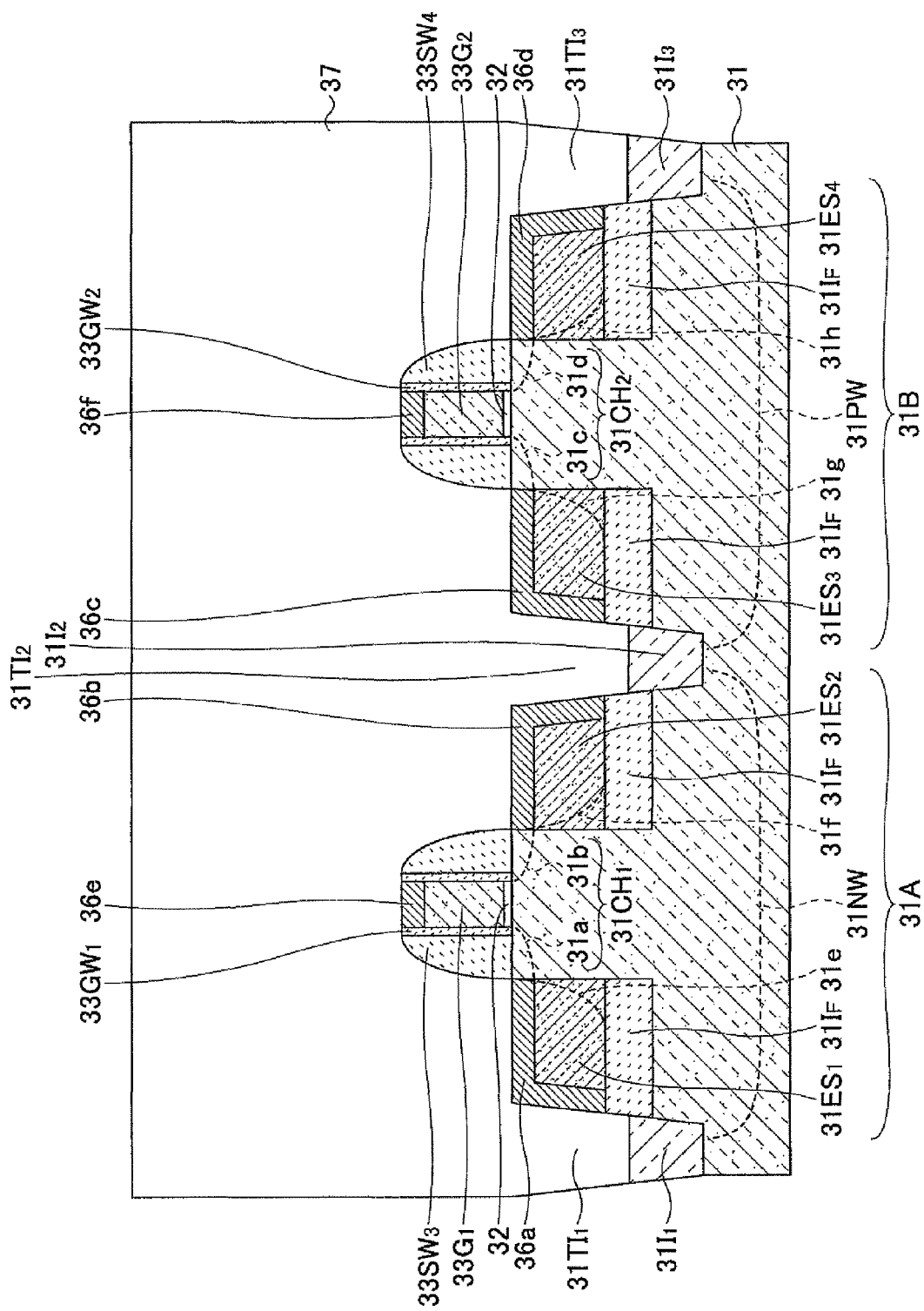

Further, in the step of FIG. 5Q, an interlayer insulation film 37 is formed to fill the trenches $31TI_1$-$31TI_3$ similarly to the step of FIG. 1N, and there are formed via-holes 37A-37D in the interlayer insulation film 37 respectively exposing the silicide film 36a covering the n-type source region 31e, the silicide film 36b covering the n-type drain region 31f, the silicide film 36c covering the p-type source region 31g, and the silicide film 36d covering the p-type drain region 31h.

Figure 5S:
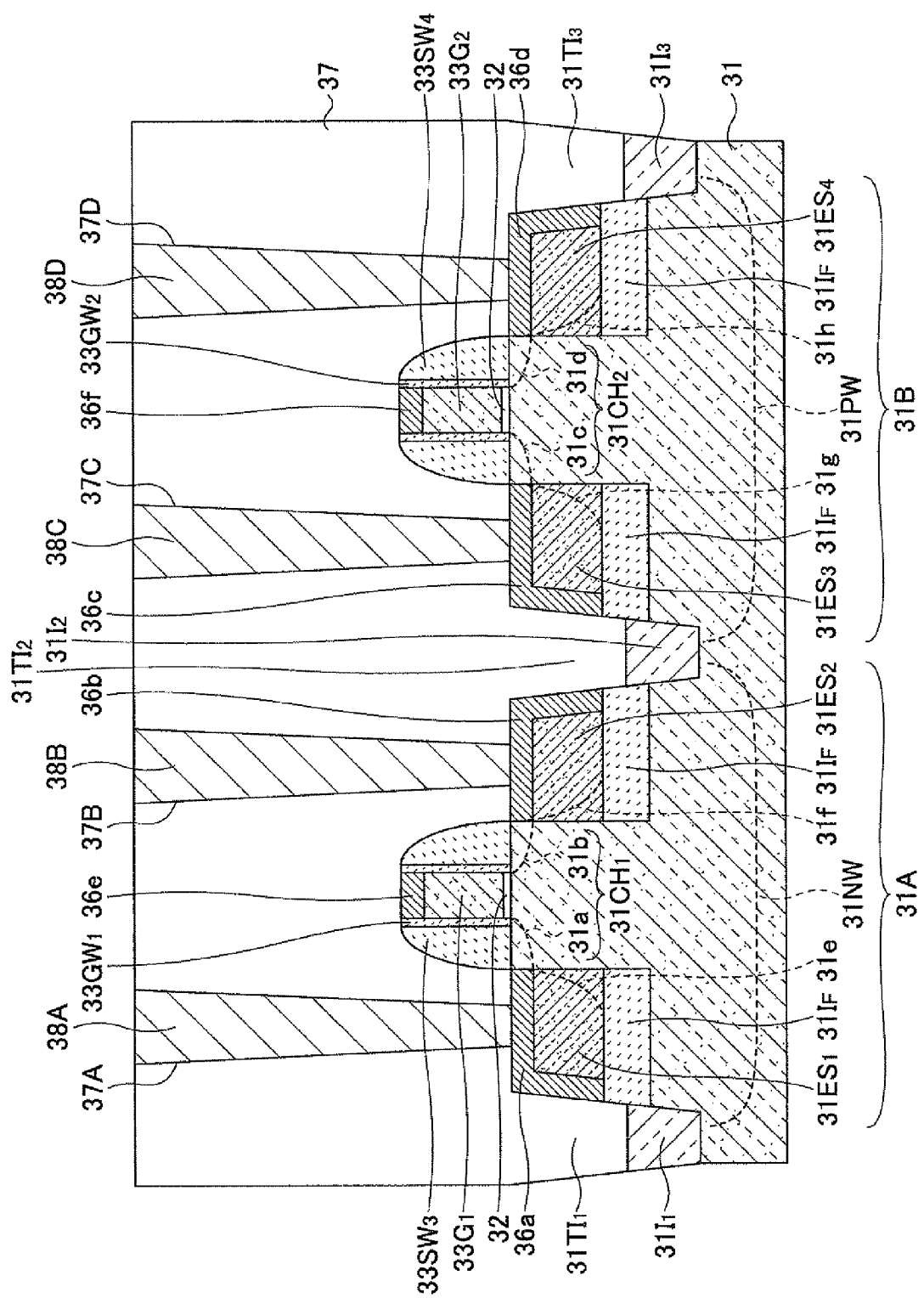

Further, in the step of FIG. 5S, via-plugs 38A-38D are formed in the via-holes 37A-37D respectively in contact with the silicide films 36a-36d.

In the present embodiment, too, it should be noted that the gate insulation film 32 and the gate electrodes $31G_1$ and $31G_2$ are formed on a surface of a bulk silicon substrate 31 not applied with processing such as etching, in spite of the fact that the p-channel MOS transistor or the n-channel MOS transistor has an insulation structure $31I_F$ formed locally underneath the source region 31e or 31g and underneath the drain region 31f or 31h. Because of this, flatness is guaranteed for the channel region located right underneath the gate electrode. Further, no defects are introduced into the channel region. Thus, according to the preferred embodiment, it becomes possible to use the bulk silicon substrate 11 of original, high crystal quality, for the channel region, and as a result, the operational characteristics of the MOS transistor are improved. Further, variation of the device characteristics is reduced.

[Third Embodiment]

Figure 7A:
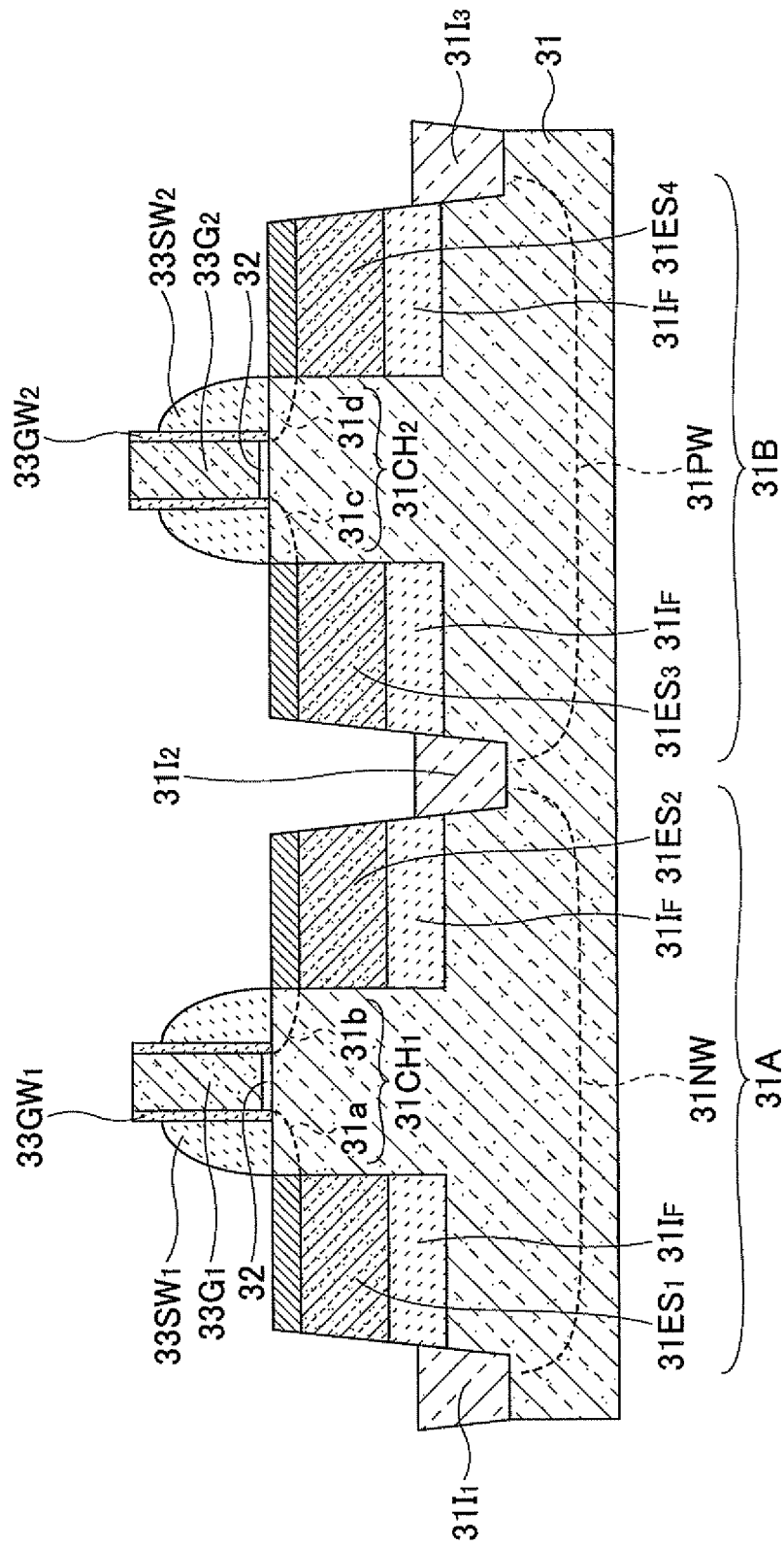
Figure 7B:
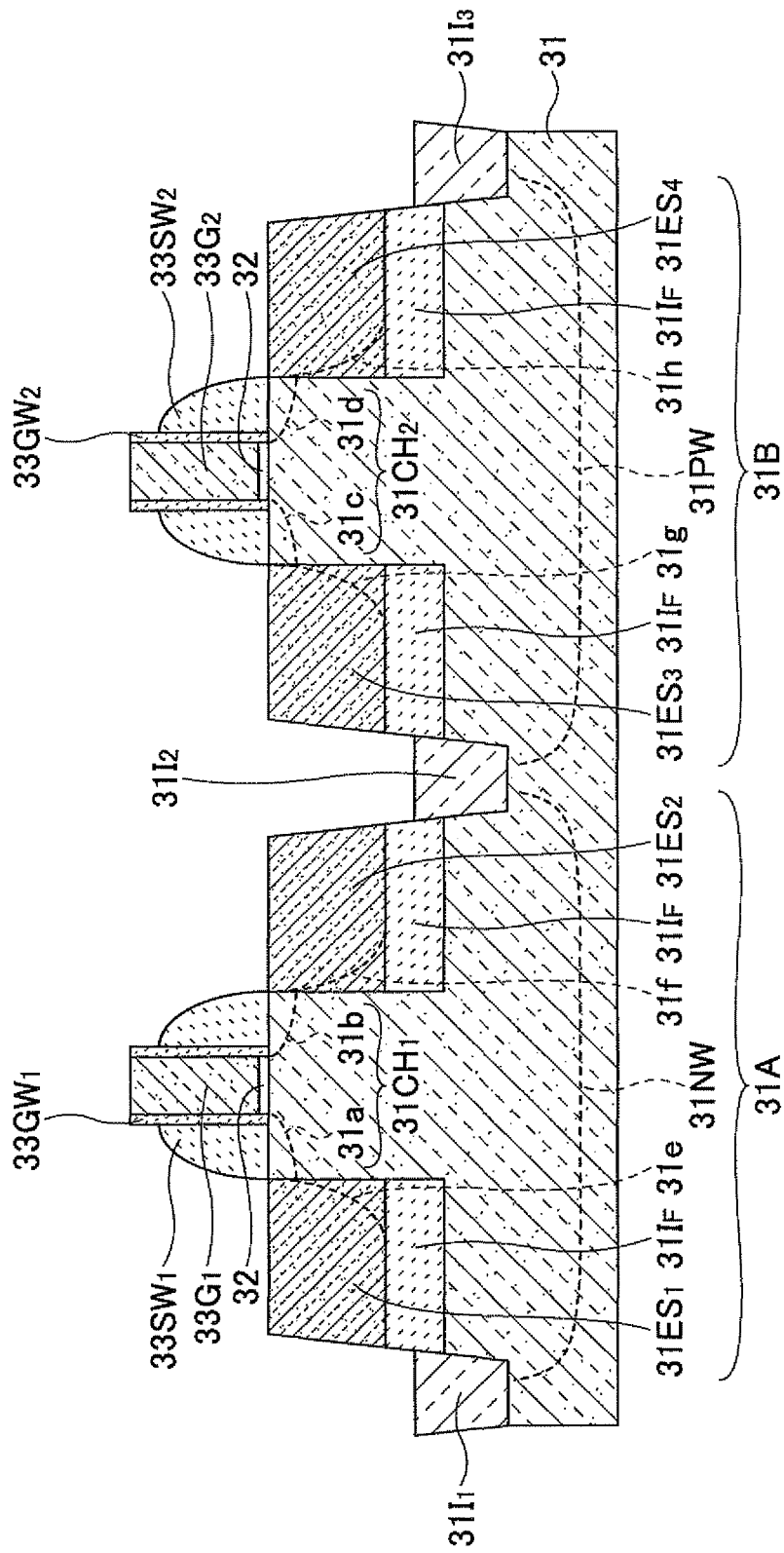

FIGS. 7A-7C are diagrams representing the fabrication process of a semiconductor device according to a third embodiment, wherein the process is a modification of the second embodiment and is conducted subsequent to the step of FIG. 5I. In FIGS. 7A-7C, those parts corresponding to the parts explained before are designated by the same reference numerals and the description thereof will be omitted. Further, FIG. 7A is identical to FIG. 5I and the explanation thereof will be omitted.

In the present embodiment, the process is continued after the step of FIG. 7A without removing the sidewall insulation films $33SW_1$ and $33SW_2$ contrary to the step of FIG. 5J.

Thus, in the step of FIG. 7B, the ion implantation process corresponding to the step of FIG. 5M is conducted while using the gate electrode $33G_2$ and the sidewall insulation films $33SW_2$ thereon as a mask, and the ion implantation process corresponding to the step of FIG. 5N is conducted while using the gate electrode $33G_1$ and the sidewall insulation films $33SW_1$ thereon as a mask. As a result, there are formed a source region $31g$ and a drain region $31h$ of n-type respectively in the silicon epitaxial layers $31ES_3$ and $31ES_4$, and a source region $31e$ and a drain region $31f$ of p-type are formed respectively in the silicon epitaxial layers $31ES_1$ and $31ES_2$. In the step of FIG. 7B, it should be noted that the sidewall insulation films $33SW_1$ and $33SW_2$ are receded as a result of the selective etching of FIG. 5G, and as a result, the source region $31e$ and the drain region $31f$ extend to respective locations of the substrate portion $31CH_1$ corresponding to the outer wall surfaces of the sidewall insulation films $33SW_1$. Similarly, in the step of FIG. 7B, the source region $31g$ and the drain region $31h$ extend up to the respective locations of the substrate portion $31CH_2$ corresponding to the outer wall surfaces of the sidewall insulation films $33SW_2$.

Further, by forming silicide layers on the exposed silicon surfaces of FIG. 7B in the step of FIG. 7C by a salicide process, there are formed silicide layers $36a$, $36b$, $36c$, $36d$, $36e$ and $36f$ respectively on the p-type source region $31e$, on the p-type drain region $31f$, on the p-type source region $31g$, on the p-type drain region $31h$, on the top surface of the polysilicon gate electrode $33G_1$, and the top surface of the polysilicon gate electrode $33G_2$.

After the step of FIG. 7C, the process steps of FIGS. 5Q-5S are conducted and a semiconductor device having a structure similar to that of FIG. 5S is formed on the silicon substrate 11. In the present embodiment, it should be noted that the source region $31e$ and the drain region $31f$ extend to the respective locations of the substrate portion $31CH_1$ corresponding to the outer surfaces of the sidewall insulation films $33SW_1$. Likewise, in the step of FIG. 7B, the source region $31g$ and the drain region $31h$ extend up to the respective locations of the substrate portion $31CH_2$ corresponding to the outer wall surfaces of the sidewall insulation films $33SW_2$.

In the present embodiment, too, it should be noted that the gate insulation film 32 and the gate electrodes $31G_1$ and $31G_2$ are formed on a flat surface of a bulk silicon substrate 31 not applied with processing such as etching, in spite of the fact that the p-channel MOS transistor or n-channel MOS transistor has an insulation structure $31I_F$ formed locally underneath the source region $31e$ or $31g$ or underneath the drain region $31f$ or $31h$, similarly to the previous embodiments. Because of this, flatness is guaranteed for the channel region located right underneath the gate electrode. Further, no defects are introduced into the channel region. Thus, according to the preferred embodiment, it becomes possible to use the bulk silicon substrate 11 of original, high crystal quality, for the channel region, and as a result, the operational characteristics of the MOS transistor are improved. Further, variation of the device characteristics is reduced.

Further, it should be noted that the sidewall insulation films $33SW_1$ and $33SW_2$ are continuously used after the selective etching process of FIG. 5G as the sidewall insulation films, and thus, the process of FIGS. 5J-5L of the previous embodiment and further the process of removal of the insulation film 34 remaining in the trenches $31TI_1$-$31TI_3$ can be omitted. With this, the fabrication process of the semiconductor device is simplified substantially.

Figure 8A:
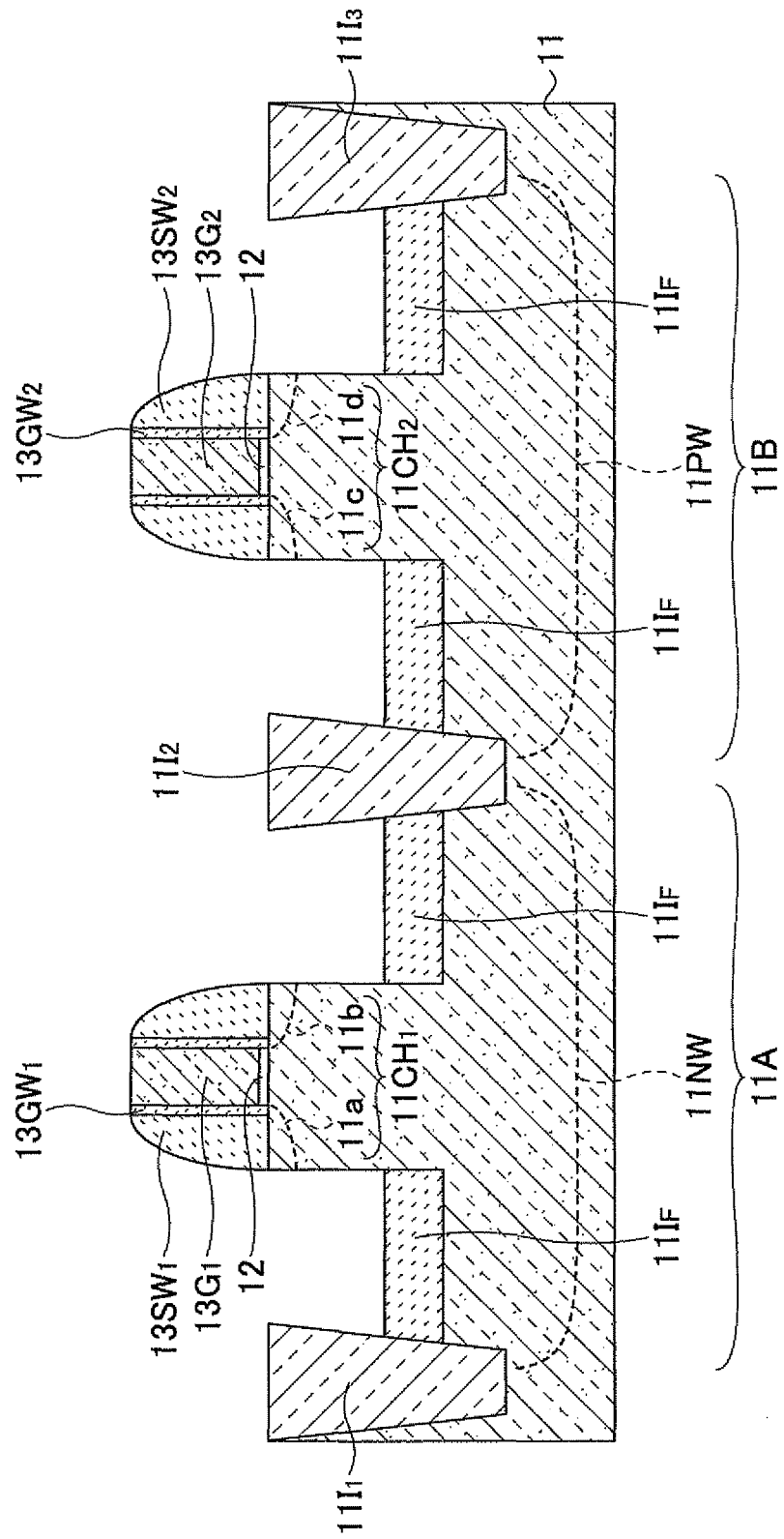
FIGS. 8A-8C are diagrams representing the process of fabricating a semiconductor device according to a modification of the third embodiment.
Figure 8B:
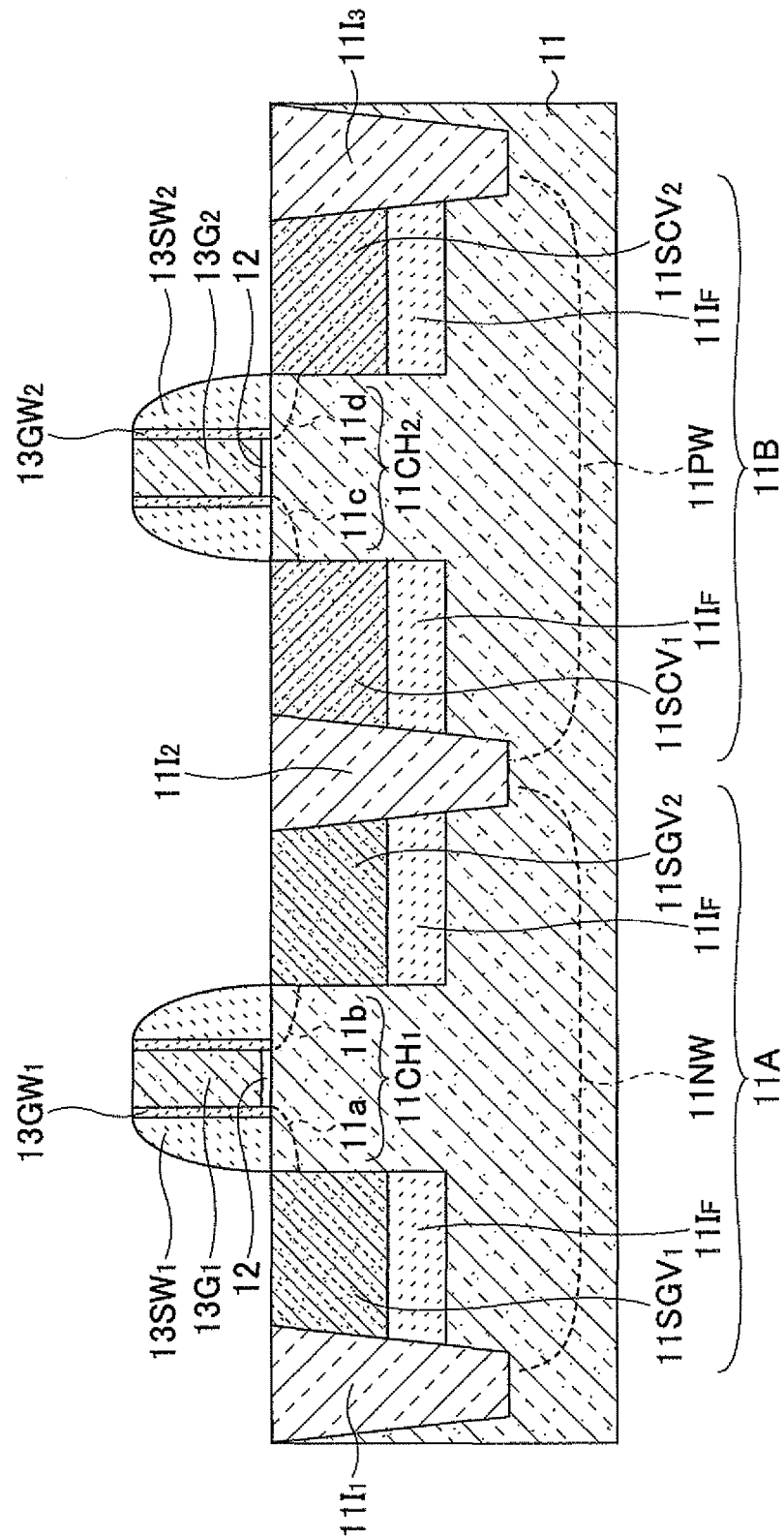

In each of the foregoing embodiments, it should be noted that the silicon epitaxial layers $11ES_1$-$11ES_4$ are removed selectively with regard to the underlying buried insulation film $11IF$ selectively as represented in FIG. 8A by a wet etching process or dry etching process subsequent to the step of FIG. 5K, and the trenches thus formed are filled with SiGe mixed crystal layers $11SGV_1$ and $11SGV_2$ in the device region $11A$ and with SiC mixed crystal layers $11SCV_1$ and $11SCV_2$ in the device region $11B$ in the step of FIG. 8B by carrying out an epitaxial growth to the silicon monocrystal that constitutes the substrate portions $11CH_1$ and $11CH_2$. With this, a uniaxial compressive stress is inducted in the channel region of the p-channel MOS transistor formed in the device region $31A$ and a uniaxial tensile stress is induced in the channel region of the n-channel MOS transistor formed in the device region $31B$, and thus, the operational speed of the p-channel MOS transistor and the n-channel MOS transistor are increased.

Figure 8C:
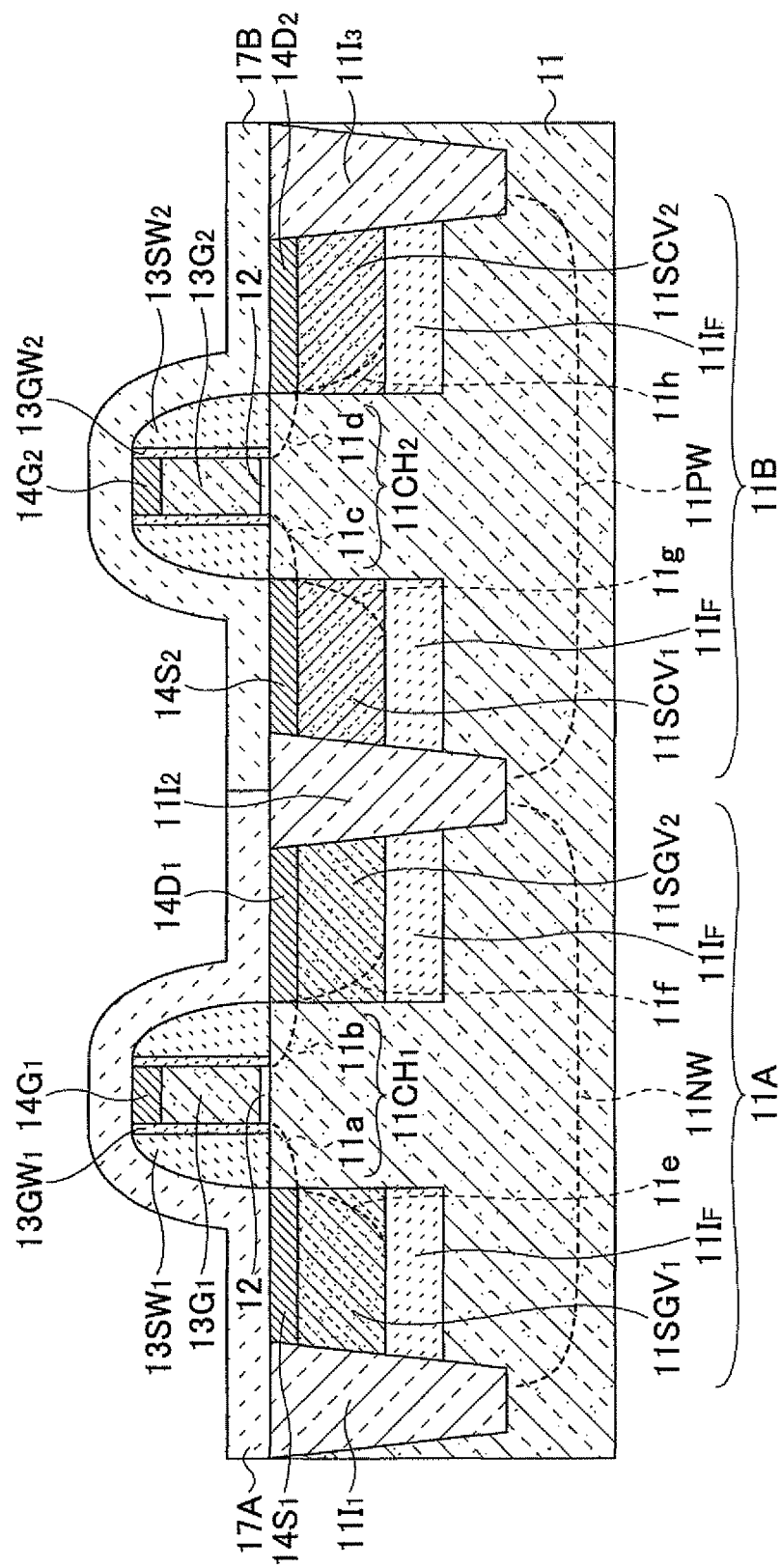

Further, as represented in FIG. 8C, it is also possible to form, after the formation of the source region $11e$ and the drain region $11f$ of the p-channel MOS transistor and the formation of the source region $11g$ and the drain region $11h$ of the n-channel MOS transistor and after the formation of the silicide layers $14S_1$, $14D_1$, $14S_2$, $14D_2$, $14G_1$ and $14G_2$, a compressive stressor film 17A of SiN or the like on the p-channel MOS transistor so as to cover the gate electrode $13G_1$ and the sidewall insulation films $13SW_1$ and further a tensile stressor film 17B of SiN, or the like, on the n-channel MOS transistor so as to cover the gate electrode $13G_2$ and the sidewall insulation films $13SW_2$. With this, the uniaxial compressive stress of the p-channel MOS transistor and the uniaxial tensile stress of the n-channel MOS transistor are enhanced.

In FIGS. 8A-8C, it should be noted that those parts corresponding to the parts explained before are designated by the same reference numerals and the description thereof will be omitted.

[Fourth Embodiment]

FIGS. 9A-9D are diagrams representing the fabrication process of a semiconductor device according to a fourth embodiment. In the examples below, the description will be made for the fabrication process of an n-channel MOS transistor, while it should be noted that it is also possible to fabricate a p-channel MOS transistor similarly.

Referring to FIG. 9A, there is defined a device region $51A$ on a silicon substrate 51 by a device isolation region $51I$ of an STI structure, wherein it should be noted that the device isolation insulation film constituting the device isolation region $51I$ is receded by conducting a wet etching process for example by using HF, or the like. As a result, there is exposed a corner part of the silicon substrate 51 at the boundary to the device isolation region $51I$, wherein such a corner part is rounded by conducting an annealing process to the silicon substrate 51 in a non-oxidizing ambient such as in a hydrogen ambient at the temperature of 1000° C. for ten seconds for example as represented in FIG. 9A by a broken line.

Further, in the structure of FIG. 9A, there is formed a polysilicon gate electrode 53G over the silicon substrate 51 in correspondence to the channel region of the device region 51A via a gate insulation film 52, and sidewall spacers 53GW of a silicon oxide film and sidewall insulation films 53SW of a silicon nitride film or a silicon oxynitride film are formed on the respective sidewall surfaces of the polysilicon gate electrode 53G consecutively.

Further, in the step of FIG. 9A, there are formed a source extension region 51a and a drain extension region 51b after the formation of the gate electrode 53G but before the formation of the sidewall insulation film 53SW, by introducing As or P into the silicon substrate 51 while using the gate electrode 53G and the sidewall spacers 53SW as a mask.

Further, while using the polysilicon gate electrode 53G and the sidewall spacers 53GW and further the sidewall insulation films 53SW as a mask, the silicon substrate 51 thus processed is subjected to a dry etching process and further to a wet etching process that may use TMAH as etchant, and with this, there are formed trenches 51TA and 51TB in the device region 51A at both lateral sides of a substrate portion 51CH with sidewall surfaces, forming a wedge shape defined by facets 51ta and 51tb.

Next, in the step of FIG. 9B, SiGe mixed crystal layers $51SG_1$ and $51SG_2$ are formed on the structure of FIG. 9A epitaxially with a thickness of 20 nm-80 nm, preferably with the thickness of about 50 nm with a condition similar to those of the SiGe mixed crystal layers $31SG_1$, $31SG_2$, $31SG_3$ and $31SG_4$. It should be noted that the SiGe mixed crystal layers $51SG_1$ and $51SG_2$ are grown to form sidewall surfaces 51tc and 51td defined with crystal facets characterized by indices larger than those of the (100) surface, such as a (111) surface or (311) surface, similarly to the SiGe mixed crystal layers $31SG_1$, $31SG_2$, $31SG_3$ and $31SG_4$ of the previous embodiment.

Further, subsequent to the epitaxial growth of the SiGe mixed crystal layers $51SG_1$ and $51SG_2$, the epitaxial growth of silicon epitaxial layers $51ES_1$ and $51ES_2$ is conducted in the step of FIG. 9B with a thickness of 70 nm-20 nm, preferably with the thickness of 50 nm, under a condition similar to the case of the silicon epitaxial layers $31ES_1$, $31ES_2$, $31ES_3$ and $31ES_4$ of the previous embodiment.

It should be noted that the silicon epitaxial layers $51ES_1$ and $51ES_2$ are grown to form sidewall surfaces 51te and 51tf defined with crystal facets characterized by indices larger than those of the (100) surface, such as a (111) surface or (311) surface, similarly to the silicon epitaxial layers $31ES_1$, $31ES_2$, $31ES_3$ and $31ES_4$ of the previous embodiment.

In the present embodiment, too, it should be noted that the sidewall surfaces 51tc and 51td of the SiGe mixed crystal layers $51SG_1$ and $51SG_2$ or the sidewall surfaces 51te and 51tf of the silicon epitaxial layers $51ES_1$ and $51ES_2$ may be formed of a single crystal surface or of a plurality of crystal surfaces.

In the step of FIG. 9B, it can be seen that there are formed a polycrystal SiGe pattern 53pSG and a polysilicon pattern 53pS on the polysilicon gate electrode 53G with the growth of the SiGe mixed crystal layers $51G_1$ and $51SG_3$ and the growth of silicon epitaxial layers $51ES_1$ and $51ES_2$.

Further, in the present embodiment, too, it is preferable to apply an anisotropic etching process for a short time duration after the formation of the SiGe mixed crystal layers $51SG_1$ and $51SG_2$ and remove the SiGe mixed crystal layer that has crept up upon the sidewall surfaces t1tb and 51ta of the substrate portion 51CH as explained already with reference to FIGS. 6A and 6B.

With the structure of FIG. 9B thus obtained, it should be noted that the sidewall surfaces 51tc and 51te or the sidewall surfaces 51td and 51tf are generally parallel with each other or in a relationship close to parallel with each other if not exactly in parallel. As a result, the silicon epitaxial layers $51ES_1$ and $51ES_2$ merely have a very small film thickness of approximately 5 nm in the part thereof covering the SiGe mixed crystal layers $51SG_1$ and $51SG_2$ at the respective sidewall surfaces 51td and 54ed, even in the case the silicon epitaxial layers $51ES_1$ and $51ES_2$ have a film thickness in the order of 70 nm-20 nm.

Figure 9C:
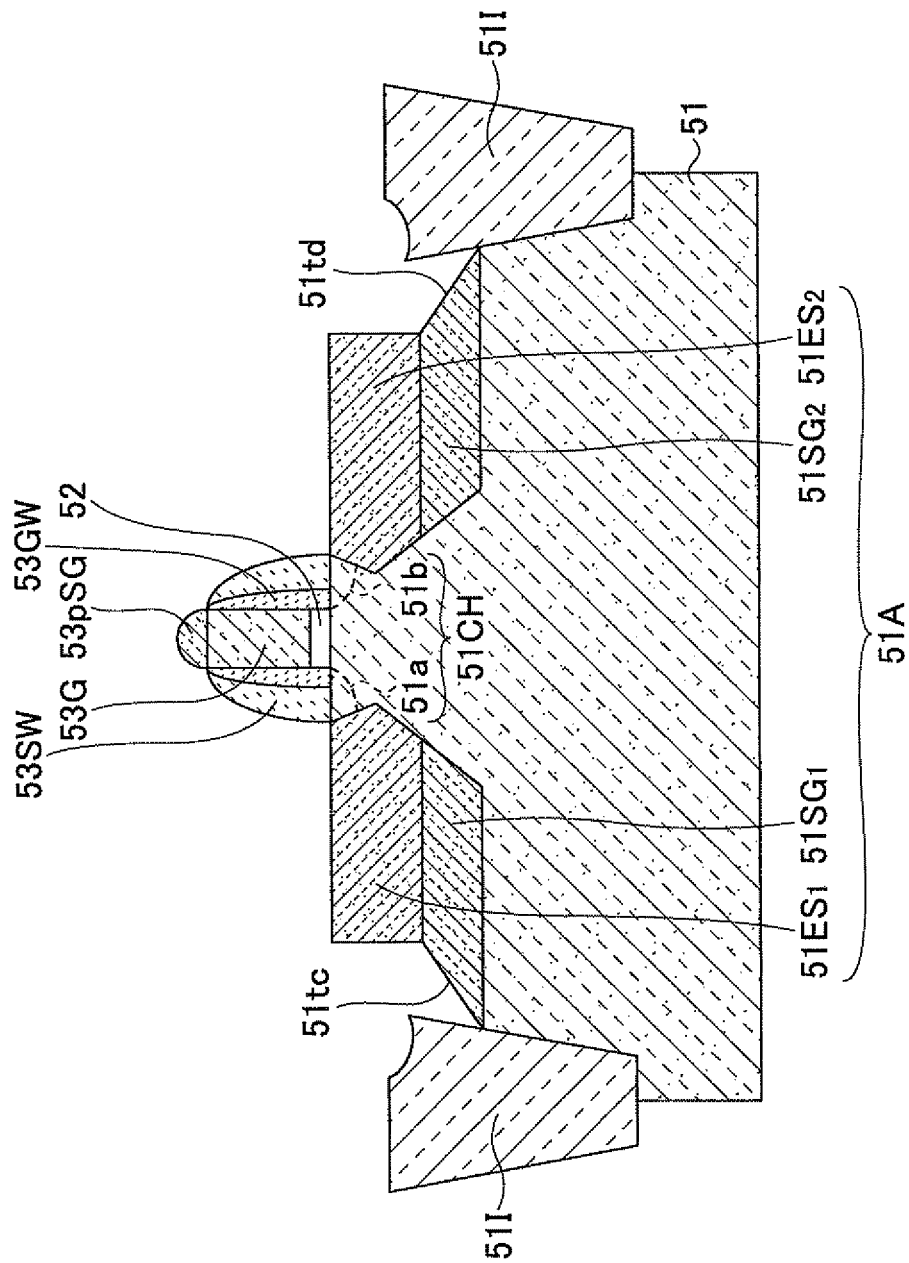

Thus, the present embodiment applies an anisotropic etching process working generally perpendicular to the to the principal surface of the silicon substrate 51 to the structure of FIG. 9B in the step of FIG. 9C by using HCl as an etching gas for example under the total pressure of 1-30 Torr, preferably under the total pressure of 15 Torr, at the temperature of 600-750° C., preferably at the temperature of 700° C. while setting the hydrogen gas partial pressure to 1500 Pa-2500 Pa, preferably 2000 Pa, the hydrogen chloride partial pressure of 40 Pa-60 Pa, preferably 49 Pa. With this, the thin Si layer over the facets are etched away and it becomes possible to expose the underlying SiGe mixed crystal layers $51SG_1$ and $51SG_2$ easily over the entire sidewall surfaces 51tc and 51td. Further, in the step of FIG. 9C, it will be noted that the polysilicon pattern 53pS formed on the polycrystal SiGe pattern 53pSG has vanished on the gate electrode 53G as a result of the anisotropic etching process applied to the silicon substrate 51.

Figure 9D:
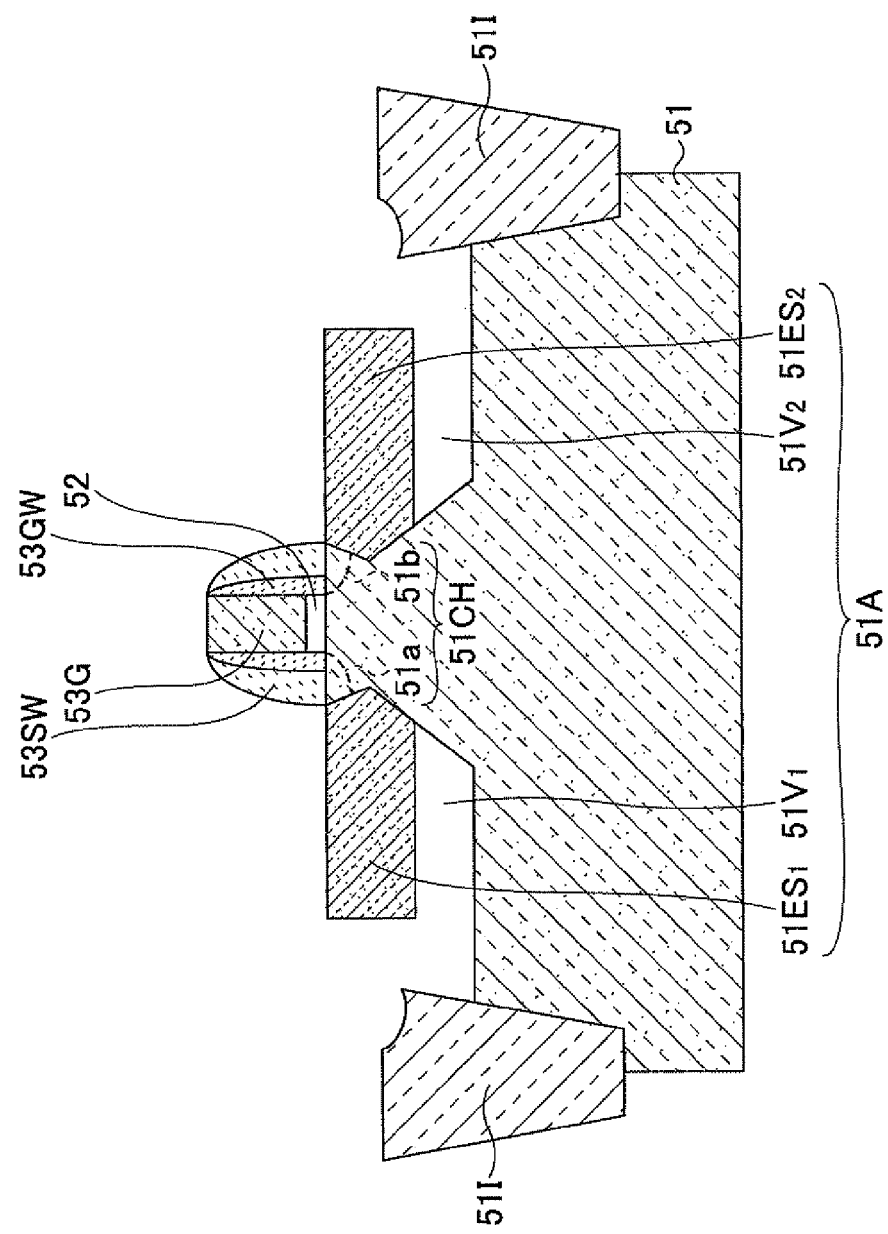

Thus, in the step of FIG. 9D the exposed SiGe mixed crystal layers $51SG_1$ and $51SG_2$ are exposed to the same gas ambient continuously and are etched away selectively with a rate of 1.4 nm/minutes as compared with the silicon epitaxial layers $51ES_1$ and $51ES_2$. As a result of the selective etching, there are formed voids $51V_1$ and $51V_2$ respectively underneath the silicon epitaxial layers $51ES_1$ and $51ES_2$ as represented in FIG. 9D.

In the case the selective etching process is conducted under the foregoing condition, an etching selectivity of about 100:1 is attained between the SiGe mixed crystal layer $51SG_1$ or $51SG_2$ and the silicon epitaxial layer $51ES_1$ or $51ES_2$. In the step of FIG. 9D, it should be noted that the polycrystalline SiGe pattern 53pSG on the gate electrode 53G has vanished as a result of the selective etching of the SiGe mixed crystal layers $51SG_1$ and $51SG_2$.

Figure 9E:
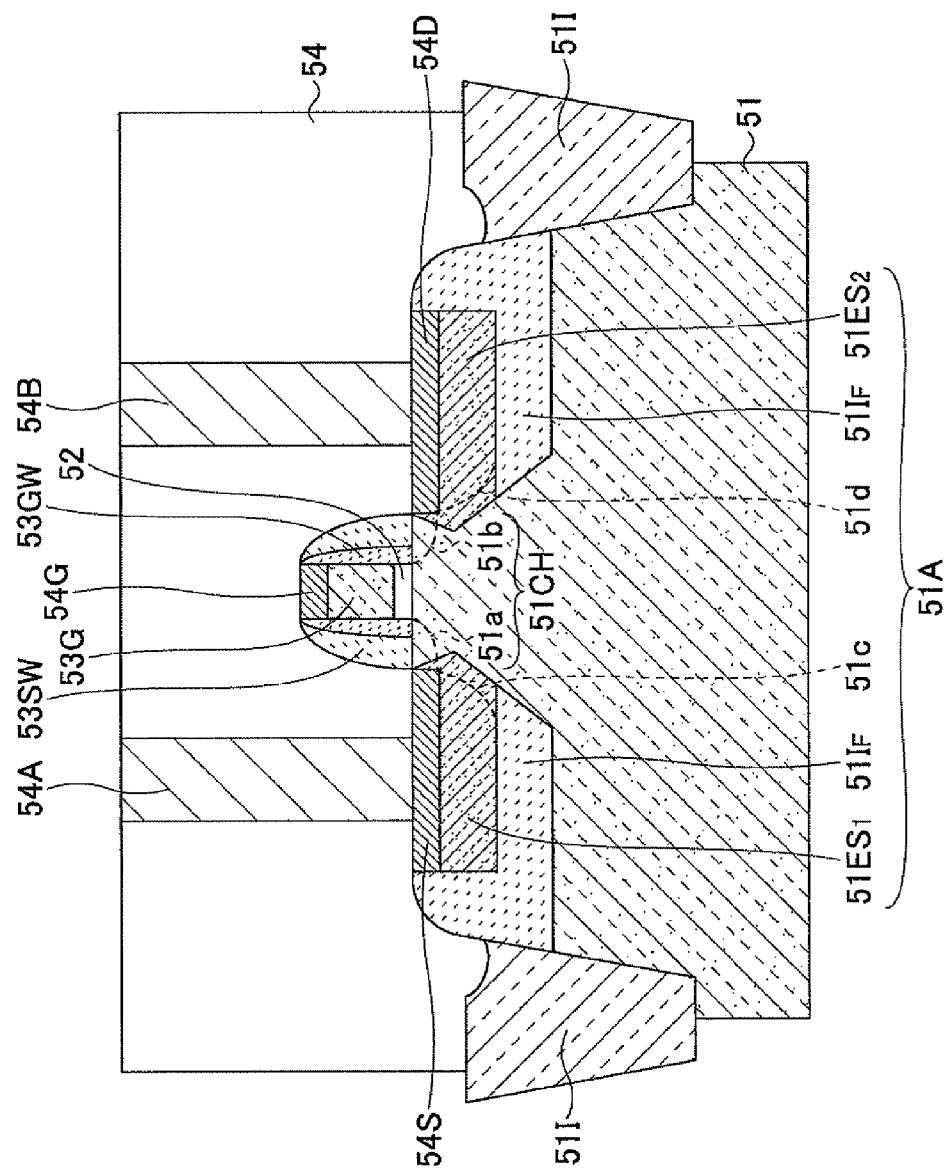
Figure 10:
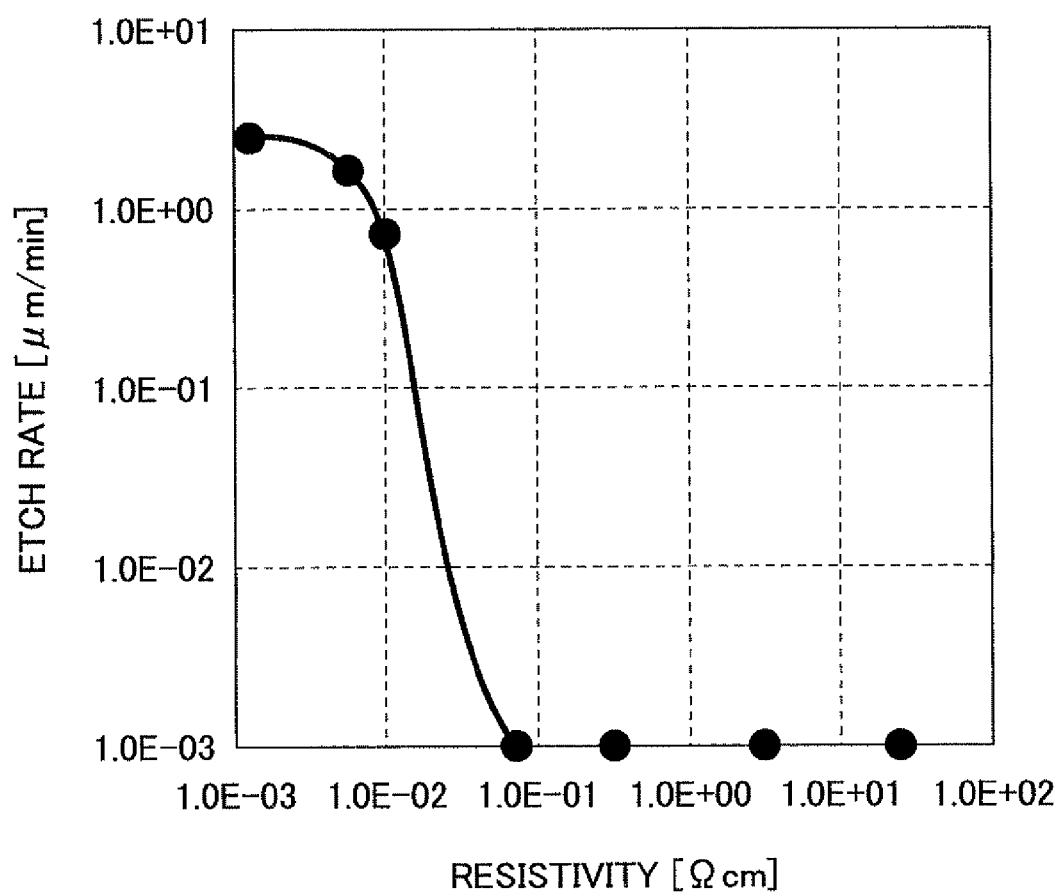

Next, by conducting the process similar to that of FIGS. 5H-5S explained previously, the voids $51V_1$ and $51V_2$ are filled with the buried insulation film 51IF as represented in FIG. 9E, and a source diffusion region 51c of n-type is formed in the silicon epitaxial layer $51ES_1$ and a drain diffusion region 51d of n-type is formed in the silicon epitaxial layer $51ES_2$. Further, a silicide layer 54G is formed on the gate electrode 53G and an interlayer insulation film 54 is formed on the silicon substrate 51 so as to cover the gate electrode 53G and sidewall insulation films 53SW. Further, via-plugs 54A and 54B are formed in the interlayer insulation film 54 respectively in contact with the source diffusion region 51c and the drain diffusion region 51d via the respective silicide layers 54A and 54D. With this, the intended n-channel MOS transistor is obtained.

Likewise, a p-channel MOS transistor can be fabricated, and detailed description thereof will be omitted.

According to the present embodiment, the process for exposing the SiGe mixed crystal layers $51SG_1$ and $51SG_2$ and the process for forming the voids $51V_1$ and $51V_2$ of the step of FIG. 9C can be conducted by a simple etching process, and the fabrication process of the semiconductor device can be simplified. Particularly, according to the present embodiment, it becomes possible to carry out the process steps starting from the formation of the SiGe mixed crystal layers 51SG$_1$ and 51SG$_2$ represented in FIG. 9B and ending with the formation of the voids 51V$_1$ and 51V$_2$ of FIG. 9D in a manner continuously while using the same substrate processing apparatus, without taking out the silicon wafer 51 into the atmospheric ambient.

[Fifth Embodiment]

In the foregoing embodiments, formation of trenches is conducted first into the initial silicon substrate, and the insulation regions are formed underneath the source region and the drain region of the semiconductor device by applying, after growing the SiGe mixed crystal layers and the silicon epitaxial layers in the trenches, a selective etching process to the SiGe mixed crystal layer.

On the other hand, the etching rate of a silicon film changes depending on the concentration of the doping.

Figure 10:
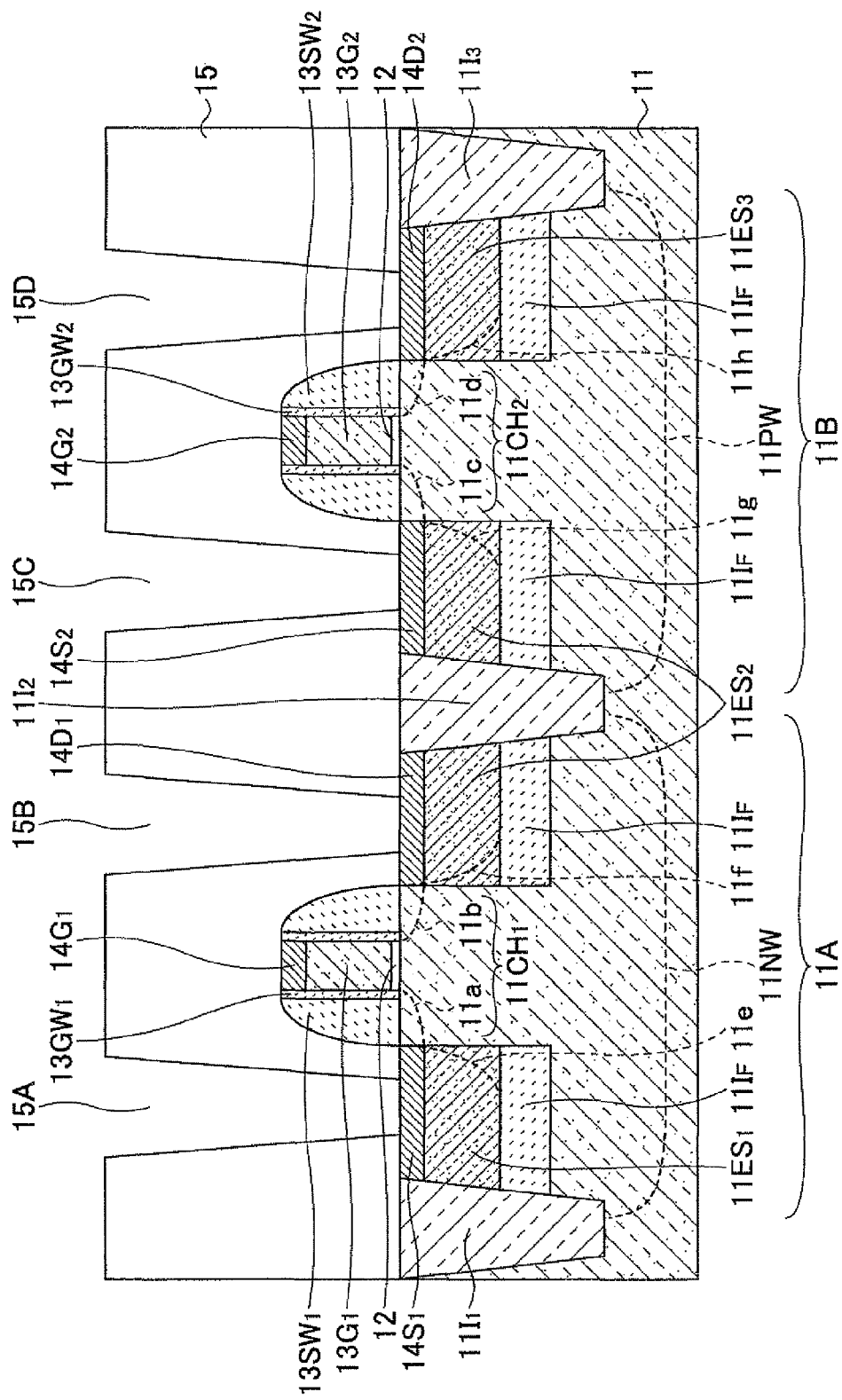
FIG. 10 is a diagram explaining the outline of the fifth embodiment.

FIG. 10 is a graph representing an etching rate and a film specific resistance for the case a silicon layer doped with B is etched with a set etching process by using an etchant that contains hydrofluoric acid (HF), a nitric acid (HNO$_3$) and an ascetic acid (CH$_3$COOH) with a portion of 1:3:8. There, it can be seen that the film specific resistance is decreased when the concentration of impurity elements in the film is increased.

Referring to FIG. 10, it can be seen that the etching rate of the film starts to drop sharply when the specific resistance of the film has exceeded the value of about $1\times10^{-2}$ Ωcm, while this value of the specific resistance corresponds to the B concentration of $1\times10^{18}$ cm$^{-2}$. This means that the structure of FIG. 9E can be obtained also even when a silicon epitaxial layer of the concentration of $1\times10^{18}$ cm$^{-2}$ is used in place of the SiGe mixed crystals 15SG$_1$ and 15SG$_2$.

In FIG. 10 it should be noted that the specific resistance of $1\times10^{-3}$ Ωcm corresponds to the B concentration of $1\times10^{20}$ cm$^{-2}$.

The silicon epitaxial layer containing B with high concentration can be formed in the step of FIG. 9D under the total pressure of 133-2660 Pa (1-2 Torr), preferably 1330 Pa (10 Torr) and the substrate temperature of 500-650° C., preferably at the substrate temperature of 550° C. by setting the hydrogen gas pressure to 1600 Pa-1500 Pa, preferably 1300 Pa, the partial pressure of the monosilane gas to 4 Pa-10 Pa, preferably 6 Pa and by setting the partial pressure of a diborane gas used for a dopant gas to $1\times10^{-3}$ Pa-$2\times10^{-3}$ Pa, preferably to the partial pressure of $1.3\times10^{-3}$ Pa.

According to the present embodiment, it becomes possible to use a silicon epitaxial layer, which guarantees the lattice matching, in place of using the SiGe mixed crystal layers 51GS$_1$ and 51SG$_2$, while still enabling selective etching with such a silicon epitaxial layer, and the fabrication process of the semiconductor device is substantially simplified. In the case of using the SiGe mixed crystal layers 51GS$_1$ and 51SG$_2$, it should be noted that the lattice matching composition to the silicon substrate 51 and to the silicon epitaxial layers 51ES$_1$ and 51ES$_2$ is limited.

Likewise, it is also possible to replace the respective SiGe mixed crystal layers with such a silicon epitaxial layer containing B with high concentration in any of the first through fourth embodiments.

Figure 11A:
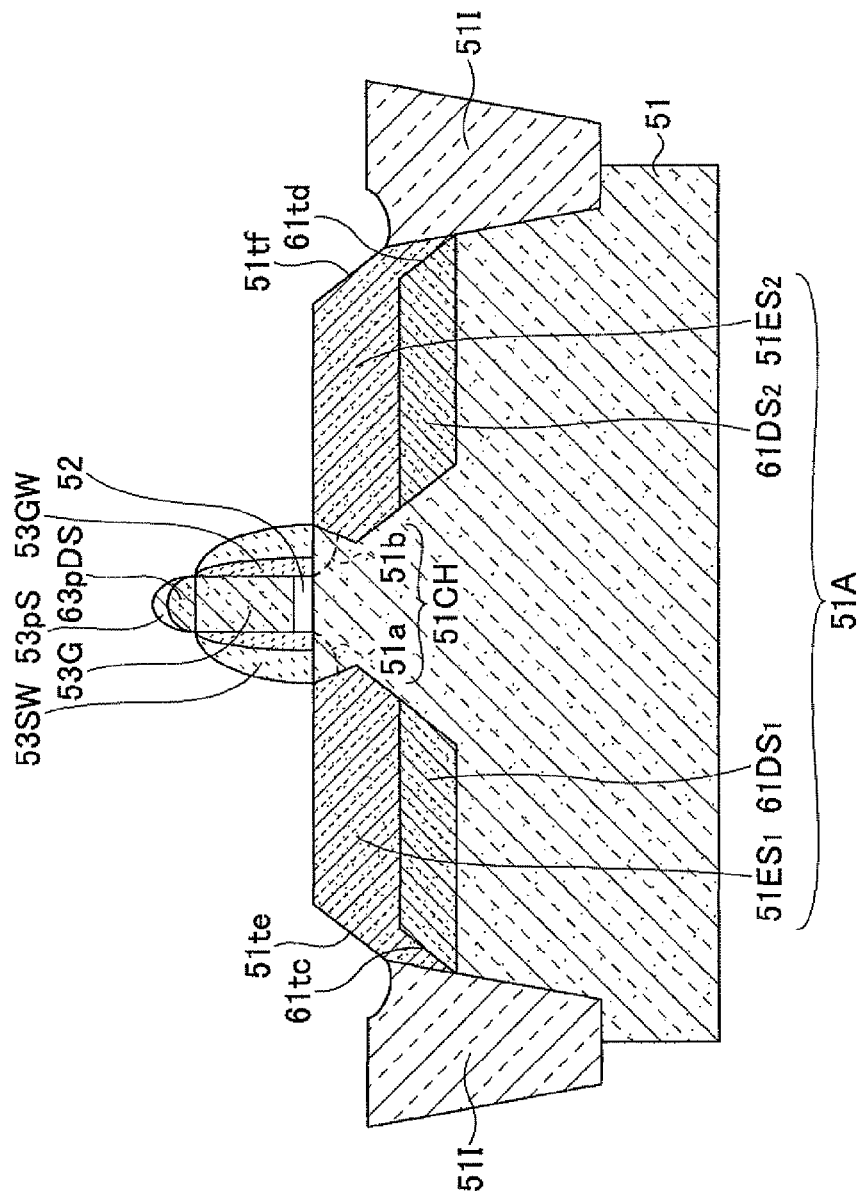
FIGS. 11A-11D are diagrams representing the process of fabricating a semiconductor device according to a fifth embodiment.
Figure 11B:
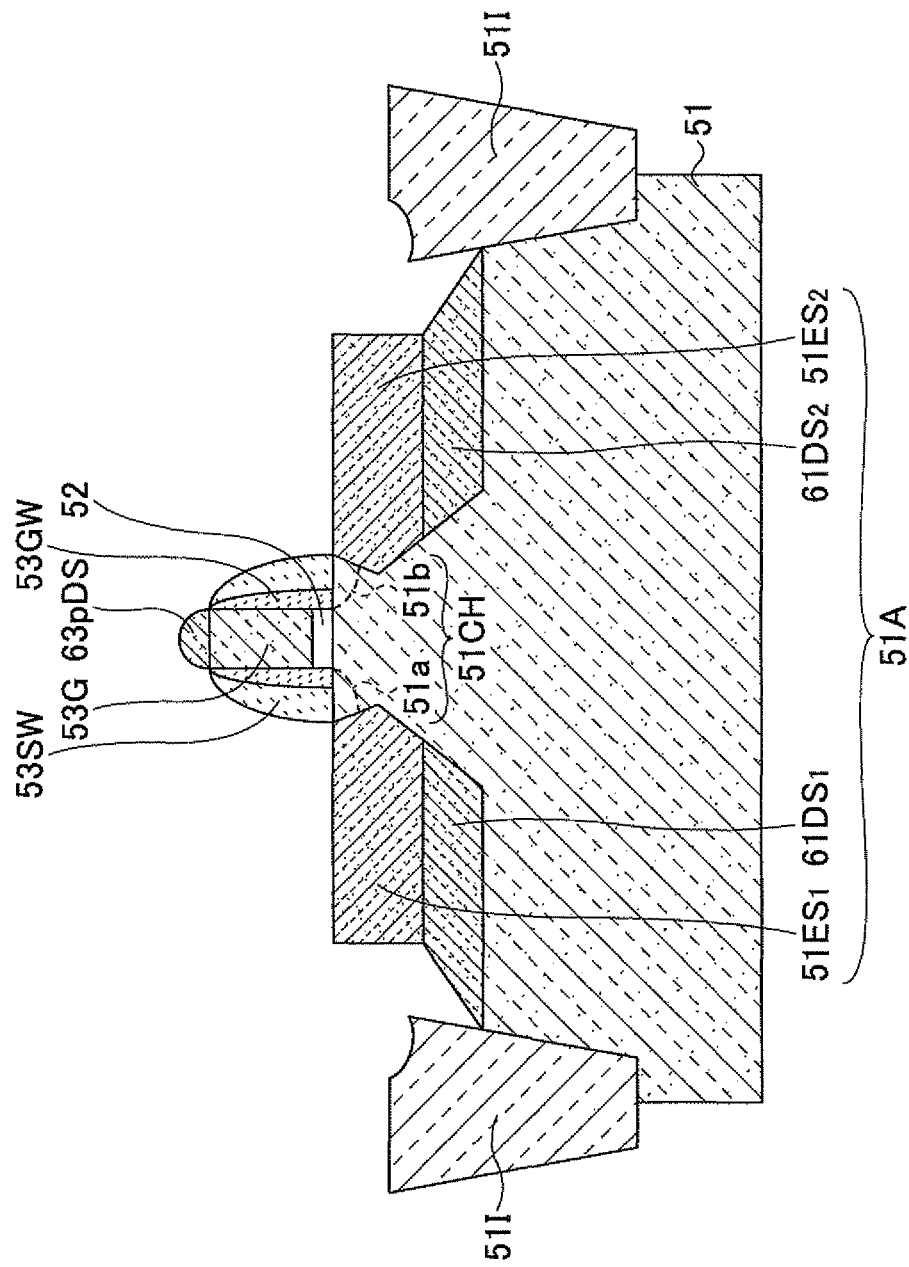
Figure 11C:
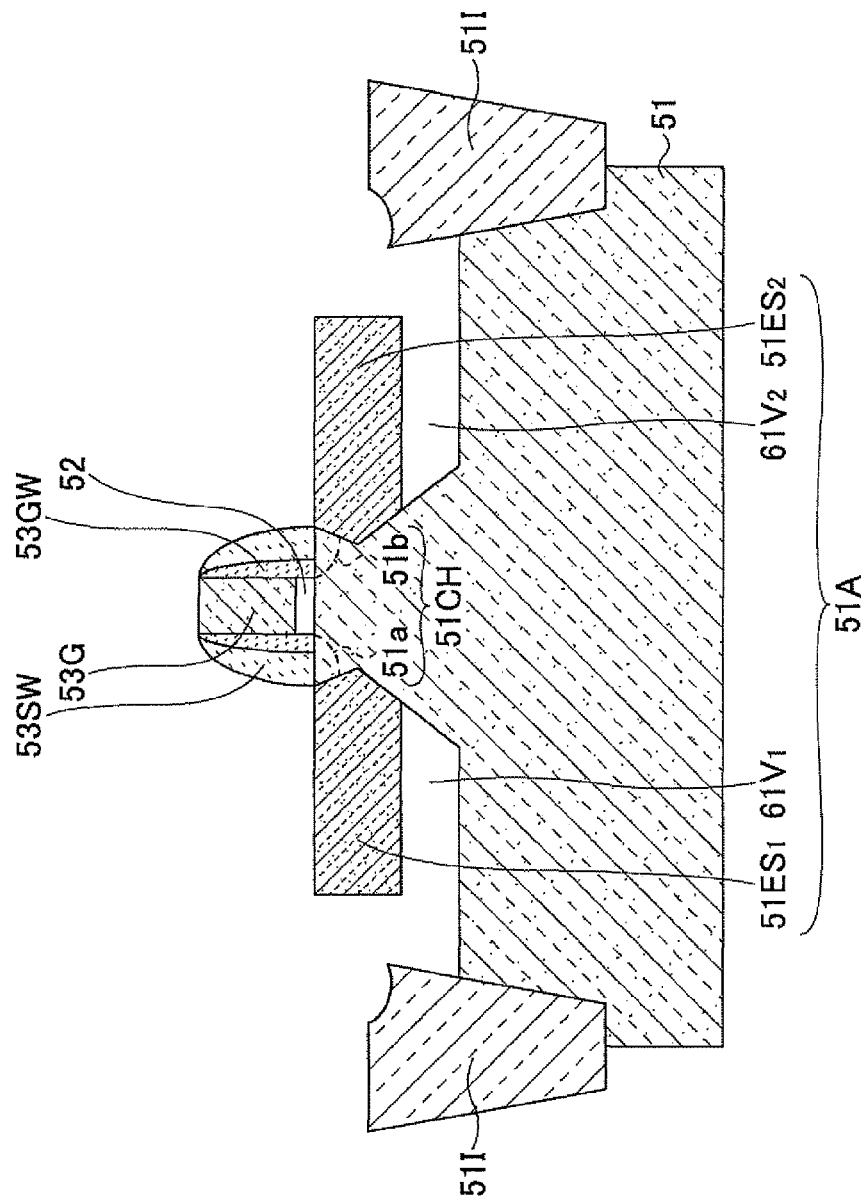

FIGS. 11A-11C are diagrams representing the fabrication process of a semiconductor device according to a fifth embodiment. In the drawings, those parts explained before are designated by the same reference numerals and the description thereof will be omitted.

In the examples below, the description will be made for the fabrication process of an n-channel MOS transistor, while it should be noted that it is also possible to fabricate a p-channel MOS transistor similarly.

Referring to FIG. 11A, the process of FIG. 11A is the one conducted subsequent to the step of FIG. 9A of the previous embodiment, and thus, there are grown p-type silicon epitaxial layers 61DS$_1$ and 61DS$_2$ doped with B to the concentration of $1\times10^{18}$ cm$^{-3}$ or more on the structure of FIG. 9A under the condition explained above, with a film thickness of 20 nm-80 nm, preferably with the film thickness of about 50 nm. It should be noted that the p-type silicon epitaxial layers 61SD$_1$ and 61DS$_2$ are grown to form sidewall surfaces 61tc and 61td defined with crystal facets characterized by indices larger than those of the (100) surface, such as a (111) surface or (311) surface, similarly to the SiGe mixed crystal layers 31SG$_1$, 31SG$_2$, 31SG$_3$ and 31SG$_4$ of the previous embodiment.

Further, subsequent to the epitaxial growth of the p-type silicon epitaxial layers 61DS$_1$ and 61DS$_2$, the epitaxial growth of silicon epitaxial layers 51ES$_1$ and 51ES$_2$ is conducted in the step of FIG. 11B with a thickness of 70 nm-20 nm, preferably with the thickness of 50 nm, under a condition similar to the case of the silicon epitaxial layers 31ES$_1$, 31ES$_2$, 31ES$_3$ and 31ES$_4$ of the previous embodiment.

It should be noted that the silicon epitaxial layers 51ES$_1$ and 51ES$_2$ are grown to form sidewall surfaces 51te and 51tf defined with crystal facets characterized by indices larger than those of the (100) surface, such as a (111) surface or (311) surface, similarly to the silicon epitaxial layers 31ES$_1$, 31ES$_2$, 31ES$_3$ and 31ES$_4$ of the previous embodiment.

In the present embodiment, too, it should be noted that the sidewall surfaces 61tc and 61td of the p-type silicon epitaxial layers 61DS$_1$ and 61DS$_2$ or the sidewall surfaces 51te and 51tf of the silicon epitaxial layers 51ES$_1$ and 51ES$_2$ may be formed of a single crystal surface or of a plurality of crystal surfaces.

In the step of FIG. 11A, it can be seen that there are formed p-type polysilicon pattern 63$p$DS doped with B in addition to the polysilicon pattern 53$p$S on the polysilicon gate electrode 53G with the growth of the p-type silicon epitaxial layers 61DS$_1$ and 61DS$_2$ or the silicon epitaxial layers 51ES$_1$ and 51ES$_2$.

Further, in the present embodiment, too, it is preferable to apply an anisotropic etching process for a short time duration after the formation of the p-type silicon epitaxial layers 61SD$_1$ and 61DS$_2$ and remove the p-type silicon epitaxial layers that have crept up upon the sidewall surfaces 51tb and 51ta of the substrate portion 51CH as explained already with reference to FIGS. 6A and 6B.

With the structure of FIG. 11A thus obtained, it should be noted that the sidewall surfaces 61tc and 61te or the sidewall surfaces 51td and 51tf are generally parallel with each other or in a relationship close to parallel with each other if not exactly in parallel. As a result, the silicon epitaxial layers 51ES$_1$ and 51ES$_2$ merely have a very small film thickness of approximately 5 nm in the part thereof covering the p-type silicon epitaxial layers 61DS$_1$ and 61DS$_2$ at the respective sidewall surfaces 61tc and 61td, even in the case the silicon epitaxial layers 51ES$_1$ and 51ES$_2$ have a film thickness of about 80 nm-20 nm.

Thus, in the step of FIG. 11C, the exposed p-type silicon epitaxial layers 61DS$_1$ and 61DS$_2$ are subjected to a wet etching process conducted by an etchant that contains a hydrofluoric acid (HF), a nitric acid (HNO$_3$) and an ascetic acid (CH$_3$COOH) with a proportion of 1:3:8. With this, the thin Si layer on the facets is etched in due course, while once the B-doped Si layer is exposed, there is attained a selective etching of the B-doped Si layer in view of the faster etching rate thereof than a non-doped Si layer.

As a result of the selective etching, there are formed voids $51V_1$ and $51V_2$ respectively underneath the silicon epitaxial layers $51ES_1$ and $51ES_2$ as represented in FIG. 11C in correspondence to the p-type silicon epitaxial layers $61DS_1$ and $61DS_2$. Meanwhile, in the step of FIG. 11C, it should be noted that the polysilicon pattern 63pSG of p-type on the gate electrode 53G has vanished as a result of the selective etching of the p-type silicon epitaxial layers $61ES_1$ and $61ES_2$.

Figure 11D:
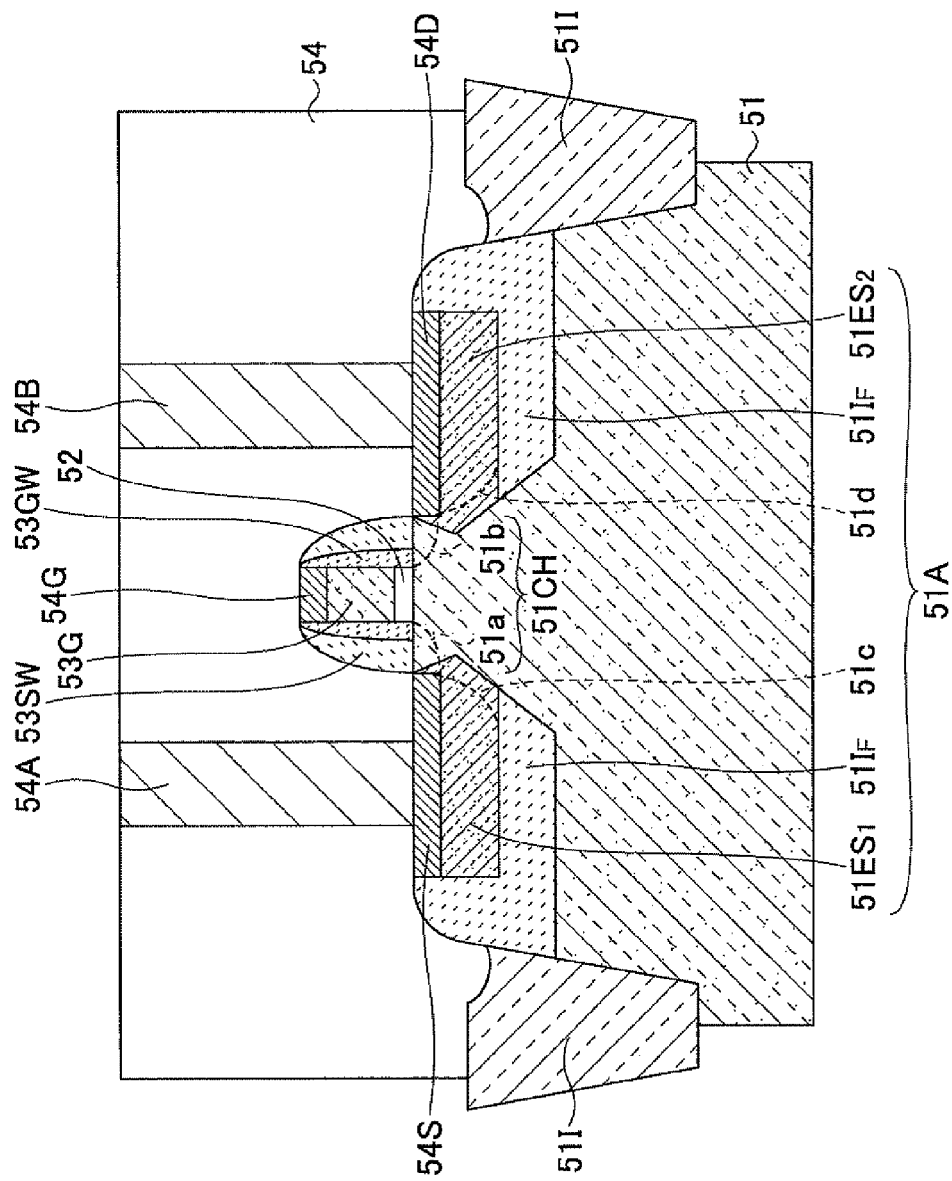

Next, by conducting the process similar to that of FIGS. 5H-5S explained previously, the voids $51V_1$ and $51V_2$ are filled with the buried insulation film 51IF as represented in FIG. 11D, and the source diffusion region 51c of n-type is formed in the silicon epitaxial layer $51ES_1$ and the drain diffusion region 51d of n-type is formed ion the silicon epitaxial layer $51ES_2$. Further, an interlayer insulation film 54 is formed on the on the silicon substrate 51 so as to cover the gate electrode 53G and sidewall insulation films 53SW. Further, via-plugs 54A and 54B are formed in the interlayer insulation film 54 respectively in contact with the source diffusion region 51c and the drain diffusion region 51d. With this, the intended re-channel MOS transistor is obtained.

Likewise, a p-channel MOS transistor can be fabricated, and detailed description thereof will be omitted.

In the present embodiment, too, the process of exposing the p-type silicon epitaxial layers $61DS_1$ and $61DS_2$ in the step of FIG. 11B is conducted by a simple etching process, and the fabrication process of the semiconductor device is simplified.

[Sixth Embodiment]

Figure 12:
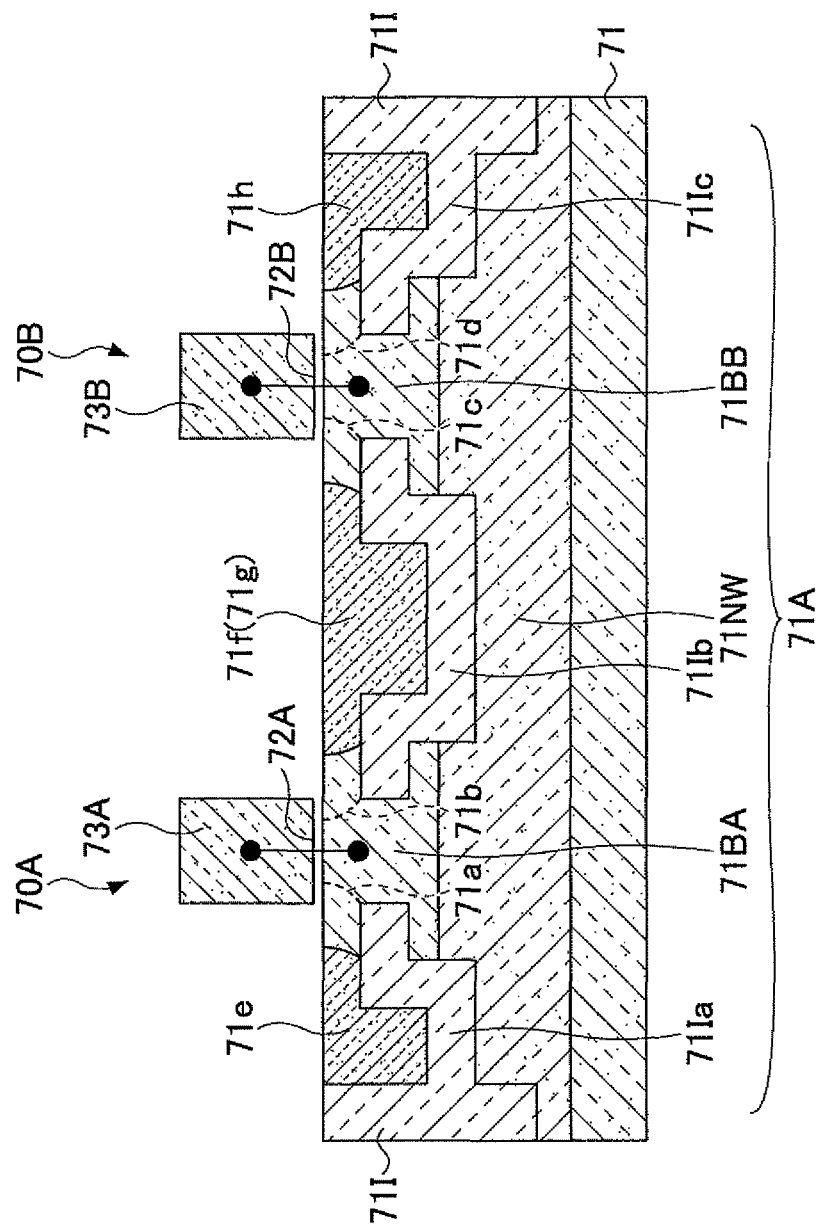
FIG. 12 is a cross-sectional diagram representing the construction of the semiconductor integrated circuit device according to a sixth embodiment.

FIG. 12 represents an example of a dynamic threshold MOS (Dt-MOS) transistor 70 according to a sixth embodiment.

Referring to FIG. 12, there is defined a device region 71A in a silicon substrate 71 by a device isolation region 71I, and two n-channel MOS transistors 70A and 70B are formed in the device region 71A in an n-type well 71NW such that a drain diffusion region of the transistor 70A is shared with a source diffusion region of the transistor 70B.

In more detail, there are formed an n-type polysilicon gate electrode 73GA of the transistor 70A and a polysilicon gate electrode 73GB of the transistor 70B on the silicon substrate 71 in a device region 71A via respective gate insulation films 72A and 72B, wherein there are formed a source extension region 71a and a drain extension region 71b of n-type in the silicon substrate 71 respectively at a first side and a second, opposite side of the gate electrode 73GA. Similarly, in the silicon substrate 71, there are formed a source extension region 71c and a drain extension region 71d of n-type respectively at a first side and a second, opposite side of the gate electrode 73GB.

Further, in the silicon substrate 71, there is formed a source region 71e of n⁺-type at an outer side of the source extension region 71a as viewed from a channel region of the transistor 70A formed right underneath the gate electrode 73A, and there is also formed a drain region 71f of n⁺-type at an outer side of the drain extension region 71b as viewed from the channel region of the transistor 70A.

Similarly, in the silicon substrate 71, there is formed a source region 71g of n⁺-type at the outer side of the source extension region 71c as viewed from the channel region of the transistor 70B right underneath the gate electrode 73B in common with the drain region 71f of the transistor 70A, and a drain region 71h of n⁺-type is formed at the outer side of the drain extension region as viewed from the channel region of the transistor 70B.

Further, in the channel region of the transistor 70A, there is formed a body region 71BA of p-type, and the body region 71BA is connected electrically to the gate electrode 73A, in view of the fact that the transistor 70A is a Dt-MOS transistor, at a contact hole not illustrated but is located at the near side or far side of the plane of the sheet of FIG. 12.

Likewise, in the channel region of the transistor 70B, there is formed a body region 71BB of p-type, and the body region 71BB is connected electrically to the gate electrode 73B, in the case the transistor 70B is a Dt-MOS transistor, at a contact hole not illustrated but is located at the near side or far side of the plane of the sheet of FIG. 12.

Further, in the transistor 70A of FIG. 12, there is provided an insulation film 71a of silicon oxide, or the like, right underneath the source extension region 71a and the source region 71c in the manner to extend to the device isolation region 71I for reducing the parasitic capacitance of the source extension region 71a and the source region 71e. Likewise, there is formed an insulation film 71Ib of silicon oxide, or the like, right underneath the drain extension region 71b and the drain region 71f of the transistor 70A so as to extend to the region right underneath the source extension region 71c and the source region 71f of the transistor 70B for reducing the parasitic capacitance of the drain extension region 71b and the drain region 71f and further the parasitic capacitance of the source extension region 71c and the source region 71g.

Further, in the transistor 70B, there is formed an insulation film 71Ic of silicon oxide, or the like, right underneath the drain extension region 71d and the drain region 71h in the transistor 70B to extend to the device isolation region 71I for reducing the parasitic capacitance of the drain extension region 71d and the drain region 71h.

Thereby, with the construction of FIG. 12, the source region 71e, the drain region 71f (source region 71g) and the drain region 71h are formed to fill the deep trenches formed in the substrate 71, and because of this, these regions have sufficient film thickness for reducing the source resistance and drain resistance of the transistors 70A and 70B.

Further, with the construction of FIG. 12, it becomes possible, by forming the n-type well 71NW to have a sufficient depth in the device region 71A, to form the p-type body region 71BA of the transistor 70A and the p-type body region 71BB of the transistor 70B with sufficient film thickness while suppressing the short channel effect with the n-type well 71NW simultaneously. As a result, it becomes possible to reduce the body resistance of the respective transistors 70A and 70B and a high-speed Dt-MOS operation is realized.

Further, with the construction of FIG. 12, the source region 71e and the drain region 71f, and further the source region 71g and the drain region 71h, are formed to fill the deep trenches as noted previously, and because of this, the insulation films 71Ia, 71Ib and 71Ic formed fight underneath thereof are formed at a further deeper level in the silicon substrate 71, and as a result, the body regions 71BA and 71BB are isolated electrically. As a result, the transistors 70A and 70B can operate independently.

Hereinafter, the fabrication process of the Dt-MOS transistor of FIG. 12 will be explained with reference to FIGS. 13A-13I. It should be noted, however, that the Dt-MOS transistor fabricated with the process below has a structure slightly different from that of FIG. 12. In the description hereinafter, fabrication of the transistor 70A alone will be explained. However, it should be noted that the transistor 70B can be fabricated similarly.

Figure 13A:
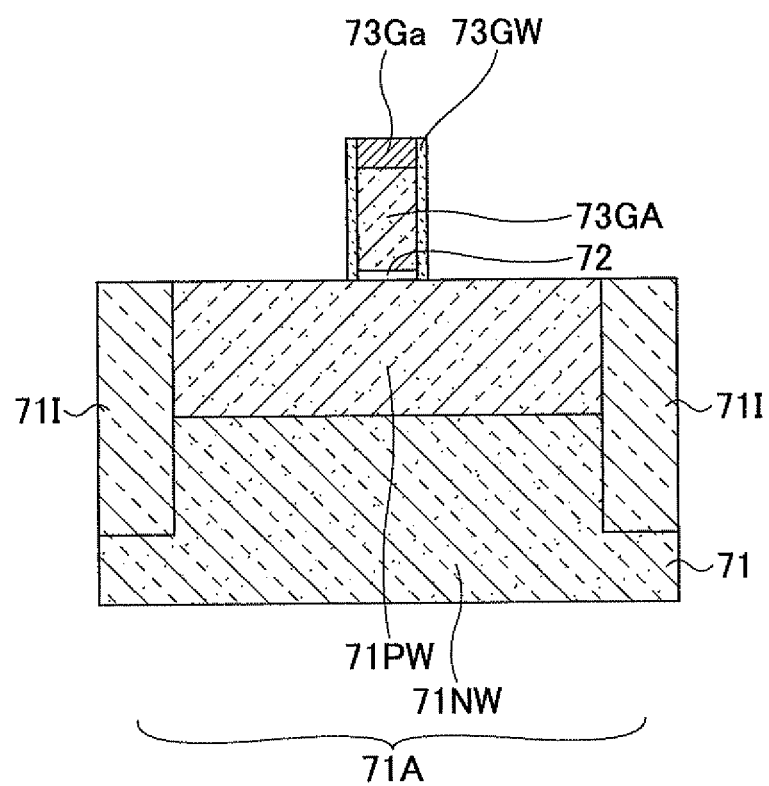
FIGS. 13A-13I are diagrams representing the process of fabricating a semiconductor device of FIG. 12 according to a sixth embodiment.
Figure 13B:
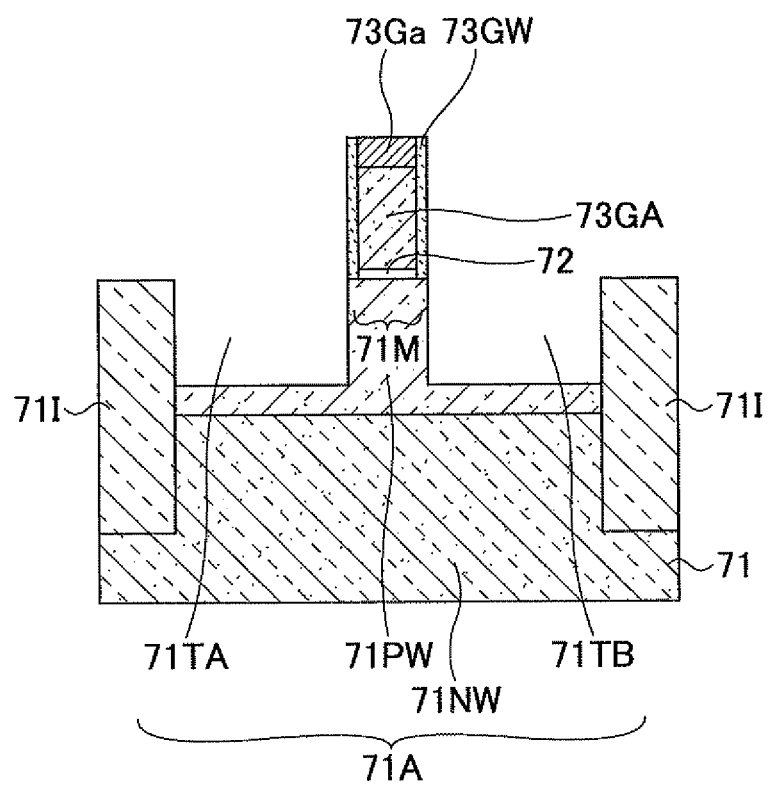

Referring to FIG. 13A, the polysilicon gate electrode 73GA is formed on the p-type silicon substrate 71 in the device region 71A via a gate insulation film 72A, and the silicon substrate 71 is subjected to a dry etching process as represented in FIG. 13B by using the polysilicon gate electrode 73GA as a mask. With this, trenches 71TA and 71TB are formed at the first side and the second, opposite side of the gate electrode 73GA. Here, it should be noted that, in FIGS. 13A and 13B, the polysilicon gate electrode 73GA carries a mask pattern 73Ga of a silicon oxide film or a SiN film and there are formed sidewall spacers 73GW at the respective sidewall surfaces by a CVD process and an etch-back process as explained previously with reference to other embodiments.

Further, in the silicon substrate 71, there is formed a p-type well 71PW in the upper part thereof and an n-type well 71NW is formed underneath the p-type well 71PW, wherein the trenches 71TA and 71TB are formed with a depth not reaching the n-type well 71NW.

In the step of FIG. 13B, there is formed a p-type mesa region 71M right underneath the gate electrode 71GA as a result of formation of the trenches 71TA and 71TB, wherein it should be noted that the p-type mesa region 71M includes the original flat surface of the silicon substrate 71A.

Figure 13C:
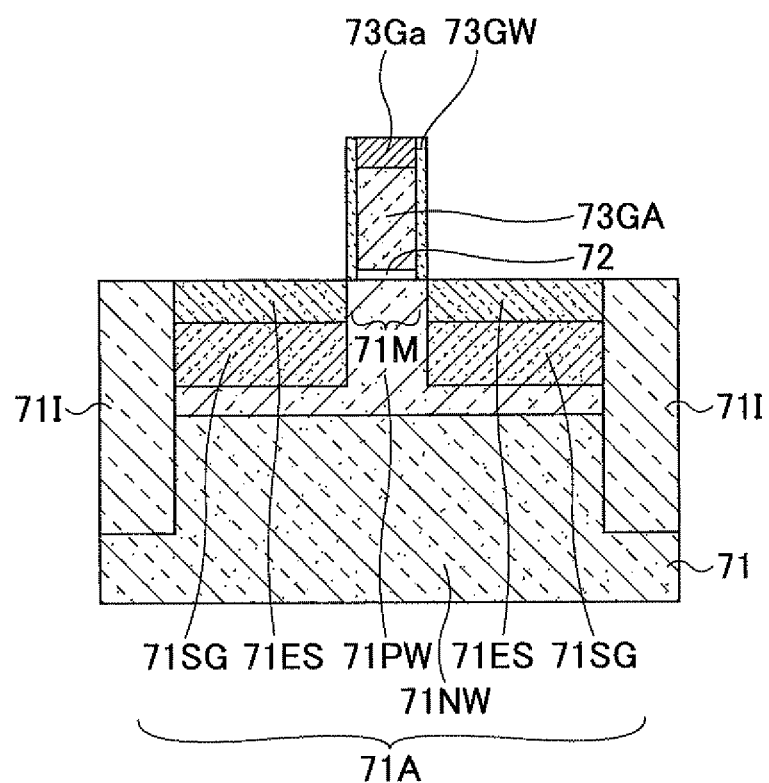
Figure 13D:
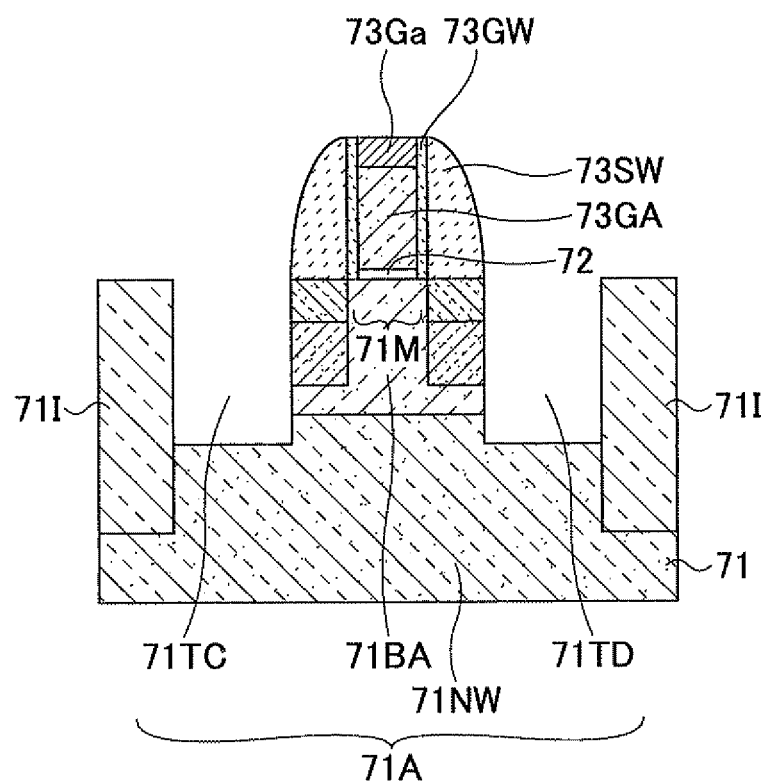

Next, as represented in FIG. 13C, the trenches 71TA and 71TB are filled consecutively by a SiGe mixed crystal layer 71SG and a silicon epitaxial layer 71ES, and sidewall insulation films 73SW of an insulation film such as SiN or SiON having a resistance to the wet etching process by HF are formed in the next step of FIG. 13D on the polysilicon gate electrode 73GA via the sidewall spacers 73GA.

Further, in the step of FIG. 13D, the silicon substrate 71 is again subjected to a dry etching process while using the polysilicon gate electrode 73GA and the mask pattern 73Ga thereon and the sidewall insulation films 73SW as a mask, and with this, there are formed trenches 71TC and 71TD in the silicon substrate 71 at respective outer sides of the sidewall insulation films 73SW as viewed from the mesa region 71M to a depth deeper than the top edge of the n-type well 71NW. As a result of the process of FIG. 13D, the p-type body region 71B is formed over the n-type well 71NW such that the p-type body region 71B includes the mesa structure 71M.

Figure 13E:
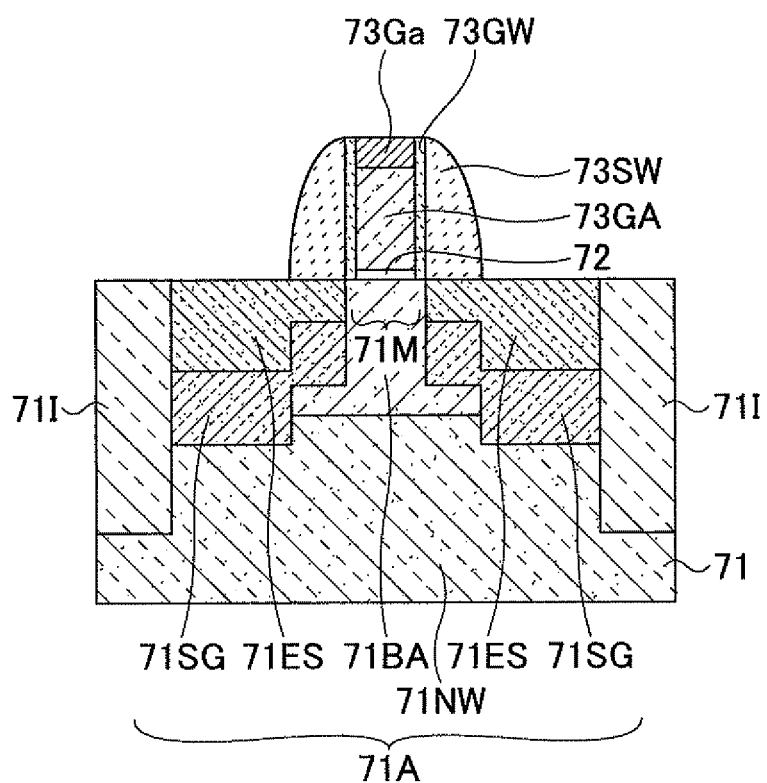

Further, in the step of FIG. 13E, the trenches 71TC and 71TD are filled by conducting epitaxial growth of the SiGe mixed crystal layers 71GS and the silicon epitaxial layers 71ES consecutively, and there is obtained a structure in which the insulation films 71Ia and 71Ib of FIG. 12 are replaced with the SiGe mixed crystal layers 71SG.

Figure 13F:
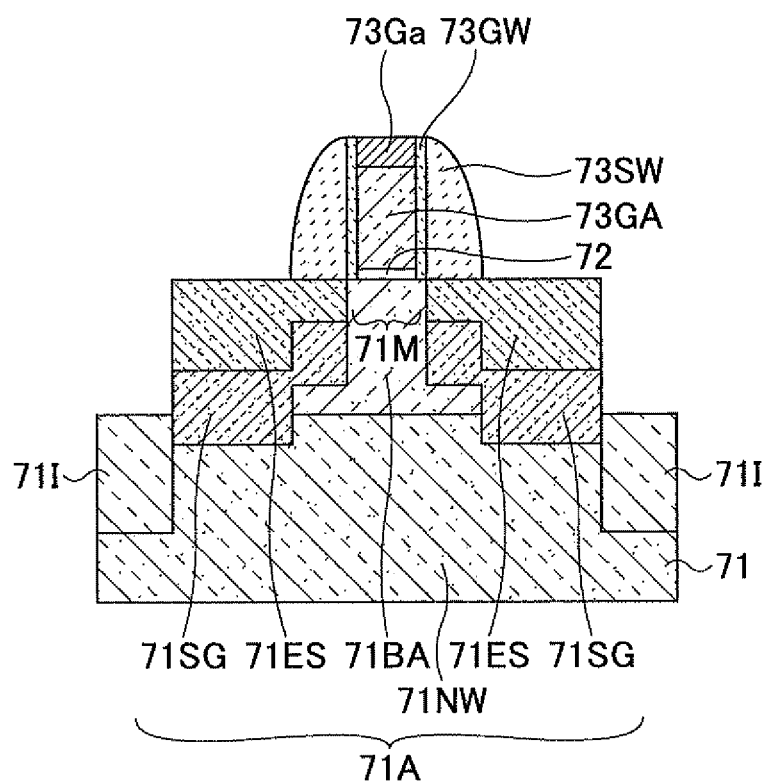

Further, in the step of FIG. 13F, the silicon oxide film constituting the device isolation film in the device isolation region 71I of the STI type are caused to form recession by the wet etching process that uses HF such that the SiGe mixed crystal layers 71SG are exposed at the sidewall surfaces of the device isolation trench.

Figure 13G:
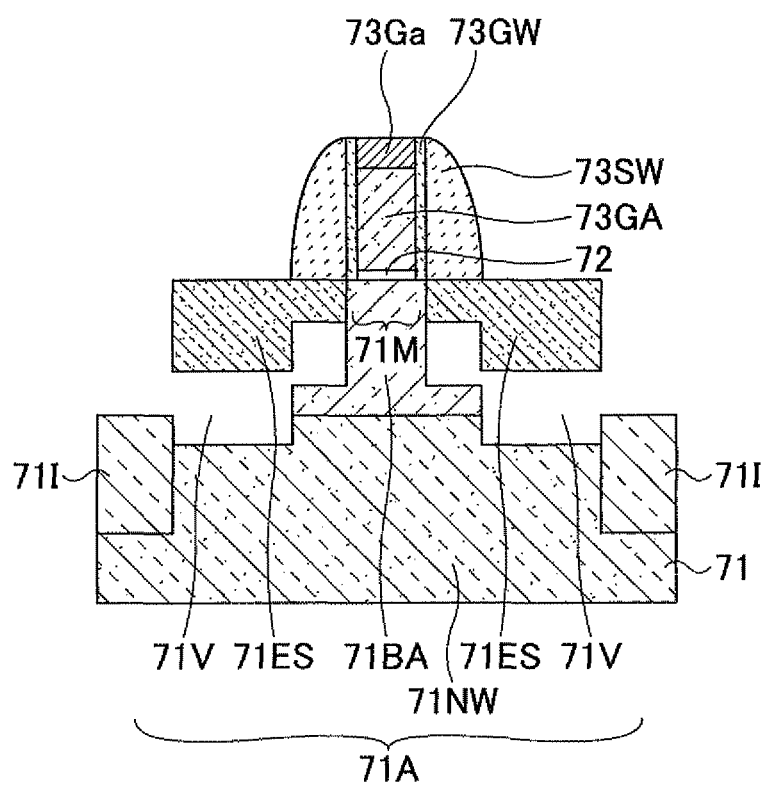

Further, in the step of FIG. 13G, the SiGe mixed crystal layers 71SG are etched selectively similarly to the step of FIG. 1E or FIG. 5G, or FIG. 9D or FIG. 11C of the previous embodiments, and with this there are formed voids 71V in correspondence to the foregoing SiGe mixed crystal layers 71SG.

Figure 13H:
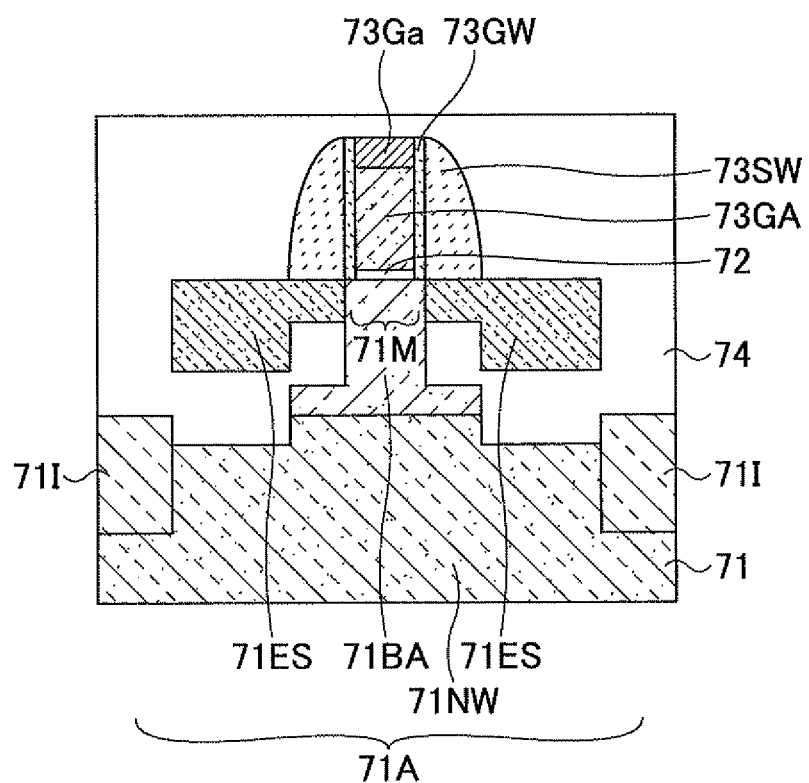
Figure 13I:
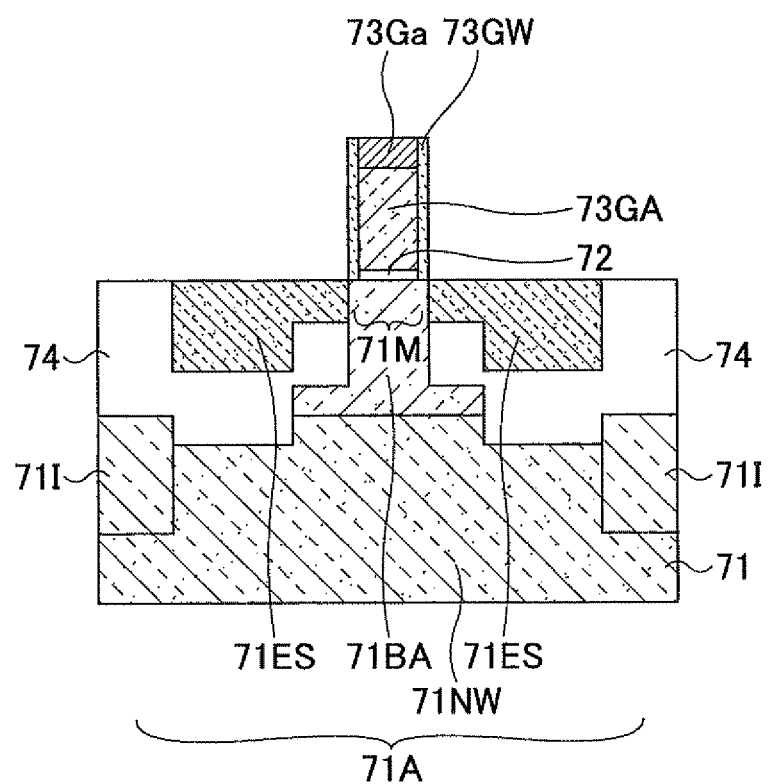

Further, in the step of FIG. 13H, an insulation film 74 is deposited on the structure of FIG. 13G by an ALD process and a CVD process or by an SOD process so as to fill or partially fill the void 71V, and the insulation film 74 is etched back in the step of FIG. 13I until the silicon epitaxial layer 71ES is exposed.

Further, in the step of FIG. 13I, the sidewall insulation films 73SW are removed and the processes explained previously with reference to FIGS. 1J-1P are conducted. Further, by connecting the gate electrode 73GA to the body 71BA electrically at a contact hole not illustrated, the n-channel Dt-MOS transistor 70A of FIG. 12 is obtained. The same applies to the n-channel Dt-MOS transistor 70B of FIG. 12. Further, while the description is omitted, it is possible to fabricate a p-channel Dt-MOS transistor similarly by reversing the conductivity type in the foregoing explanation.

Figure 14A:
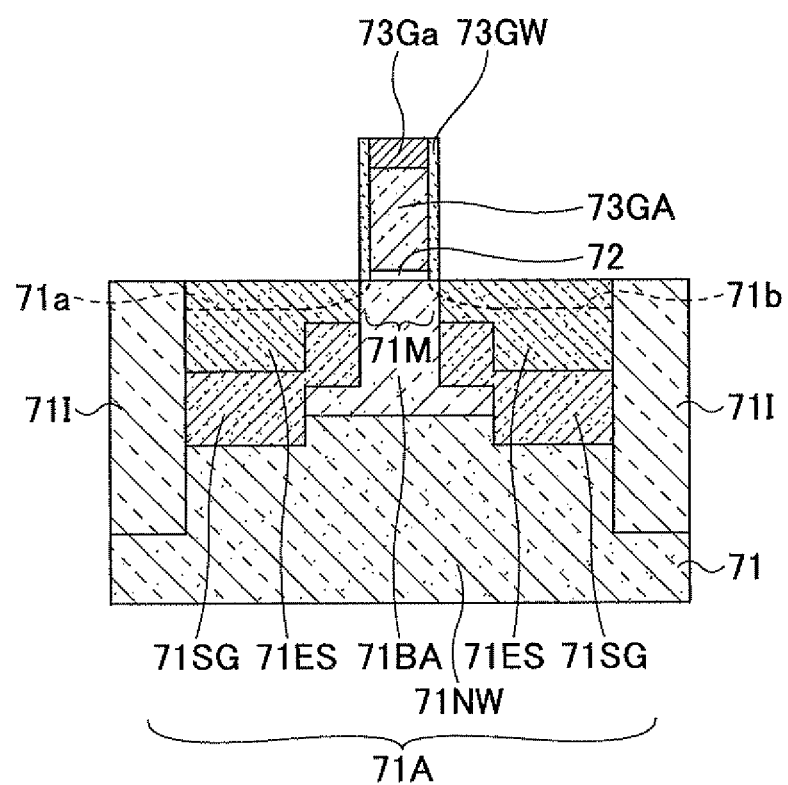
FIGS. 14A-14E are diagram representing the process of fabricating a semiconductor device according to a modification of the sixth embodiment.

In the present embodiment, it should be noted that, after the step of FIG. 13E, the sidewall insulation films 73SW are removed as represented in FIG. 14A and the source extension region 71a and the drain extension region 71b of n-type are formed. Thereafter, the sidewall insulation films 74SW are formed in correspondence to the sidewall insulation films 73SW as represented in FIG. 14B, and the source region 71c and the drain region 71d of n⁺-type are formed.

Figure 14B:
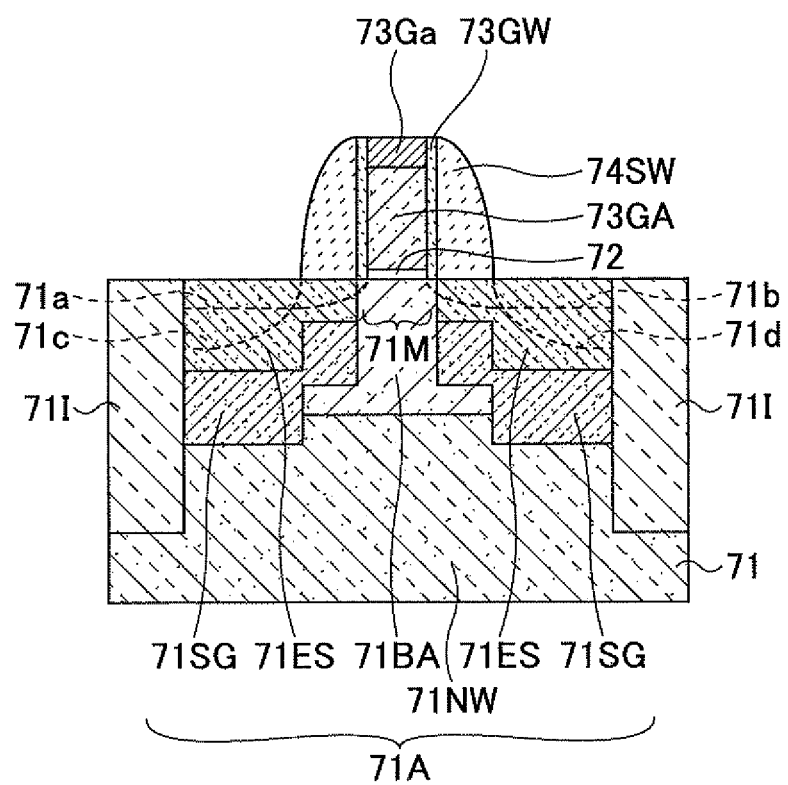
Figure 14C:
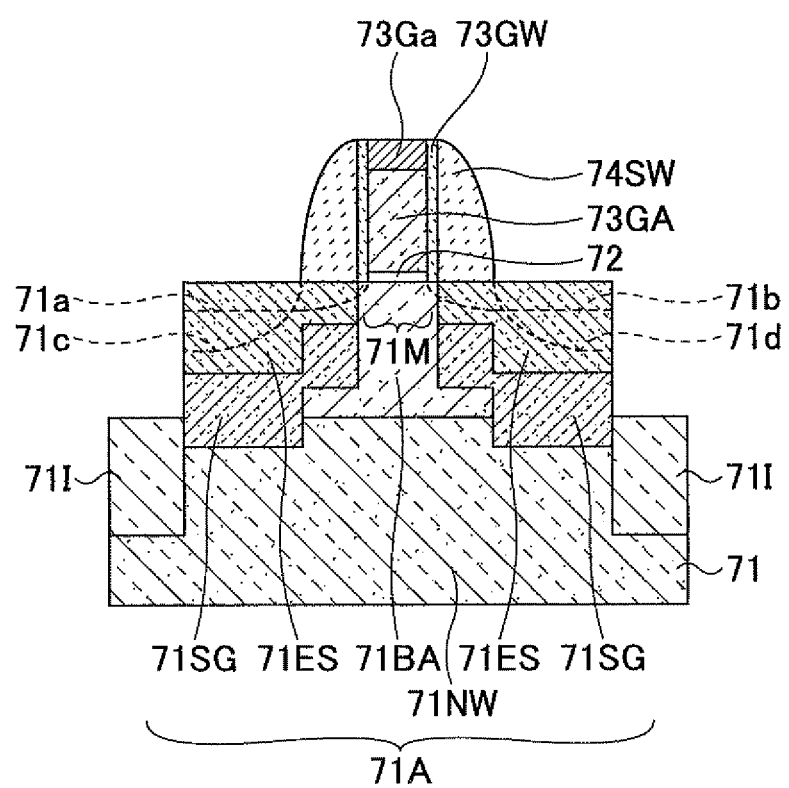
Figure 14D:
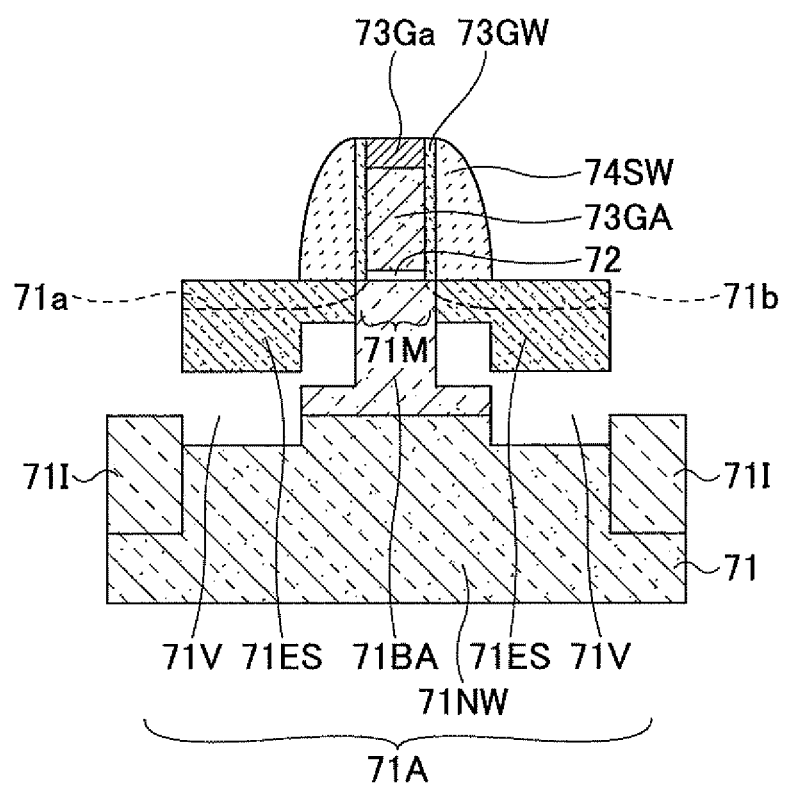

Thereafter, as represented in FIG. 14C, the device isolation insulation film 71I is receded to expose the SiGe mixed crystal layers 71SG, and the SiGe mixed crystal layers 71SG are removed selectively as represented in FIG. 14D. With this, the voids 71V are formed in correspondence to the SiGe mixed crystal layers 71SG.

Figure 14E:
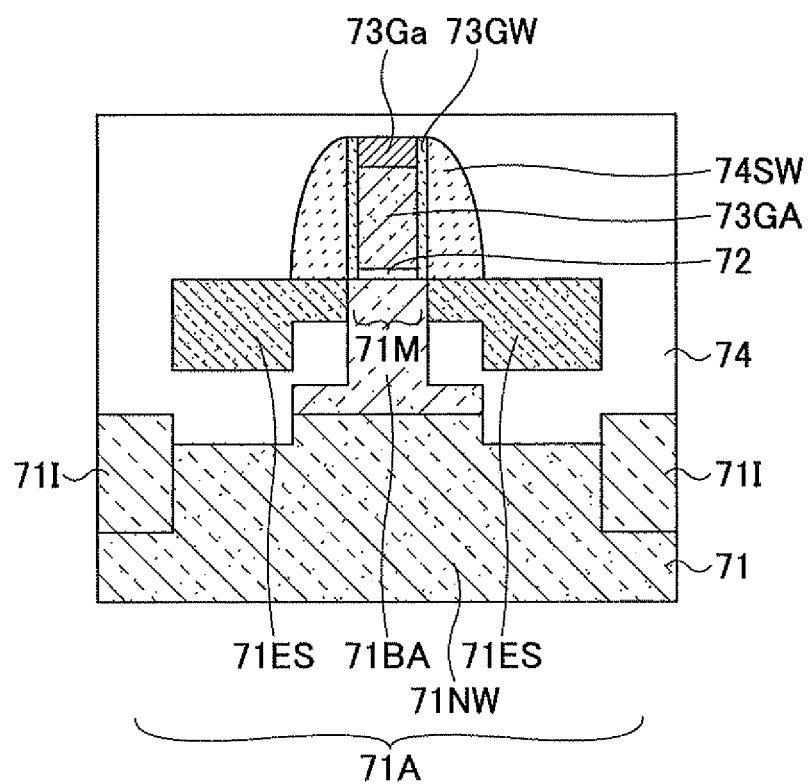

Further, as represented in FIG. 14E, the interlayer insulation film 74 is formed so as to fill the void 71V.

With the present embodiment, it should be noted that the source extension region 71a and the drain extension region 71b and the source region 71c and the drain region 71d are already formed in the step of FIG. 14B, and thus, there is no need to form the source extension region 71a and the drain extension region 71b and the source region 71c and the drain region 71d in the step of FIG. 14E. Thus, it is possible to form the interlayer insulation film 74 also as the film that fills the voids 71V. With this, it becomes possible to simplify the fabrication process of the semiconductor device.

Figure 15:
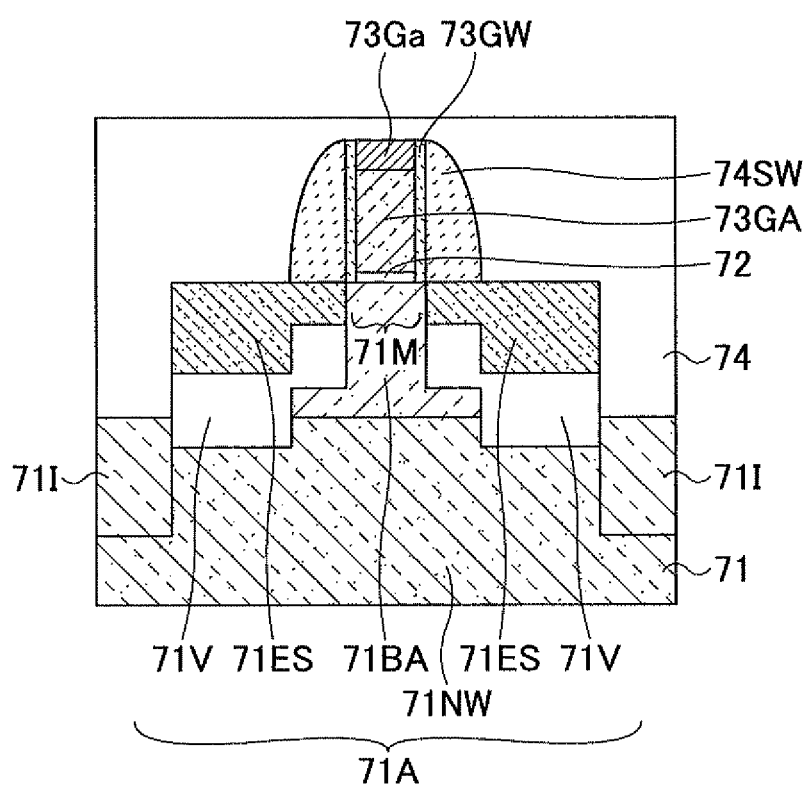
FIG. 15 is a cross-sectional view diagram representing another modification of the sixth embodiment.

Further, it is also possible to prevent the voids 71A from being filled with the insulation film 74 by using an anisotropic deposition process such as sputtering process of high-density plasma CVD process at the time of forming the insulation film 74 in the step of FIG. 13H or FIG. 14E as represented in FIG. 15.

[Seventh Embodiment]

Figure 16A:
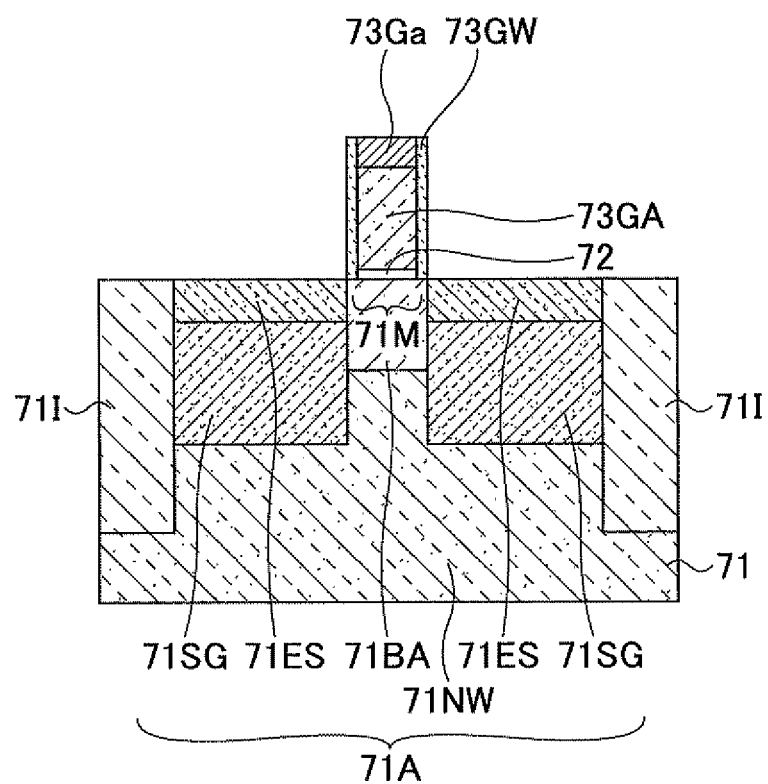
FIGS. 16A-16D are diagrams representing the process of fabricating a semiconductor device according to a modification of the seventh embodiment.
Figure 16B:
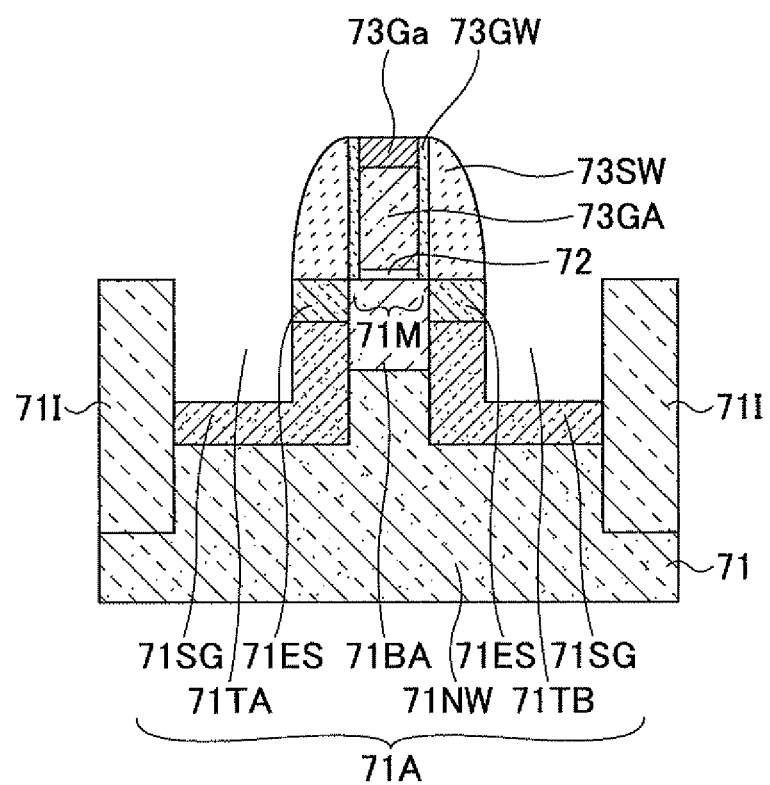
Figure 16C:
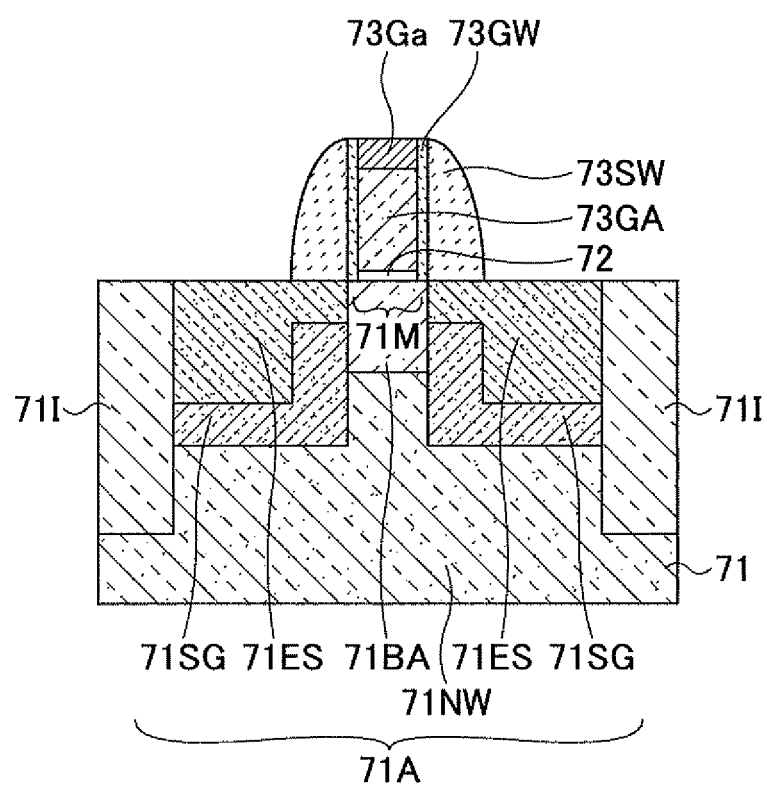

FIGS. 16A-16C are cross-sectional diagrams representing the fabrication process of the Dt-MOS transistor 70A of FIG. 12 according to a seventh embodiment. In the drawings, those parts explained before are designated by the same reference numerals and the description thereof will be omitted.

In the present embodiment, the trenches 71TA and 71TB are formed, in the step corresponding to the step of FIG. 13B, to reach the depth exceeding the n-type well 71NW and the trenches 71TA and 71TB are filled in the step of FIG. 16A corresponding to FIG. 13C with the SiGe mixed crystal layers 71SG to a height exceeding the n-type well 71NW. Further, in the step of FIG. 16B, there are formed sidewall insulation films 73SW on the lateral sidewall surfaces of the polysilicon gate electrode 73GA via the sidewall spacers 73GW. Further, in the step of FIG. 16B, the silicon substrate 71 is subjected to a dry etching process to a depth exceeding the top edge of the n-type well 71NW while using the polysilicon gate electrode 73GA and the mask pattern 73Ga thereon and further the sidewall spacers 73GW and the sidewall insulation films 73SW as a mask. With this, the trenches 71TA and 71TB are formed at both lateral sides of the mesa structure 71M while leaving the SiGe mixed crystal layers 71S on the bottom surfaces and the sidewall surfaces.

Figure 16D:
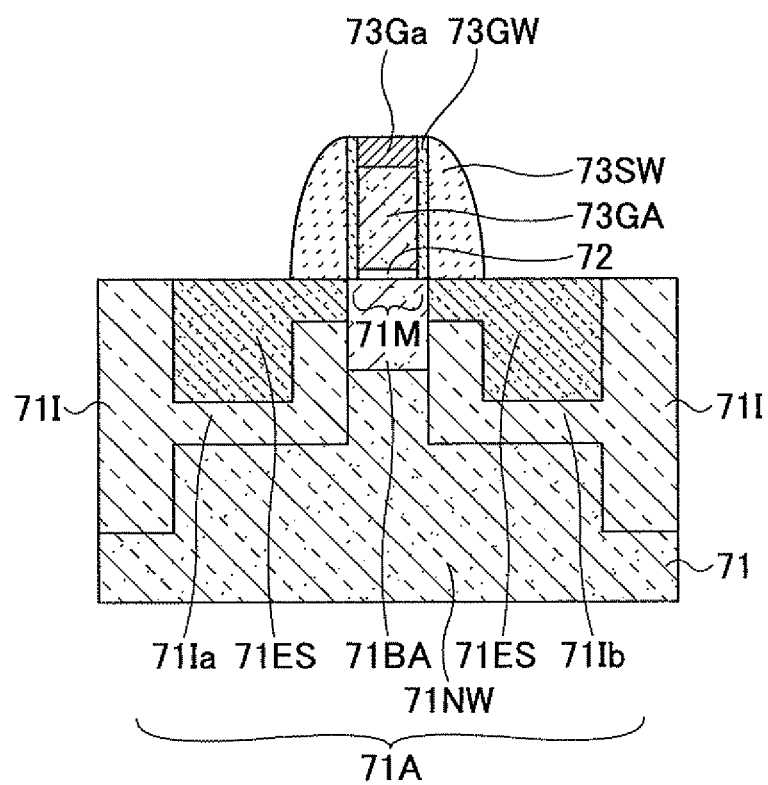

Further, in the step of FIG. 16C, the trenches 71TA and 71TB are filled with the silicon epitaxial layers 71ES, and thereafter, the SiGe mixed crystal layers 71SG are removed similarly to the step of FIG. 5G. Further, the voids thus formed are filled with the insulation films 71Ia and 71Ib and the gate electrode 73GA is connected to the body 71BA electrically. With this, an n-channel Dt-MOS transistor of the structure of FIG. 16D is obtained similarly to the one represented in FIG. 12.

While the foregoing description has been made for the case of forming a semiconductor device on a (100) surface of the silicon substrate, the fabrication processes of the semiconductor device explained with the various embodiments are effective also for the case of forming the semiconductor devices on other flat crystal surfaces such as (111) surface or (110) surface.

According to preferred embodiments, the gate insulation film and the gate electrode are formed, in the MOS transistor that has buried insulation films formed locally underneath the source region and the drain region, on the surface of the bulk silicon substrate not processed with etching, and thus, the channel region right underneath the gate electrode remains flat. Further, no defects are introduced into the channel region. Thus, according to the preferred embodiment, it becomes possible to use the bulk silicon substrate of original, high crystal quality, for the channel region, and as a result, the operational characteristics of the MOS transistor are improved. Further, variation of the device characteristics can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A method of fabricating a semiconductor device, comprising:
    forming a gate insulation film on a silicon substrate defined with a device region by a device isolation trench and a gate electrode on said gate insulation film;
    forming a source extension region and a drain extension region in said silicon substrate portion respectively at a first side and a second side opposite to said first side of said gate electrode by introducing an impurity element of a first conductivity type;
    forming sidewall insulation films respectively on a sidewall surface at said first side and on a sidewall surface at said second side of said gate electrode;
    etching said silicon substrate while using said sidewall insulation films as a mask to form first and second trenches respectively at said first side and said second side of said gate electrode at respective outer sides of said sidewall insulation films as viewed from said gate electrode;
    forming a first semiconductor layer which has etching selectivity against silicon in said first and second trenches and a silicon layer on said first semiconductor layer in said first and second trenches by consecutively and epitaxially growing;
    exposing, after forming said first semiconductor layer and said silicon layer, said first semiconductor layer by causing a recession in a device isolation insulation film constituting said device isolation region of STI type;
    removing said first semiconductor layer selectively to form a void between said silicon substrate and said silicon layer;
    forming a buried insulation film in at least a part of said void,
    forming a source region and a drain region by introducing an impurity element of said first conductivity type into said silicon layer respectively at said first side and said second side of said gate electrode.

2. The method as claimed in claim 1, wherein said forming said source region and said drain region includes performing an ion implantation of said impurity element of said first conductivity type while using said sidewall insulation films as a mask.

3. The method as claimed in claim 1, wherein said forming said source region and said drain region comprises: removing said sidewall insulation films; forming second sidewall insulation films respectively on said sidewall surfaces at said first side and said second side of said gate electrode; and introducing said impurity element of said first conductivity while using said second sidewall insulation films as a mask.

4. The method of fabricating a semiconductor device as claimed in claim 1, further comprising:
    after forming said buried insulation film, selectively removing said silicon layer selectively with regard to said buried insulation film; and growing a second semiconductor layer which has a lattice constant different from a lattice constant of silicon on said buried insulation film epitaxially with regard to said substrate portion to form a strained region.

5. The method as claimed in claim 4, wherein said semiconductor device comprises a p-channel MOS transistor and said second semiconductor layer includes a SiGe mixed crystal layer.

6. The method as claimed in claim 5, further comprising forming a compressive stressor film on said silicon substrate and said second semiconductor layer.

7. The method as claimed in claim 4, wherein said semiconductor device comprises a n-channel MOS transistor and said second semiconductor layer includes a SiC mixed crystal layer.

8. The method as claimed in claim 7, wherein further comprising forming a tensile stressor film on said silicon substrate and said second semiconductor layer.

9. A method of fabricating a semiconductor device, comprising:
    forming a gate insulation film on a silicon substrate defined with a device region by a device isolation trench of STI type and a gate electrode on said gate insulation film;
    forming a source extension region and a drain extension region in said silicon substrate portion respectively at a first side and a second side opposite to said first side of said gate electrode by introducing an impurity element of a first conductivity type;
    forming sidewall insulation films respectively on a sidewall surface at said first side and on a sidewall surface at said second side of said gate electrode;
    etching said silicon substrate while using said sidewall insulation films as a mask to form first and second trenches respectively at said first side and said second side of said gate electrode at respective outer sides of said sidewall insulation films as viewed from said gate electrode;
    removing a part of a device isolation insulation film constituting said device isolation region;
    after removing a part of a device isolation insulation film, forming a semiconductor layer which has etching selectivity against silicon in said first and second trenches and a silicon layer on said semiconductor layer in said first and second trenches consecutively and such that said semiconductor layer is exposed at a device isolation trench constituting said device isolation region;

removing said semiconductor layer selectively to form a void between said silicon substrate and said silicon layer;

forming a buried insulation film in at least a part of said void; and forming a source region and a drain region by introducing an impurity element of said first conductivity type into said silicon layer constituting said stacked structure respectively at said first side and said second side of said gate electrode.

* * * * *